United States Patent
Kashima et al.

(10) Patent No.: US 10,056,526 B2
(45) Date of Patent: Aug. 21, 2018

(54) DEEP ULTRAVIOLET LED AND METHOD FOR MANUFACTURING THE SAME

(71) Applicants: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

(72) Inventors: Yukio Kashima, Tokyo (JP); Eriko Matsuura, Tokyo (JP); Mitsunori Kokubo, Shizuoka (JP); Takaharu Tashiro, Shizuoka (JP); Hideki Hirayama, Saitama (JP); Ryuichiro Kamimura, Shizuoka (JP); Yamato Osada, Shizuoka (JP); Toshiro Morita, Kanagawa (JP)

(73) Assignees: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 15/526,860

(22) PCT Filed: Nov. 1, 2016

(86) PCT No.: PCT/JP2016/082397
§ 371 (c)(1),
(2) Date: May 15, 2017

(87) PCT Pub. No.: WO2017/168811
PCT Pub. Date: Oct. 5, 2017

(65) Prior Publication Data
US 2018/0198026 A1    Jul. 12, 2018

(30) Foreign Application Priority Data

Mar. 30, 2016   (JP) .................................. 2016-069434

(51) Int. Cl.
*H01L 33/10*   (2010.01)
*H01L 33/32*   (2010.01)
(Continued)

(52) U.S. Cl.
CPC .......... *H01L 33/32* (2013.01); *H01L 33/0075* (2013.01); *H01L 33/10* (2013.01); *H01L 33/405* (2013.01)

(58) Field of Classification Search
CPC ....... H01L 33/32; H01L 33/10; H01L 33/405; H01L 33/0075; H01L 2933/0083
See application file for complete search history.

(56) References Cited

U.S. PATENT DOCUMENTS

| 5,337,328 A | 8/1994 | Lang et al. |
| 5,955,749 A | 9/1999 | Joannopoulos et al. |

(Continued)

FOREIGN PATENT DOCUMENTS

| CN | 103354956 | 10/2013 |
| DE | 102009057780 | 6/2001 |

(Continued)

OTHER PUBLICATIONS

U.S. Appl. No. 14/426,328, filed Mar. 5, 2015.
(Continued)

*Primary Examiner* — Earl Taylor
(74) *Attorney, Agent, or Firm* — Hamre, Schumann, Mueller & Larson, P.C.

(57) ABSTRACT

The light extraction efficiency of a deep ultraviolet LED is increased. The deep ultraviolet LED has a design wave-
(Continued)

length λ, and includes, sequentially arranged from a side opposite to a substrate, a reflecting electrode layer, a metal layer, a p-GaN contact layer, a p-AlGaN layer that is transparent to light with the wavelength λ, one of a multi-quantum barrier layer or an electron blocking layer, a barrier layer, and a quantum well layer. A thickness of the p-AlGaN layer is less than or equal to 100 nm. A reflecting photonic crystal periodic structure having a plurality of voids is provided in a region in a thickness direction including at least an interface between the p-GaN contact layer and the p-AlGaN layer such that the reflecting photonic crystal periodic structure does not extend beyond the p-AlGaN layer in a direction of the substrate. Maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a total thickness of the p-AlGaN layer and the p-GaN contact layer. The reflecting photonic crystal periodic structure has a photonic band gap that opens for TE polarized components. A period a of the photonic crystal periodic structure satisfies a Bragg condition with respect to light with the design wavelength λ. An order m in a formula of the Bragg condition satisfies 1≤m≤5. Provided that a radius of each void is R, R/a with which the photonic band gap becomes maximum is satisfied.

14 Claims, 39 Drawing Sheets

(51) Int. Cl.
*H01L 33/40* (2010.01)
*H01L 33/00* (2010.01)

(56) References Cited

U.S. PATENT DOCUMENTS

| | | | |
|---|---|---|---|
| 7,520,742 B2 | 4/2009 | Motowaki et al. | |
| 7,687,811 B2 | 3/2010 | Jang et al. | |
| 7,872,280 B2* | 1/2011 | Nagai | H01L 23/16 257/686 |
| 8,405,103 B2 | 3/2013 | Lee et al. | |
| 8,419,995 B2 | 4/2013 | Yoneda et al. | |
| 8,703,837 B2 | 4/2014 | Kawaguchi | |
| 9,005,502 B2 | 4/2015 | Chiba et al. | |
| 9,073,102 B2 | 7/2015 | Yoshida | |
| 9,263,649 B2 | 2/2016 | Koike et al. | |
| 9,806,229 B2* | 10/2017 | Kashima | H01L 33/10 |
| 9,929,311 B2* | 3/2018 | Kashima | H01L 33/22 |
| 9,929,317 B2* | 3/2018 | Kashima | H01L 33/405 |
| 2002/0167013 A1 | 11/2002 | Iwasaki et al. | |
| 2004/0016936 A1 | 1/2004 | Tanaka et al. | |
| 2004/0113166 A1 | 6/2004 | Tadatomo et al. | |
| 2004/0114652 A1 | 6/2004 | Yoshikawa | |
| 2004/0206962 A1 | 10/2004 | Erchak et al. | |
| 2004/0252509 A1 | 12/2004 | Lin | |
| 2004/0264903 A1 | 12/2004 | Dridi et al. | |
| 2006/0043400 A1 | 3/2006 | Erchak et al. | |
| 2006/0255341 A1 | 11/2006 | Pinnington et al. | |
| 2006/0284187 A1 | 12/2006 | Wierer et al. | |
| 2006/0284190 A1 | 12/2006 | Zimmerman et al. | |
| 2007/0081253 A1 | 4/2007 | Yamauchi | |
| 2007/0121694 A1* | 5/2007 | Okamoto | B82Y 20/00 372/50.124 |
| 2007/0177644 A1 | 8/2007 | Corzine | |
| 2007/0257269 A1 | 11/2007 | Cho et al. | |
| 2007/0267646 A1 | 11/2007 | Wierer et al. | |
| 2008/0024053 A1 | 1/2008 | Fujimoto et al. | |
| 2008/0061304 A1 | 3/2008 | Huang et al. | |
| 2008/0080581 A1 | 4/2008 | Wierer et al. | |
| 2008/0258160 A1 | 10/2008 | Do | |
| 2009/0033180 A1 | 5/2009 | Abe | |
| 2009/0134425 A1 | 5/2009 | Nagai | |
| 2009/0184334 A1 | 7/2009 | Lee et al. | |
| 2010/0072501 A1 | 3/2010 | Wakai et al. | |
| 2010/0140643 A1 | 6/2010 | Cho et al. | |
| 2010/0237372 A1 | 9/2010 | Kim et al. | |
| 2011/0068676 A1 | 3/2011 | Jeon et al. | |
| 2011/0309326 A1 | 12/2011 | Gaska et al. | |
| 2012/0027038 A1 | 2/2012 | Noda et al. | |
| 2012/0112165 A1 | 5/2012 | Charlton et al. | |
| 2012/0224147 A1 | 9/2012 | Tomiyama et al. | |
| 2012/0228653 A1 | 9/2012 | Ishida et al. | |
| 2012/0247950 A1 | 10/2012 | Kaida et al. | |
| 2012/0261642 A1 | 10/2012 | Bergenek et al. | |
| 2013/0009167 A1 | 1/2013 | Tan et al. | |
| 2013/0026531 A1 | 1/2013 | Seo et al. | |
| 2013/0037820 A1 | 2/2013 | Tsukihara et al. | |
| 2013/0043499 A1 | 2/2013 | Ohta et al. | |
| 2013/0043500 A1 | 2/2013 | Orita | |
| 2013/0069034 A1 | 3/2013 | Hirayama | |
| 2013/0146916 A1 | 6/2013 | Yamamoto | |
| 2013/0222770 A1 | 8/2013 | Tomiyama | |
| 2013/0320301 A1 | 12/2013 | Seo et al. | |
| 2013/0328013 A1 | 12/2013 | Inazu et al. | |
| 2014/0057377 A1 | 2/2014 | Kamimura et al. | |
| 2014/0084317 A1 | 3/2014 | Lee et al. | |
| 2014/0151733 A1 | 6/2014 | Koike et al. | |
| 2014/0167066 A1 | 6/2014 | Kashima et al. | |
| 2015/0044417 A1 | 2/2015 | Koike | |
| 2015/0214448 A1 | 7/2015 | Lee et al. | |
| 2015/0280069 A1 | 10/2015 | Zhang et al. | |
| 2016/0042102 A1 | 2/2016 | Kashima et al. | |
| 2016/0133785 A1 | 5/2016 | Kashima et al. | |
| 2017/0358712 A1* | 12/2017 | Kashima | H01L 33/405 |

FOREIGN PATENT DOCUMENTS

| | | |
|---|---|---|
| EP | 1526583 | 4/2005 |
| EP | 2690650 | 1/2014 |
| EP | 2733752 | 5/2014 |
| EP | 2827361 | 1/2015 |
| EP | 2942818 | 11/2015 |
| JP | 2002305328 | 10/2002 |
| JP | 2007109689 | 4/2004 |
| JP | 2004200209 | 7/2004 |
| JP | 2005012160 | 1/2005 |
| JP | 2006196658 | 7/2006 |
| JP | 2006276388 | 10/2006 |
| JP | 2006523953 | 10/2006 |
| JP | 2007036186 | 2/2007 |
| JP | 2007294789 | 11/2007 |
| JP | 2007305998 | 11/2007 |
| JP | 2008030235 | 2/2008 |
| JP | 2008053425 | 3/2008 |
| JP | 2008098526 | 4/2008 |
| JP | 2008117922 | 5/2008 |
| JP | 2008538658 | 10/2008 |
| JP | 2008311317 | 12/2008 |
| JP | 2009033180 | 2/2009 |
| JP | 4329374 | 9/2009 |
| JP | 2009267263 | 11/2009 |
| JP | 2010074008 | 4/2010 |
| JP | 2010074090 | 4/2010 |
| JP | 2010135798 | 6/2010 |
| JP | 200981469 | 10/2010 |
| JP | 4610863 | 1/2011 |
| JP | 2011086853 | 4/2011 |
| JP | 2011228513 | 11/2011 |
| JP | 2012186414 | 9/2012 |
| JP | 2013009002 | 1/2013 |
| JP | 2013120829 | 6/2013 |
| JP | 2013530537 | 7/2013 |
| JP | 5315513 | 10/2013 |
| JP | 2014068010 | 4/2014 |
| JP | 201541763 | 3/2015 |
| JP | 5757512 | 7/2015 |

(56) References Cited

FOREIGN PATENT DOCUMENTS

| | | |
|---|---|---|
| JP | 2015195388 | 11/2015 |
| KR | 20090001903 | 1/2009 |
| KR | 20110131212 | 12/2011 |
| KR | 20120117892 | 10/2012 |
| KR | 20130055015 | 5/2013 |
| KR | 20140133607 | 11/2014 |
| TW | 201535782 | 9/2015 |
| WO | 2008041161 | 4/2008 |
| WO | 2009148138 | 12/2009 |
| WO | 2011049018 | 4/2011 |
| WO | 2011104969 | 9/2011 |
| WO | 2011159993 | 12/2011 |
| WO | 2012067080 | 5/2012 |
| WO | 2012127660 | 9/2012 |
| WO | 2013008556 | 1/2013 |
| WO | 2013132993 | 9/2013 |
| WO | 2014154047 | 10/2014 |
| WO | 2015008776 | 1/2015 |
| WO | 2013137176 | 8/2015 |
| WO | 2015133000 | 9/2015 |
| WO | 2016113935 | 7/2016 |

OTHER PUBLICATIONS

U.S. Appl. No. 14/777,176, filed Sep. 15, 2015.
U.S. Appl. No. 15/540,510, filed Jun. 28, 2017.
International Search Report issued in corresponding International Application No. PCT/JP2016/082397 (3 pages).
Written Opinion issued in corresponding International Application No. PCT/JP2016/082397 (6 pages).
International Search Report issued in corresponding International Application No. PCT/JP2016/075756 (3 pages).
Supplementary European Search Report issued in corresponding European Application No. 16861100.2 dated Jul. 17, 2017 (12 pages).
International search report for International application No. PCT/JP2015/071453, dated Sep. 29, 2015 (8 pages).
Hirayama et al.: "Recent progress and future prospects of ALgaN-based high-efficiency deep-ultraviolet light-emitting diodes"; Japanese Journal of Applied Physics, vol. 53, 2014, pp. 1-10.
Shinji Matsui: "Current Nano-imprint processing technologies"; Monthly Display, 2005, vol. 11, No. 5, pp. 82-89 (partial English translation).
Nakamatsu et al.: "Bilayer Resist Method for Room-Temperature Nanoimprint Lithography"; Japanese Journal of Applied Physics, 2004, vol. 43, No. 6B, pp. 4050-4053.
Korean Office Action for Korean application No. 2015-7005308, dated Oct. 21, 2015 (6 pages).
Extended European Search Report issued in the corresponding European Patent Application No. 14841324.8 dated Oct. 23, 2015 (6 pages).
International search report for International application No. PCT/JP2014/068864 dated Sep. 9, 2014 (4 pages).
Office Action dated Jun. 1, 2015 in Korean Application No. 2015-036659629 (6 pages).

T. Nakashima et al.: "Improvment of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).
CREST Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial English Translation provided).
Delbeke et al.: "Rigorous electromagnetic analysis of dipole in periodically corrugated layers: the grating-assisted resonant-cavity light-emitting diode." J. Opt. Soc. AM. A, 2002, vol. 64, No. 19, No. 5, pp. 871-880.
Gourley et al.: "Optical properties of two-dimensional photonic lattices fabricated as honeycomb nanostructures in compound semiconductors," Applied Physics Letters, 1994, vol. 64, No. 6, pp. 687-689.
Xie et al.: "Optimization design and fabrication of photonic crystal waveguides based on SOI using 248nm deep UV lithography," Proceedings of SPIE, 2004, vol. 5280, pp. 798-804.
Japan Society for the Promotion of Science: "Wide-gap semiconductor/electronic device, No. 162 committee"; The 74th Workshop Document: Development of DUVLED by UV Craftory, Co., Ltd., dated Apr. 22, 2011.
Japanese Office Action for Japanese Application No. 2015-559356, dated Apr. 26, 2016. (5 pages).
International Search Report issued in Japanese Application No. PCT/JP2015/084461 dated Jan. 12, 2016 (10 pages).
Choi et al.: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.
Lai et al.: "Directional light extraction enhancement from GaN-based film-transferred photonic crystal light-emitting diodes"; Applied Physics Letters, 2009, vol. 64, pp. 123106-1 to 123106-3 (4 pages).
Orita et al.: "High-Extraction-Efficiency blue Light-Emitting Diode using Extended-Pitch Photonic Crystal"; 2004, vol. 43, No. 8B, pp. 5809-5813.
Ding et al.: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.
Kashima et al.: "The micro machining process technology of nano imprint and dry etcing to improve the efficiency of notride LED"; IEICE Technical Report, 2014, vol. 114, No. 336, pp. 27-32.
Chinese Office Action dated Dec. 19, 2016 for Chinese Patent Application Serial No. 201480002228.2,3 pages.
Taiwan Office Action issued in Taiwan Application No. 105128384 dated Apr. 11, 2018 (5 pages).
European Search Report issued in European Application No. 15877887.8 dated Apr. 19, 2018 (4 pages).

* cited by examiner

Fig. 1A (a-1)

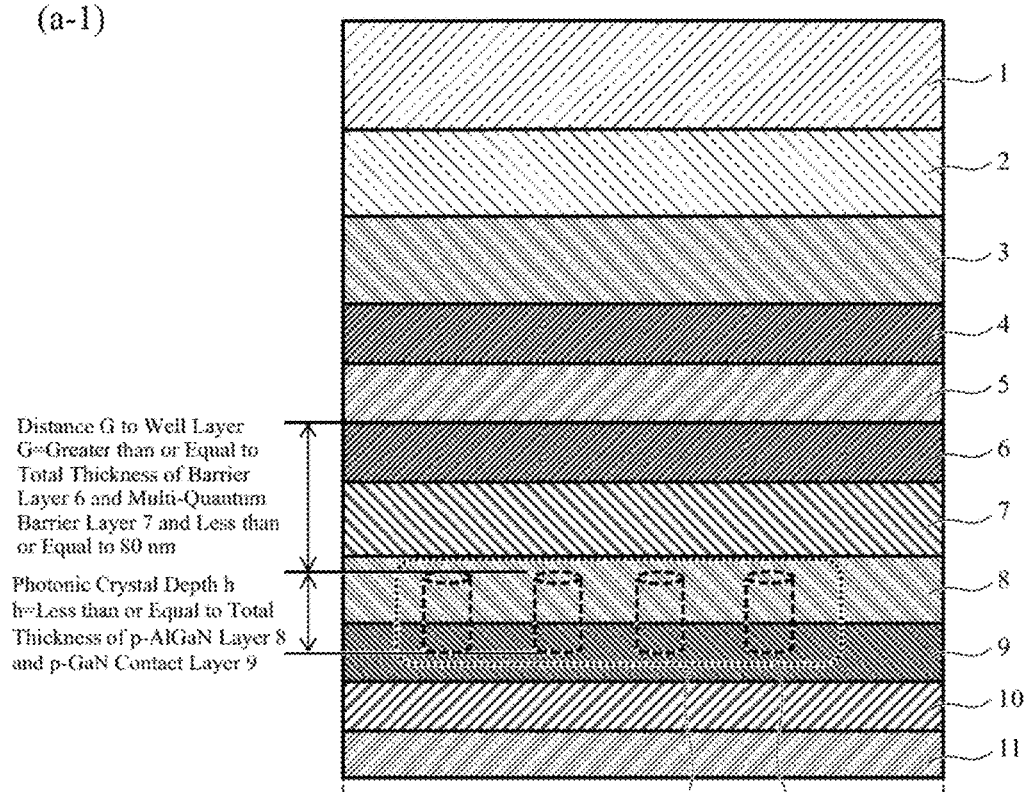

Distance G to Well Layer
G=Greater than or Equal to
Total Thickness of Barrier
Layer 6 and Multi-Quantum
Barrier Layer 7 and Less than
or Equal to 80 nm Photonic Crystal Depth h
h=Less than or Equal to Total
Thickness of p-AlGaN Layer 8
and p-GaN Contact Layer 9

(a-2)

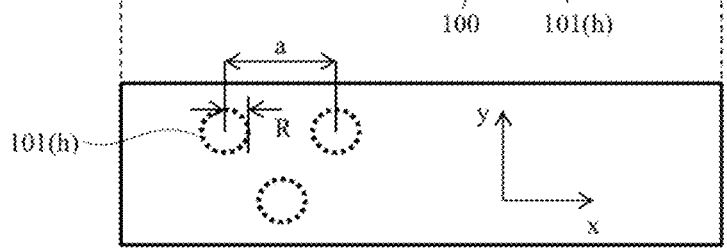

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 50 nm, n=2.583)
9. p-GaN Contact Layer (Thickness: 50 nm, n=2.618, k=0.42)
10. Ni Layer (Thickness: 20 nm, n=1.681, k=2.067)
11. Au Reflecting Electrode Layer (Thickness: 200 nm, n=1.678, k=1.873)
100. Photonic Crystal Periodic Structure
101(h). Voids (Columnar Structures or Holes)
Refractive Index: n
Extinction Coefficient: k

Fig. 1C (a-1)

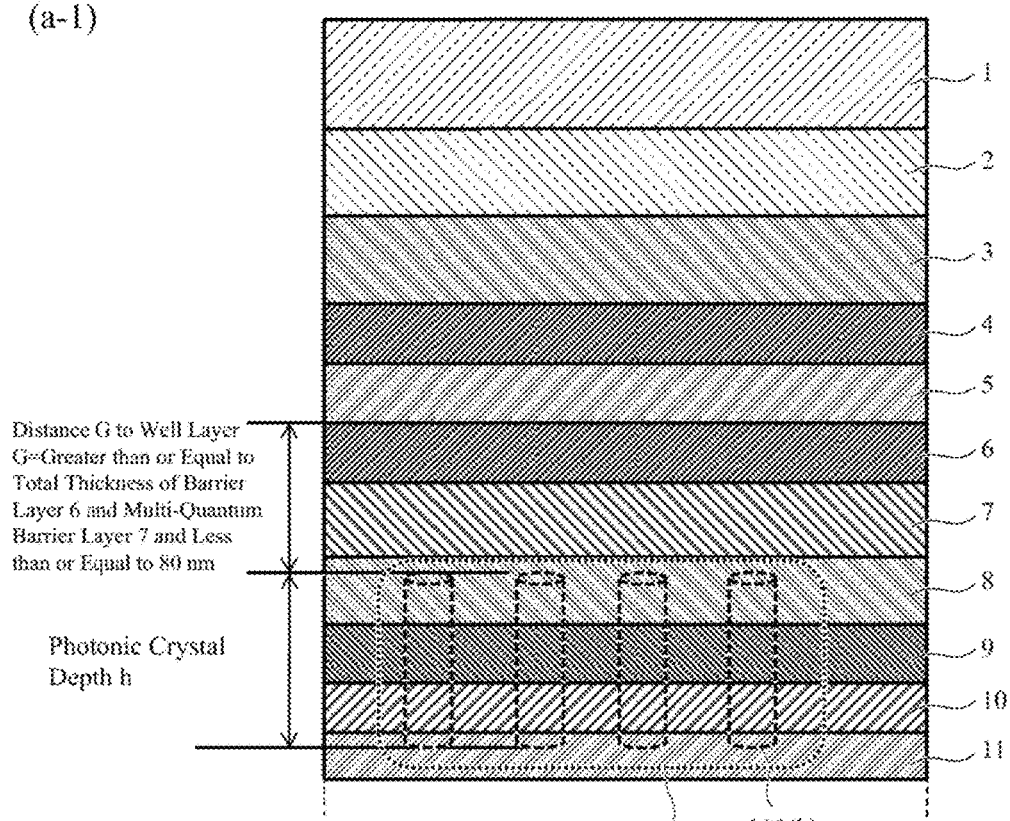

Distance G to Well Layer
G=Greater than or Equal to
Total Thickness of Barrier
Layer 6 and Multi-Quantum
Barrier Layer 7 and Less
than or Equal to 80 nm Photonic Crystal
Depth h (a-2)

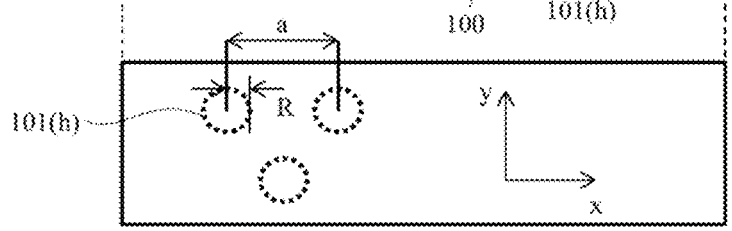

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 50 nm, n=2.583)
9. p-GaN Contact Layer (Thickness: 20 nm, n=2.618, k=0.42)
10. Ni Layer (Thickness: 20 nm, n=1.681, k=2.067)
11. Au Reflecting Electrode Layer (Thickness: 200 nm, n=1.678, k=1.873)
100. Photonic Crystal Periodic Structure
101(h). Voids (Columnar Structures or Holes)
Refractive Index: n
Extinction Coefficient: k (b)

Fig. 2
(a)
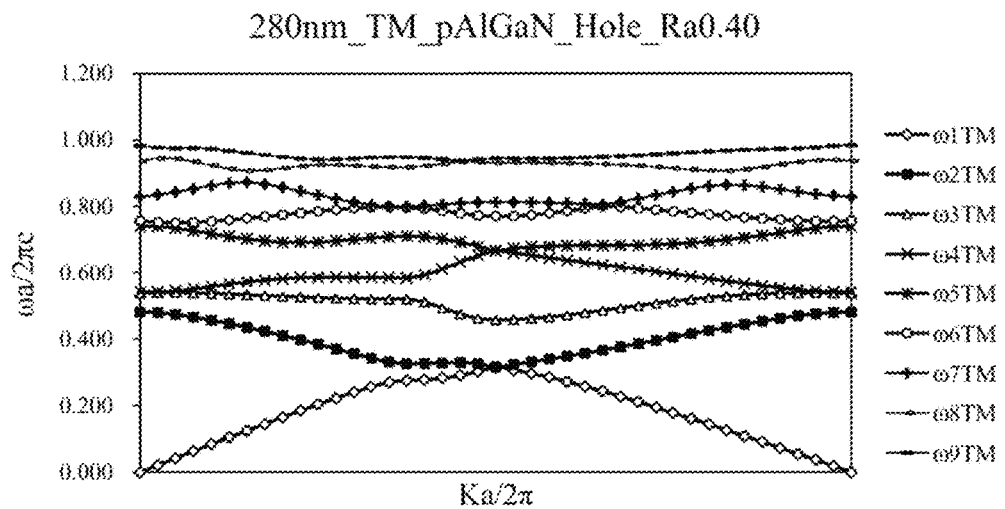
(b)
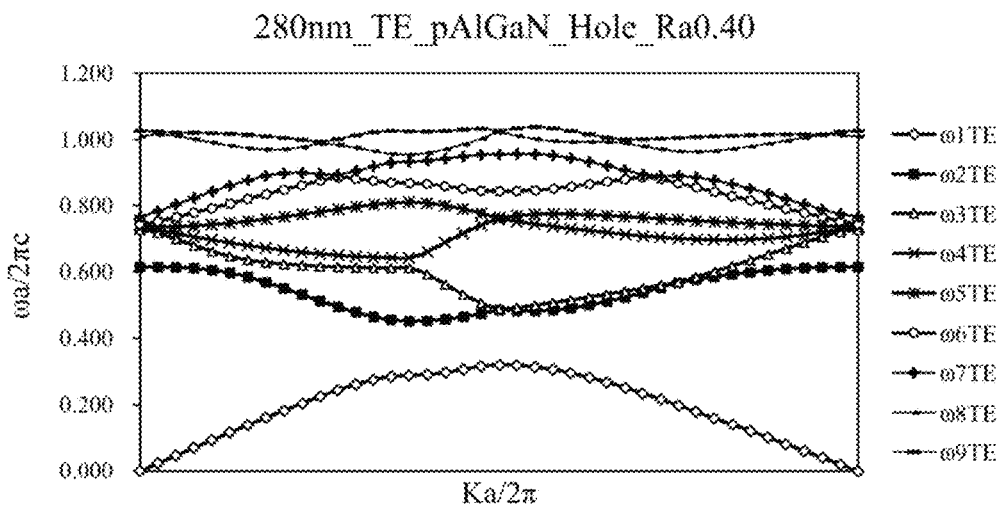

Fig. 4A (a-1)

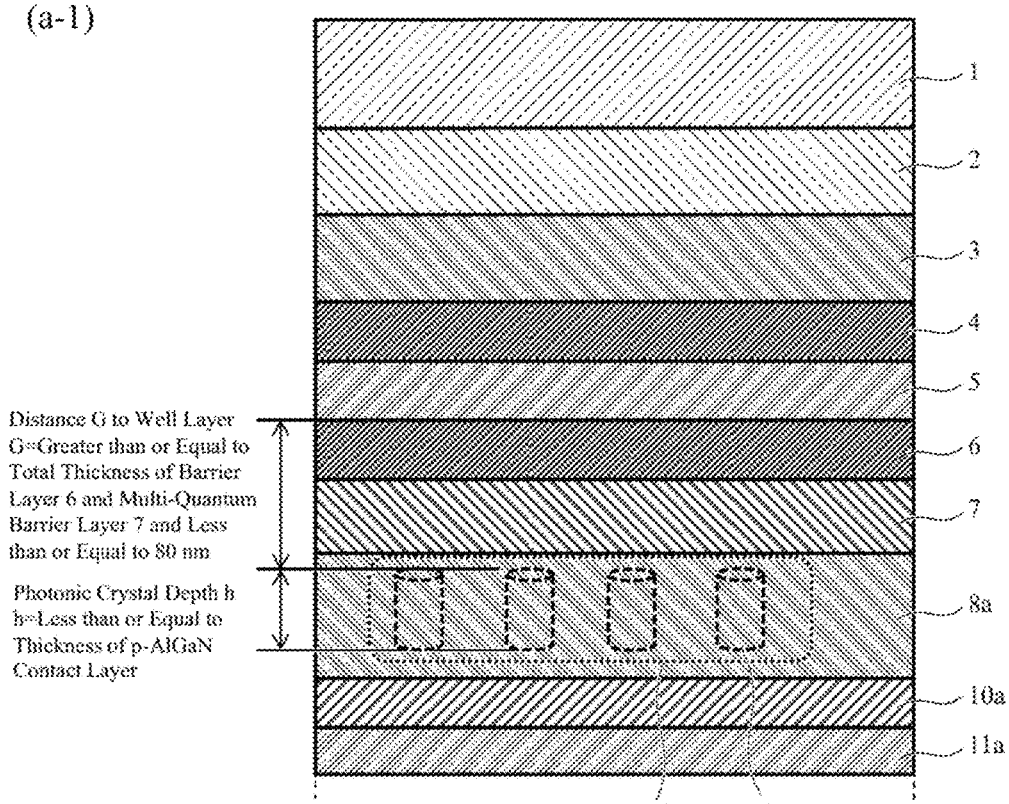

Distance G to Well Layer
G=Greater than or Equal to
Total Thickness of Barrier
Layer 6 and Multi-Quantum
Barrier Layer 7 and Less
than or Equal to 80 nm Photonic Crystal Depth h
h=Less than or Equal to
Thickness of p-AlGaN
Contact Layer (a-2)

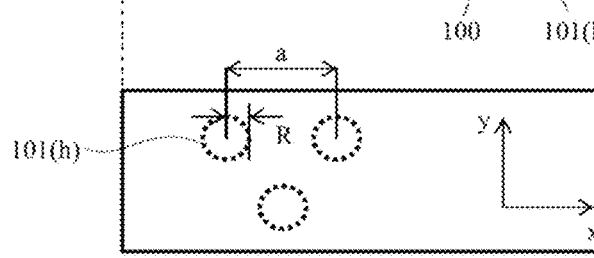

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8a. p-AlGaN Contact Layer (Thickness: 100 nm, n=2.583)
10a. Ultrathin Ni Layer (Thickness: 1 nm, n=1.681, k=2.067)
11a. Al Reflecting Electrode Layer (Thickness: 200 nm, n=0.241, k=3.357)
100. Photonic Crystal Periodic Structure
101(h). Voids (Columnar Structures or Holes)
Refractive Index: n
Extinction Coefficient: k (b)

Fig. 4C

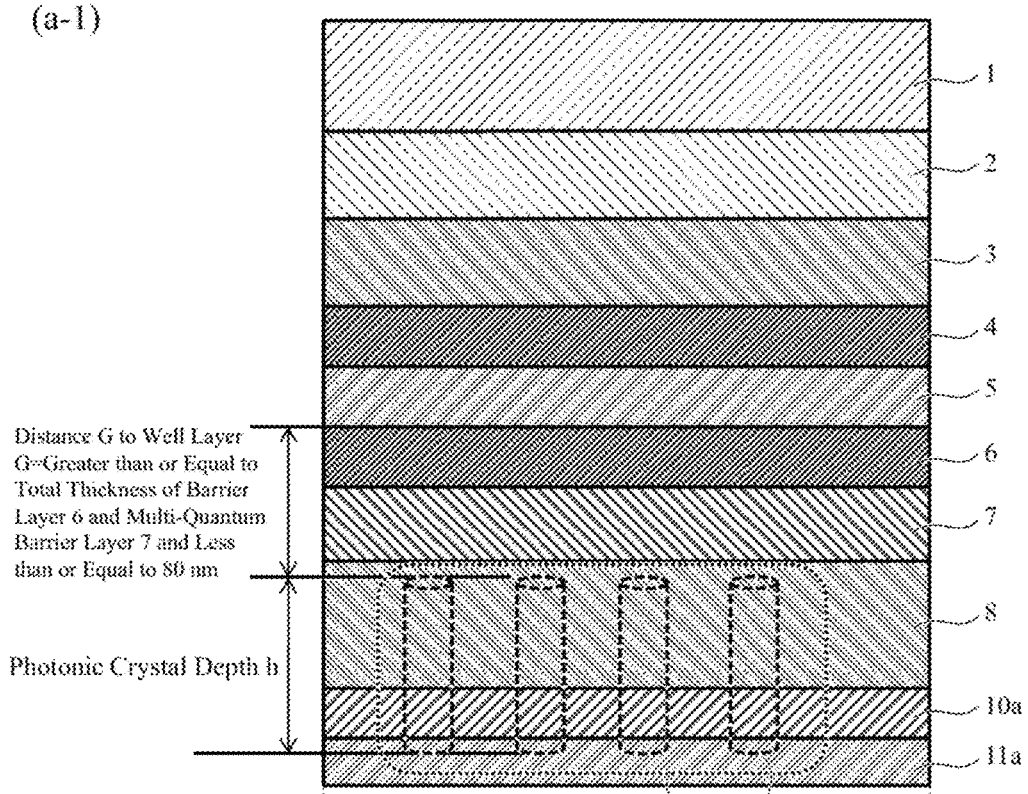

Distance G to Well Layer
G=Greater than or Equal to
Total Thickness of Barrier
Layer 6 and Multi-Quantum
Barrier Layer 7 and Less
than or Equal to 80 nm Photonic Crystal Depth h

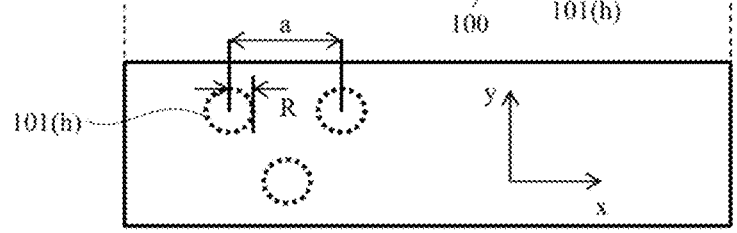

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 70 nm, n=2.583)

10a. Ultrathin Ni Layer (Thickness: 1 nm, n=1.681, k=2.067)
11a. Al Reflecting Electrode Layer (Thickness: 200 nm, n=0.241, k=3.357)
100. Photonic Crystal Periodic Structure
101(h). Voids (Columnar Structures or Holes)
Refractive Index: n
Extinction Coefficient: k (b)

Fig. 5
(a)
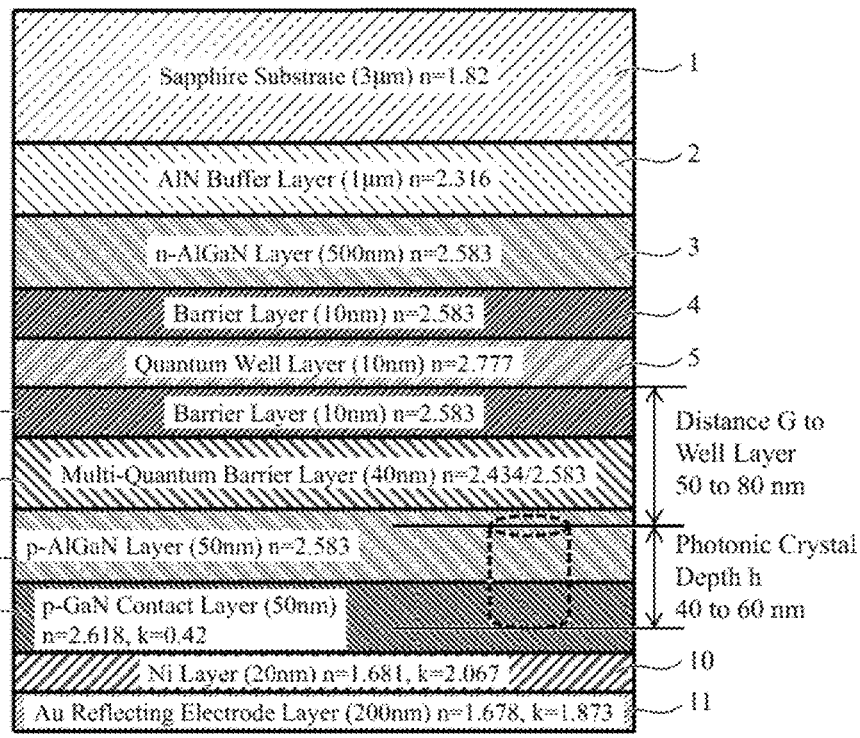
(b)
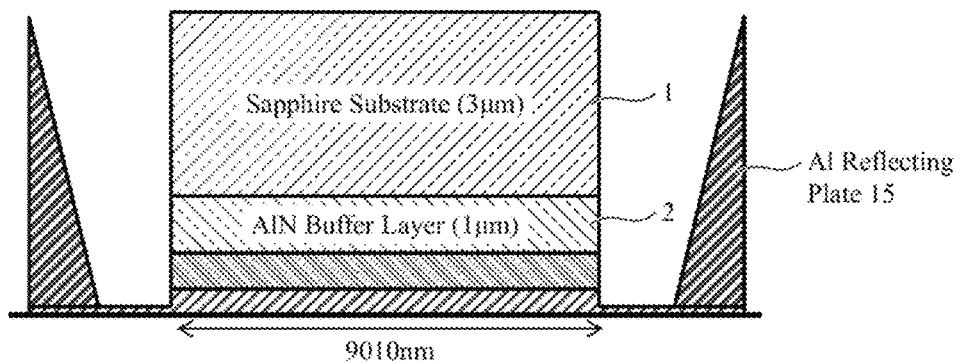

Fig. 8A
(a) Flat:Ex
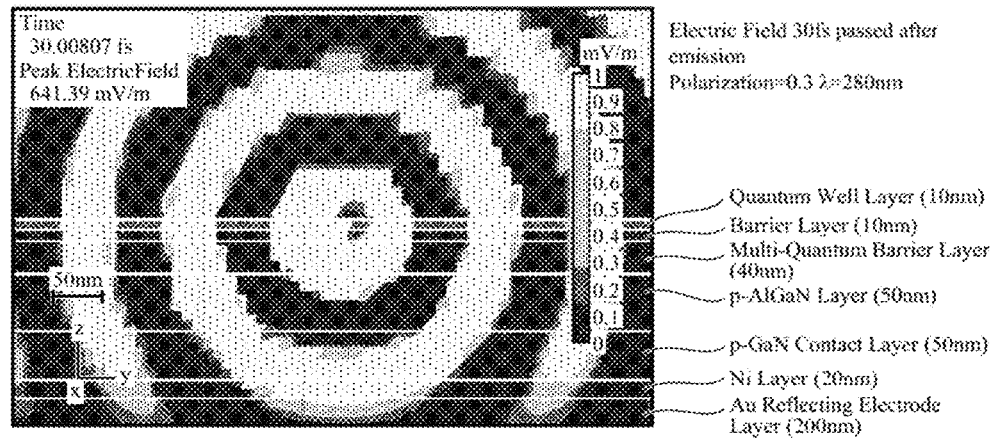
(b) Photonic Crystal:Ex
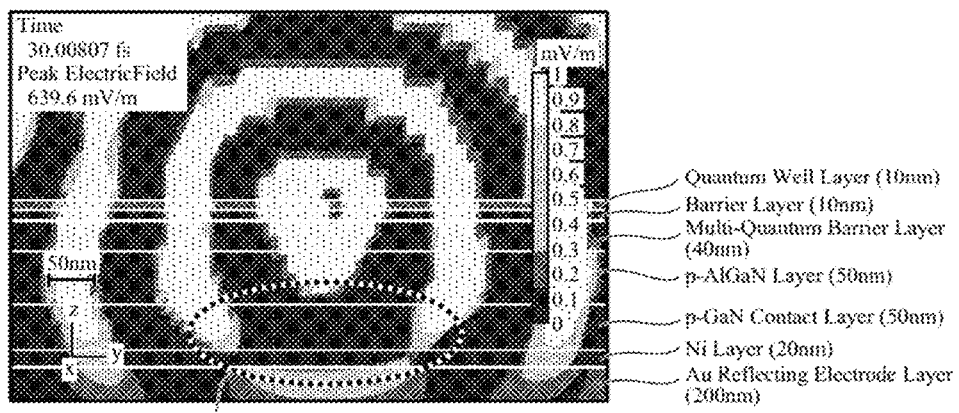
(c)
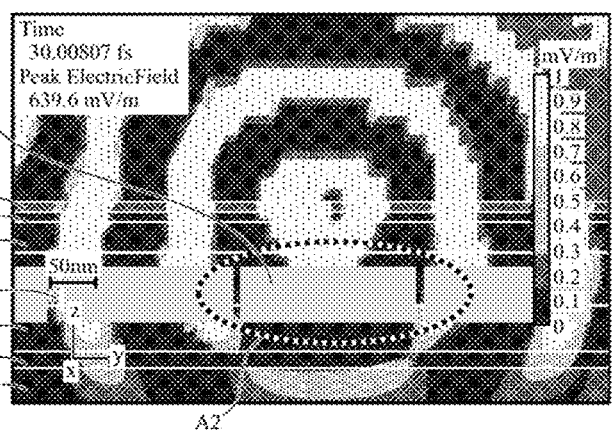

Fig. 8B
(a) Flat:Ey
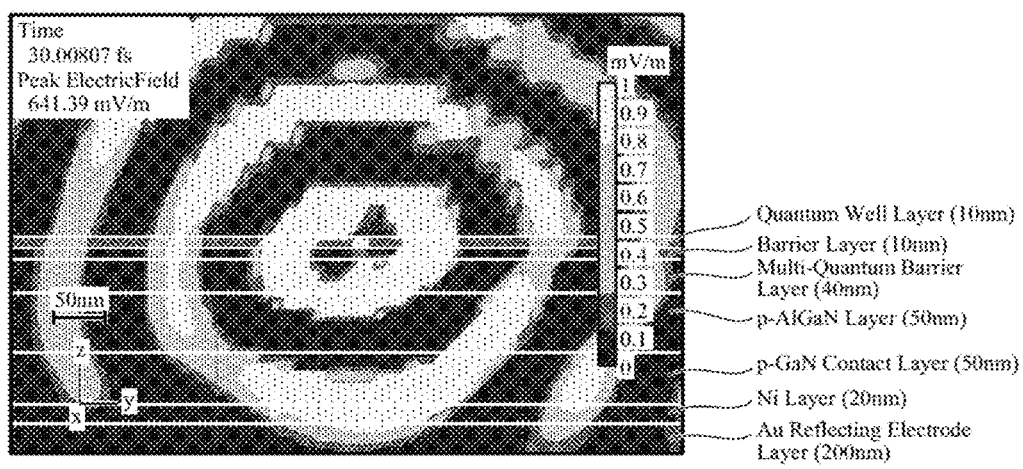
(b) Photonic Crystal:Ey
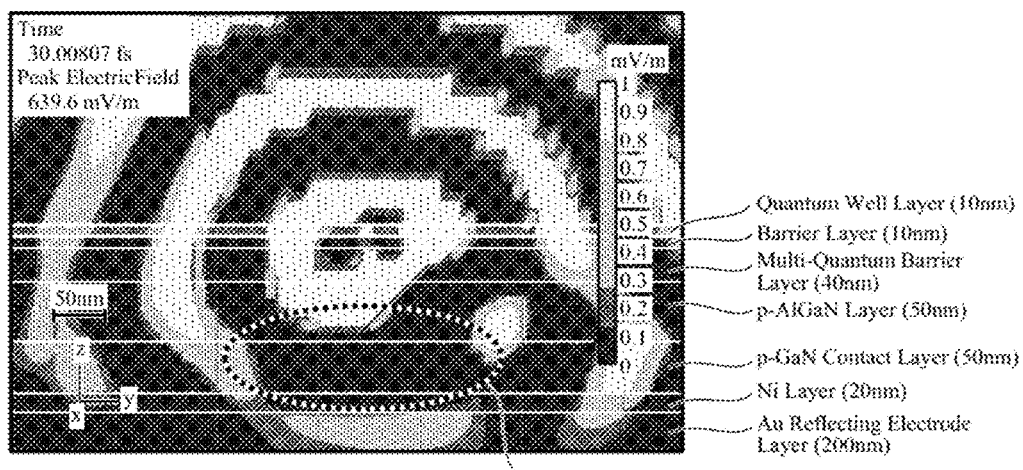

Fig. 8C
(a) Flat:Ez
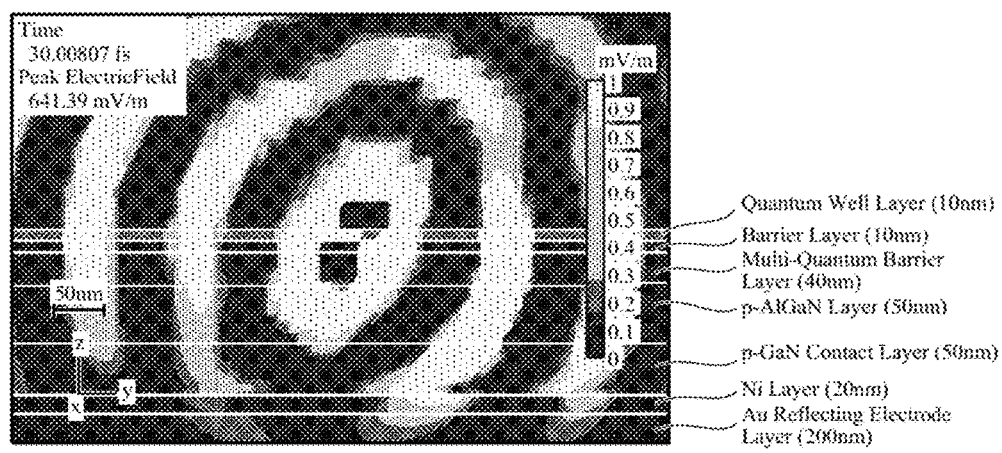
(b) Photonic Crystal:Ez
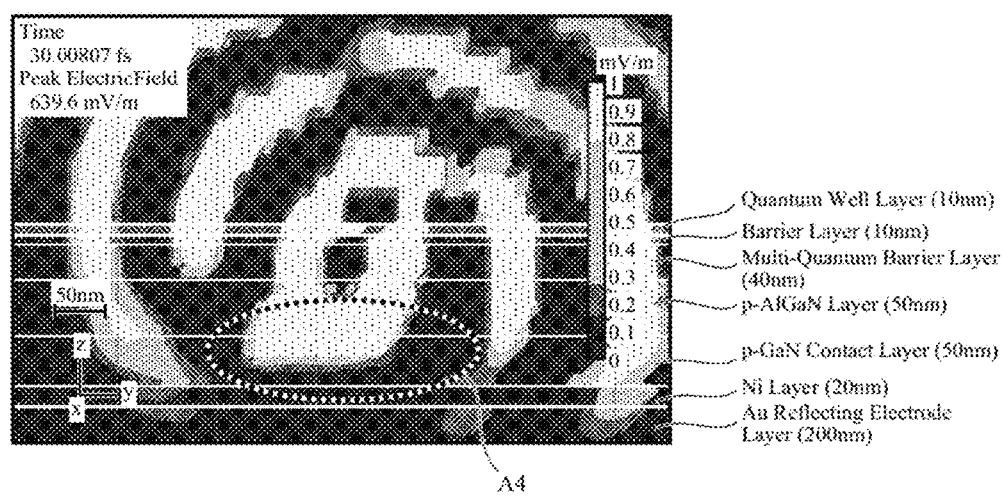

Fig. 8D
(a) Flat:Etotal
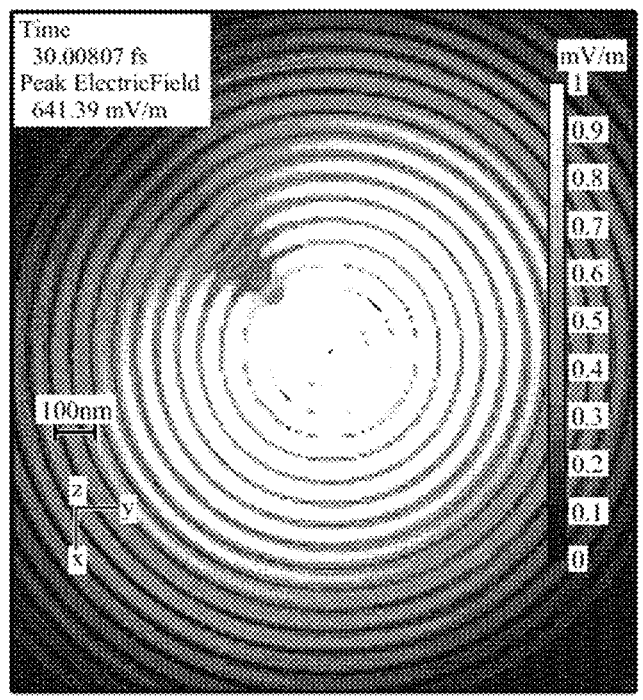
(b) Photonic Crystal:Etotal
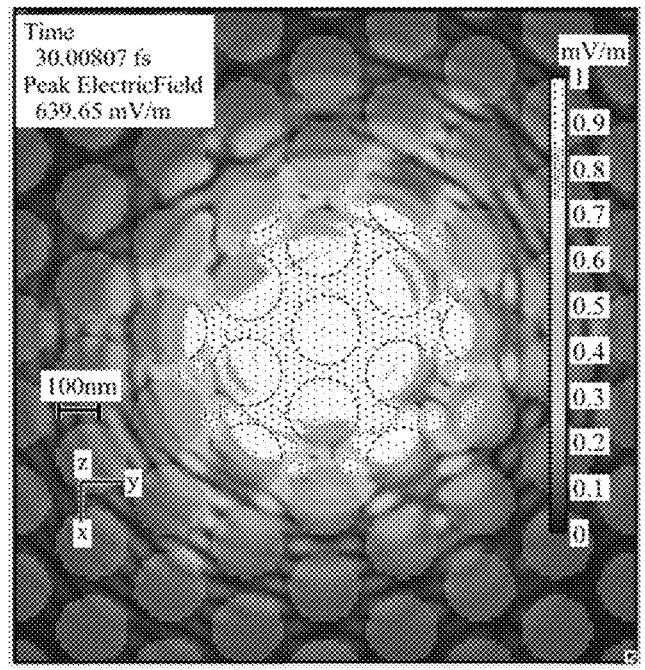

Fig. 9
(a)
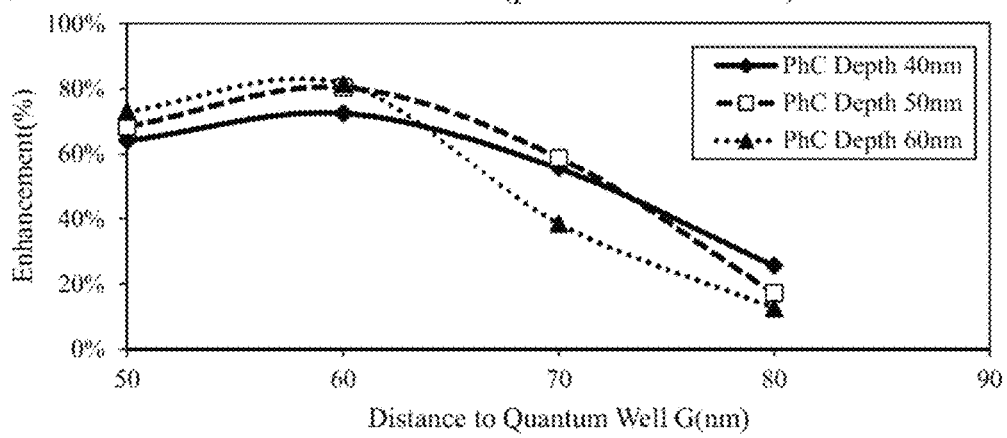
(b)
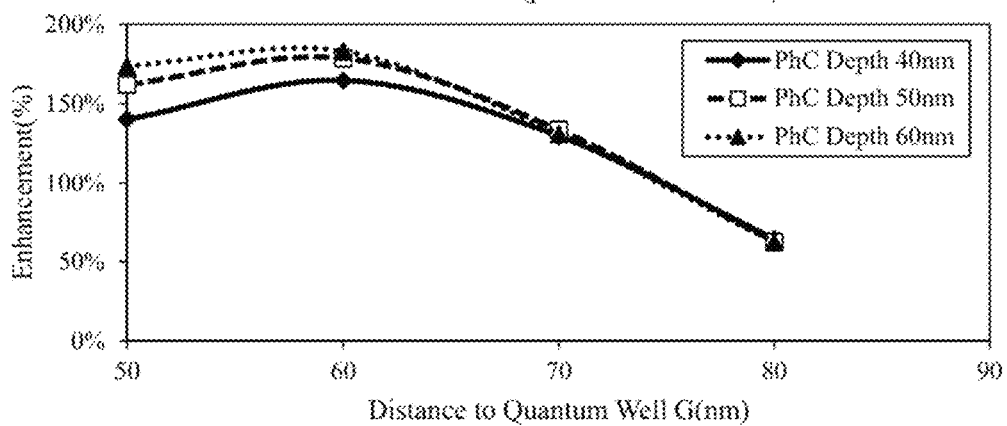
(c)
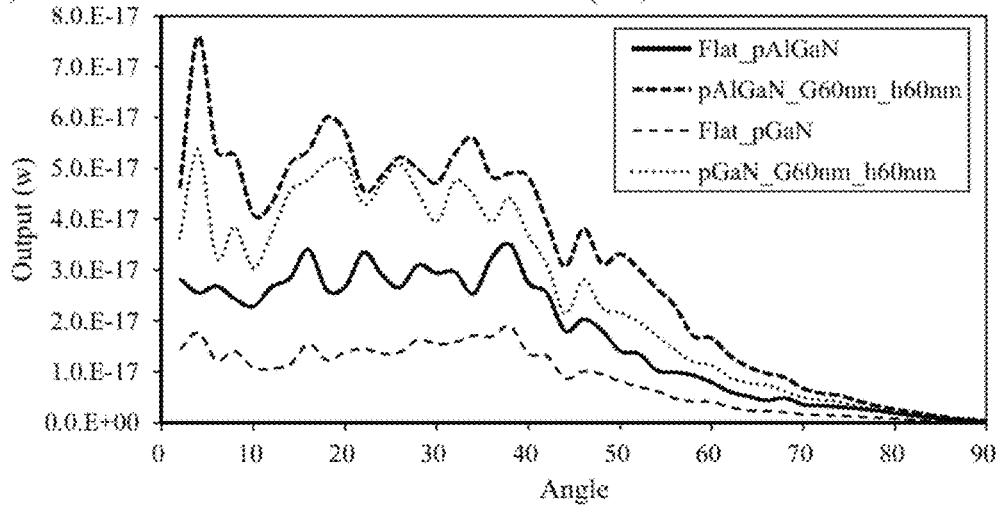

Fig. 10
(a)
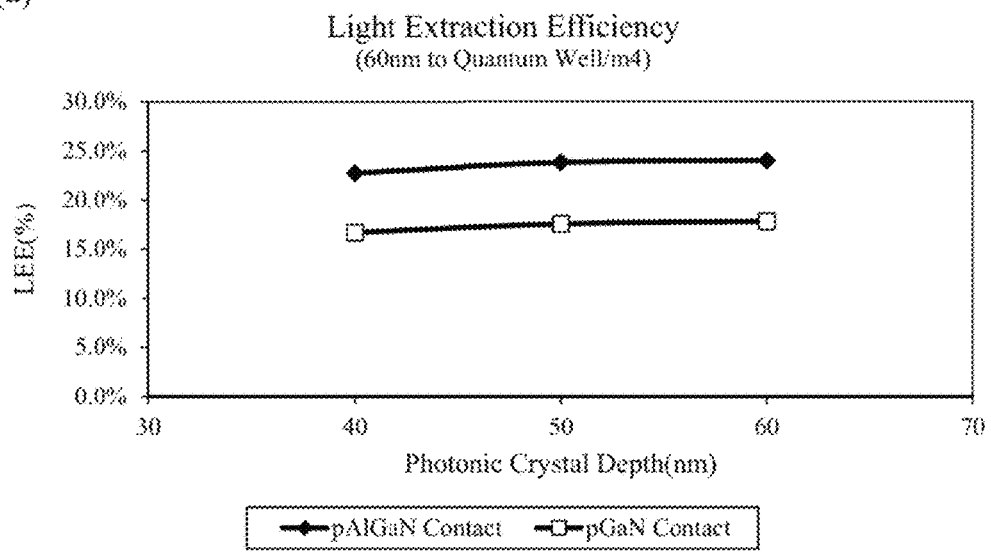
(b)
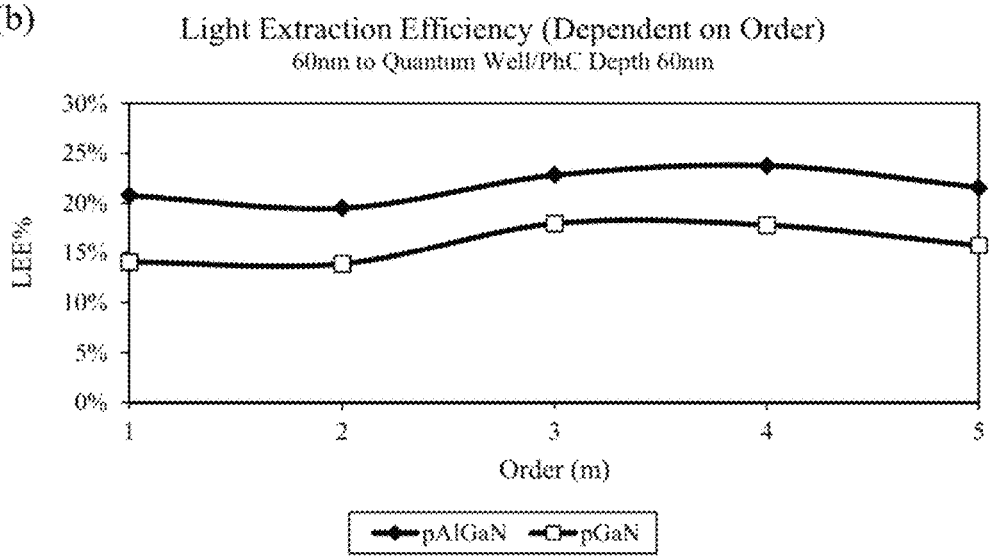

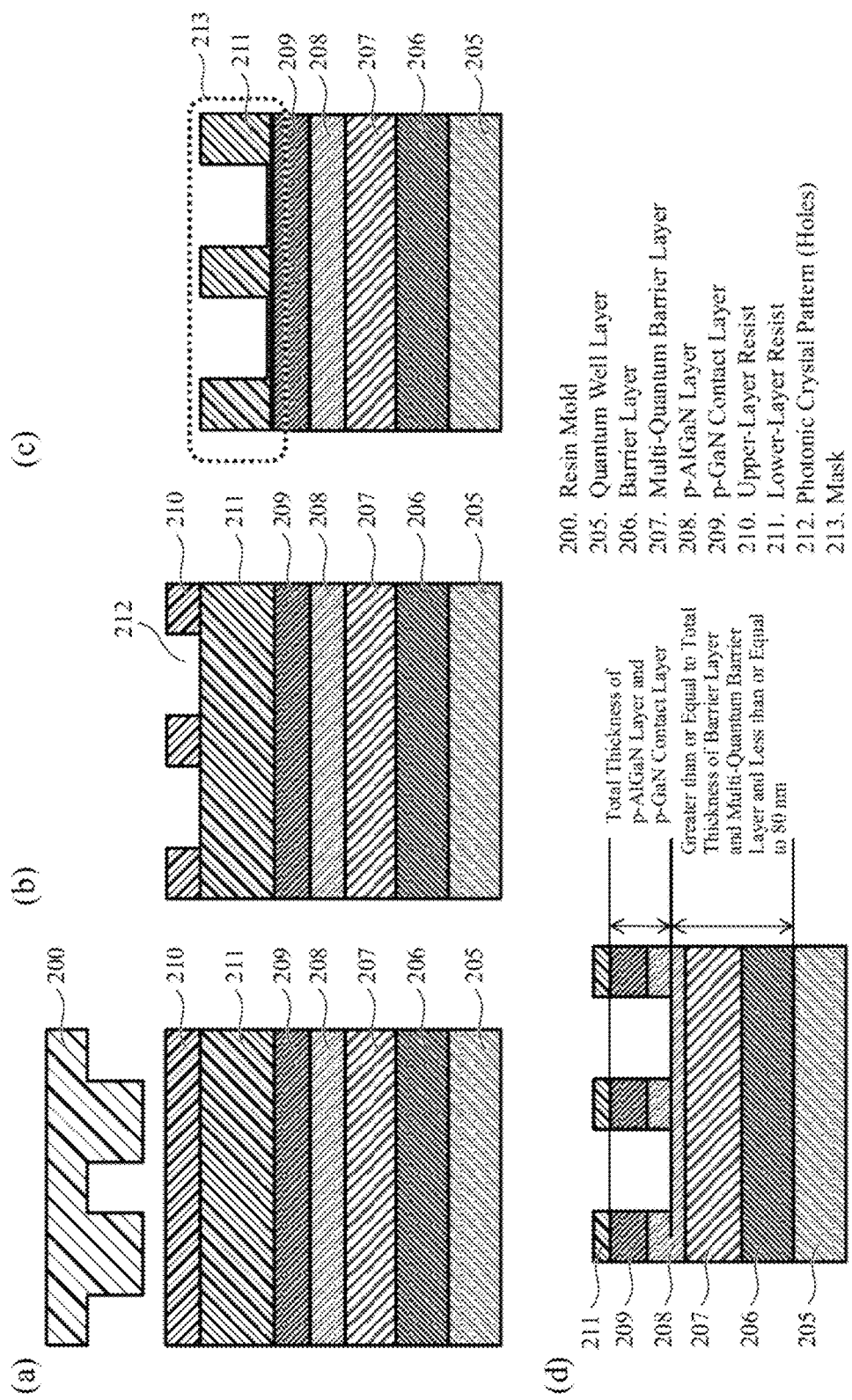

Fig. 12A (a-1)

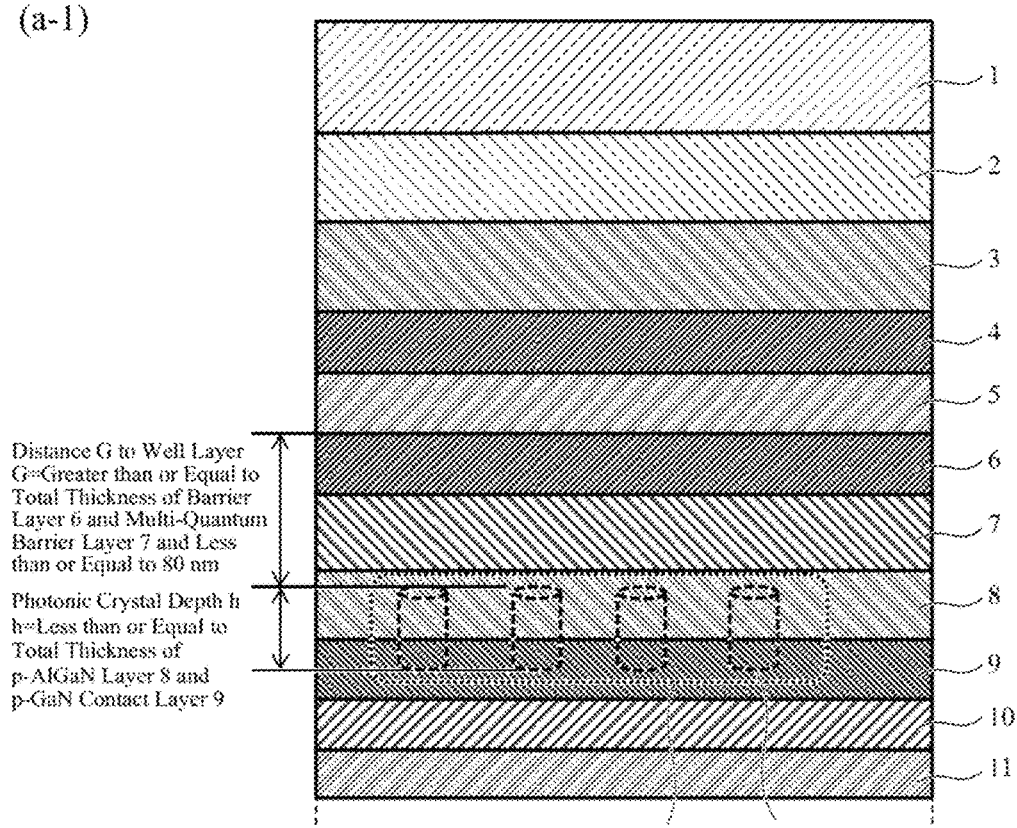

Distance G to Well Layer
G=Greater than or Equal to
Total Thickness of Barrier
Layer 6 and Multi-Quantum
Barrier Layer 7 and Less
than or Equal to 80 nm Photonic Crystal Depth h
h=Less than or Equal to
Total Thickness of
p-AlGaN Layer 8 and
p-GaN Contact Layer 9

(a-2)

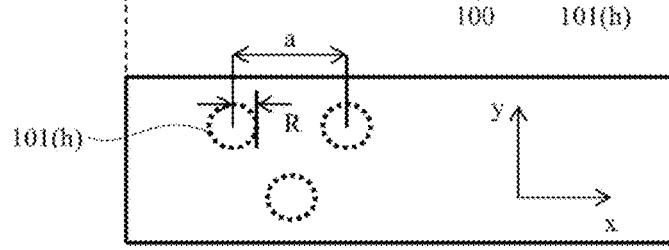

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 50 nm, n=2.583)
9. p-GaN Contact Layer (Thickness: 200 nm, n=2.618, k=0.42)
10. Ni Layer (Thickness: 20 nm, n=1.681, k=2.067)
11. Au Reflecting Electrode Layer (Thickness: 200 nm, n=1.678, k=1.873)
100. Photonic Crystal Periodic Structure
101(h). Voids (Columnar Structures or Holes)
Refractive Index: n
Extinction Coefficient: k Fig. 13
(a)
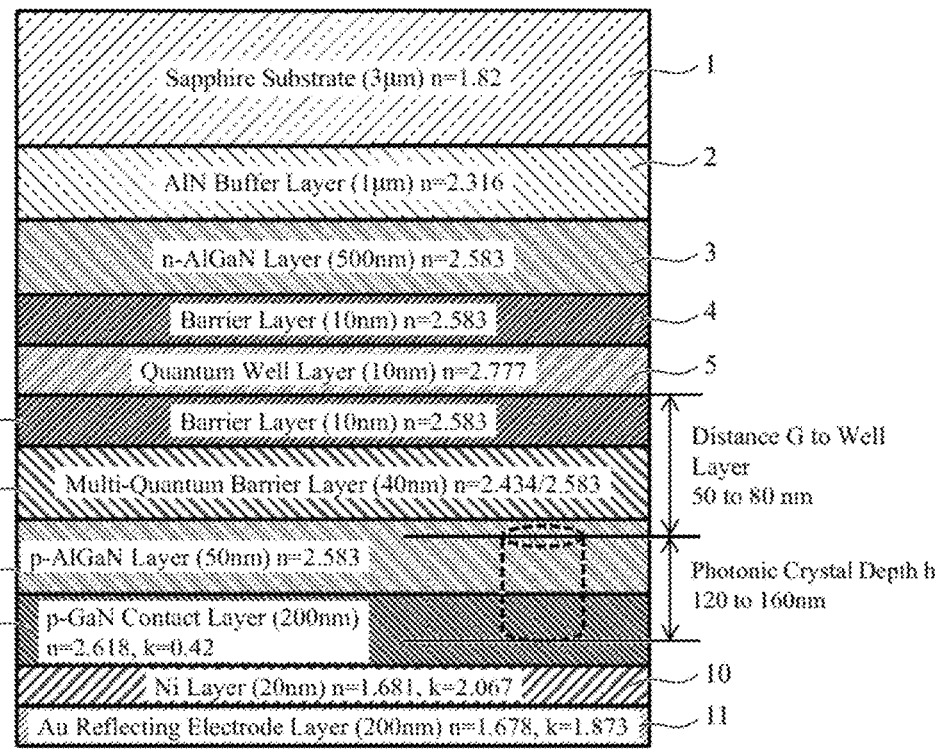
(b)
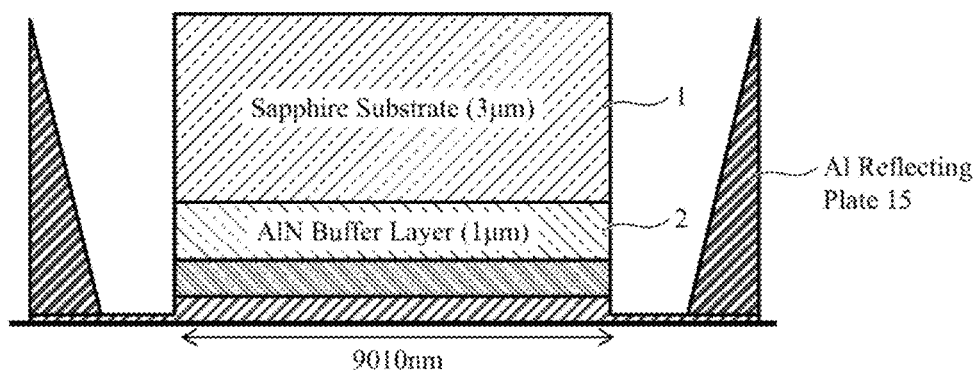

Fig. 16A (a-1)

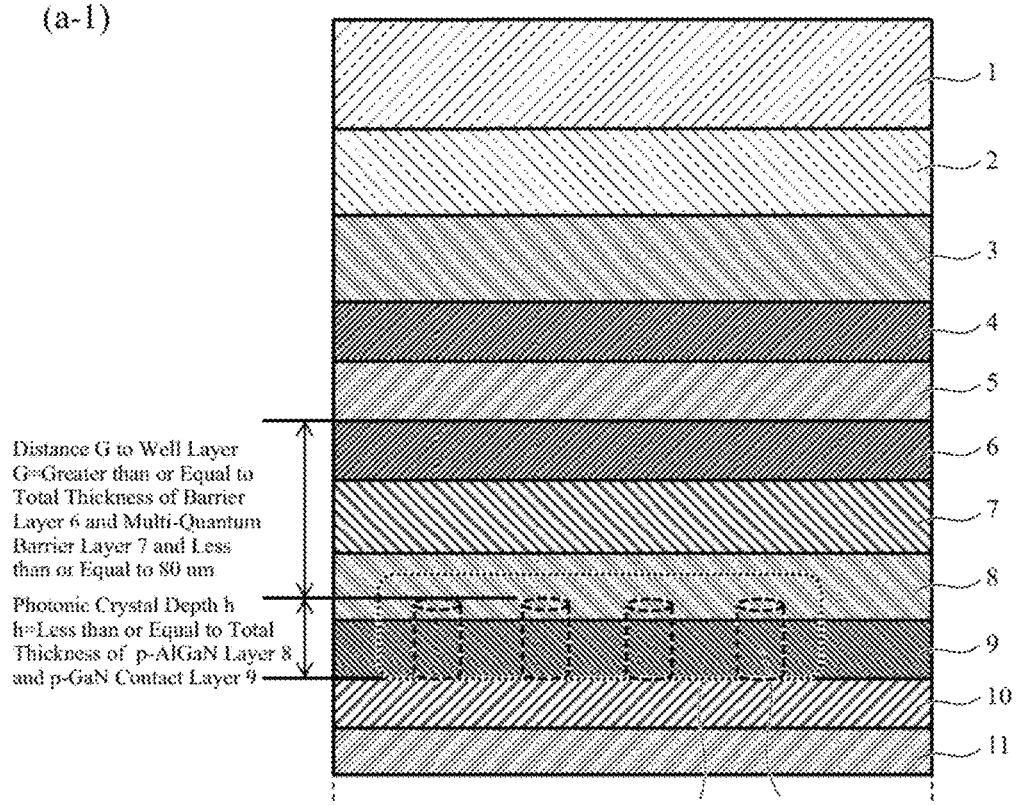

Distance G to Well Layer
G=Greater than or Equal to
Total Thickness of Barrier
Layer 6 and Multi-Quantum
Barrier Layer 7 and Less
than or Equal to 80 nm Photonic Crystal Depth h
h=Less than or Equal to Total
Thickness of p-AlGaN Layer 8
and p-GaN Contact Layer 9

(a-2)

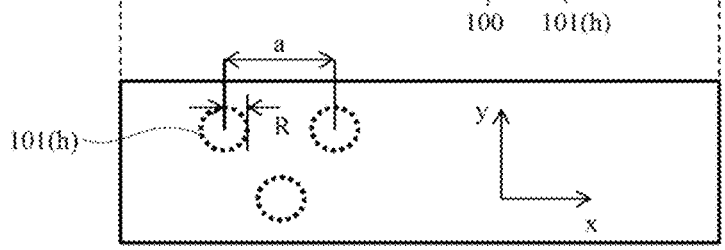

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 50 nm, n=2.583)
9. p-GaN Contact Layer (Thickness: 150 nm, n=2.618, k=0.42)
10. Ni Layer (Thickness: 20 nm, n=1.681, k=2.067)
11. Au Reflecting Electrode Layer (Thickness: 200 nm, n=1.678, k=1.873)
100. Photonic Crystal Periodic Structure
101(h). Voids (Columnar Structures or Holes)
Refractive Index: n
Extinction Coefficient: k Fig. 17
(a)
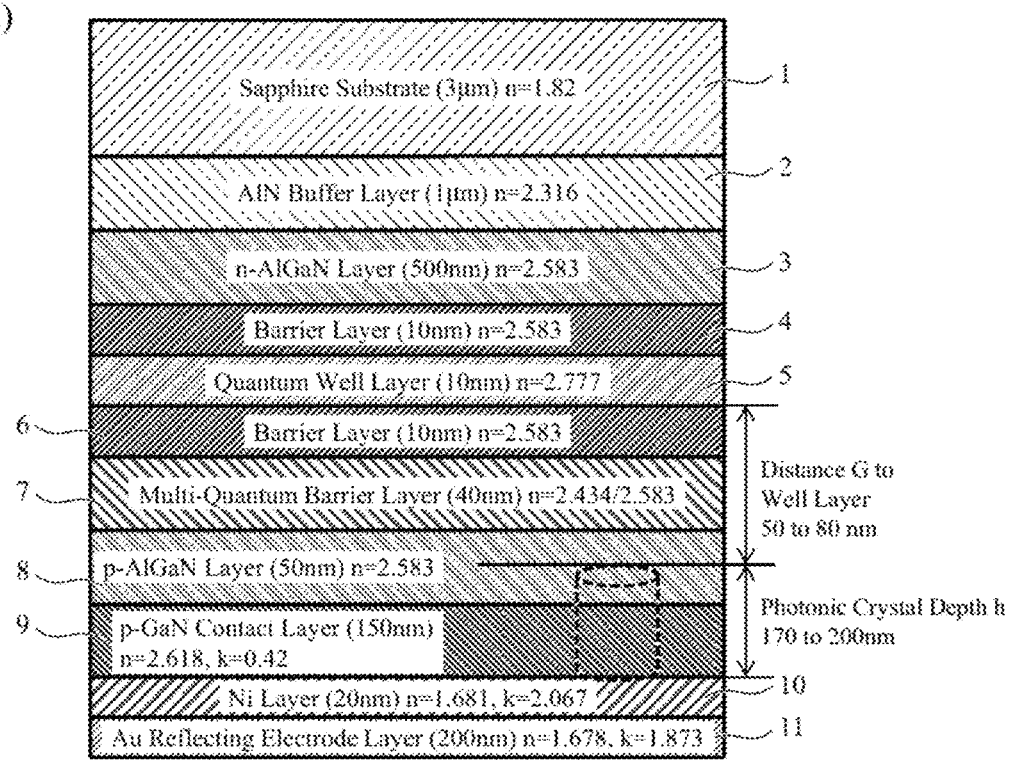
(b)
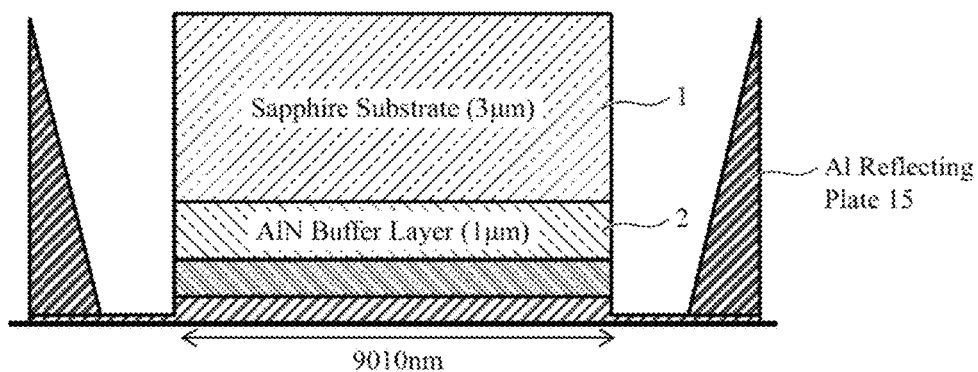

Fig. 18
(a)
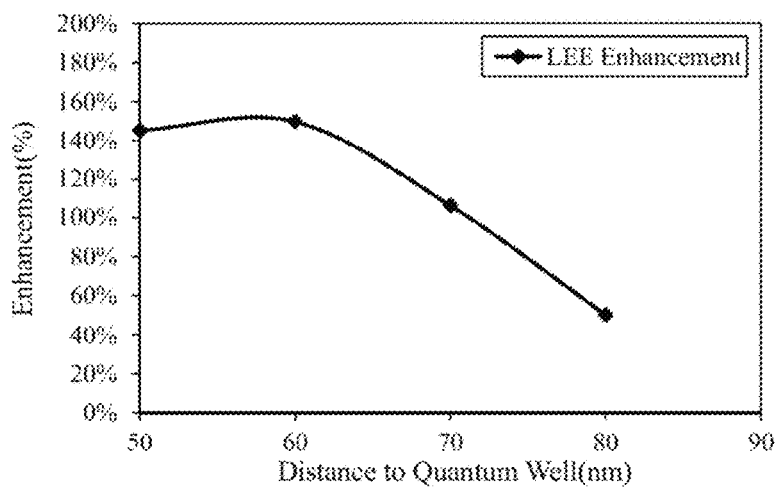
(b)
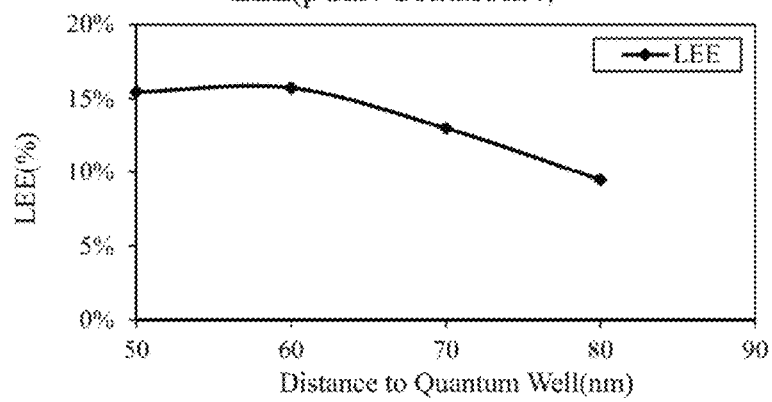
(c)
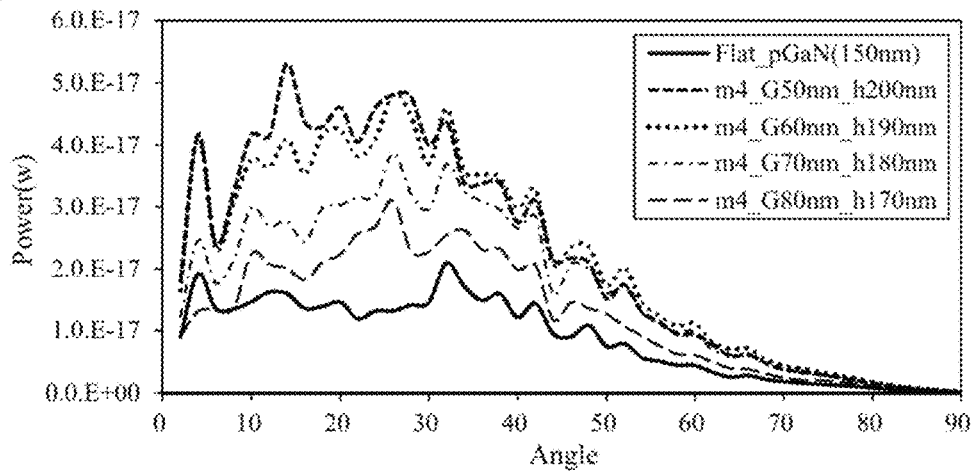

Fig. 19A

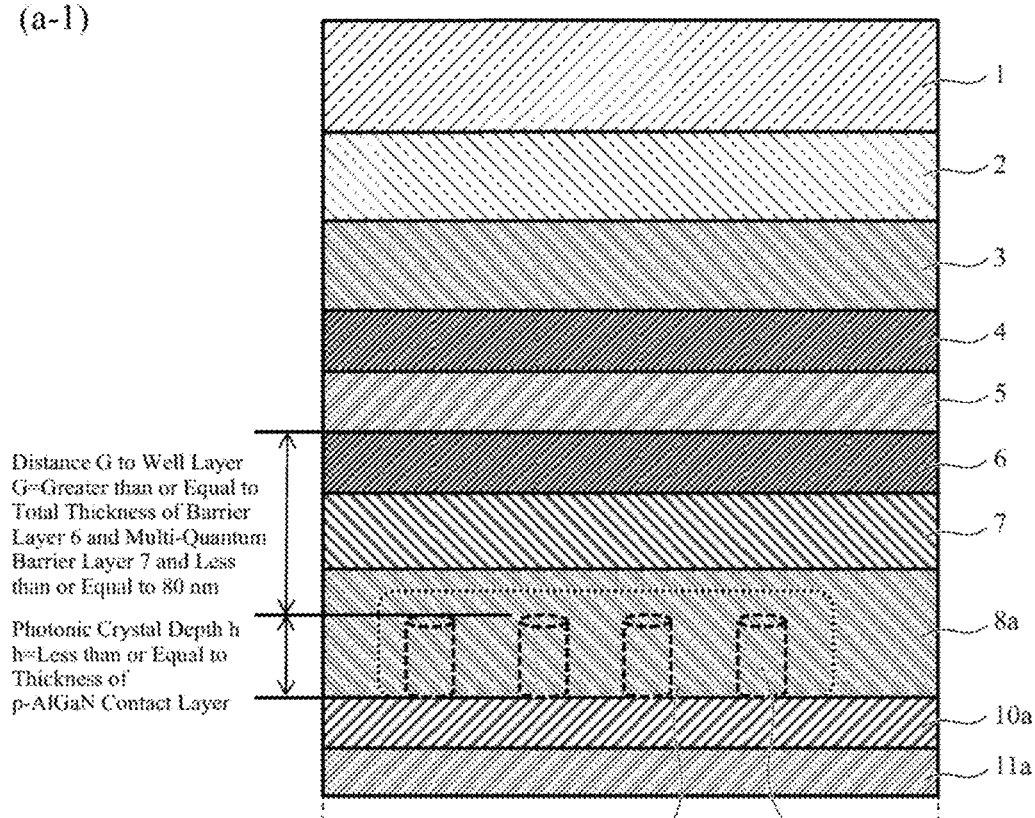

(a-1)

Distance G to Well Layer
G=Greater than or Equal to
Total Thickness of Barrier
Layer 6 and Multi-Quantum
Barrier Layer 7 and Less
than or Equal to 80 nm Photonic Crystal Depth h
h=Less than or Equal to
Thickness of
p-AlGaN Contact Layer (a-2)

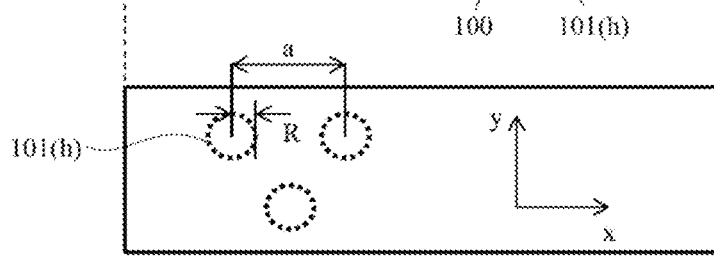

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8a. p-AlGaN Contact Layer (Thickness: 100 nm, n=2.583)
10a. Ultrathin Ni Layer (Thickness: 1 nm, n=1.681, k=2.067)
11a. Al Reflecting Electrode Layer (Thickness: 200 nm, n=0.241, k=3.357)
100. Photonic Crystal Periodic Structure
101(h). Voids (Columnar Structures or Holes)
Refractive Index: n
Extinction Coefficient: k Fig. 20
(a)
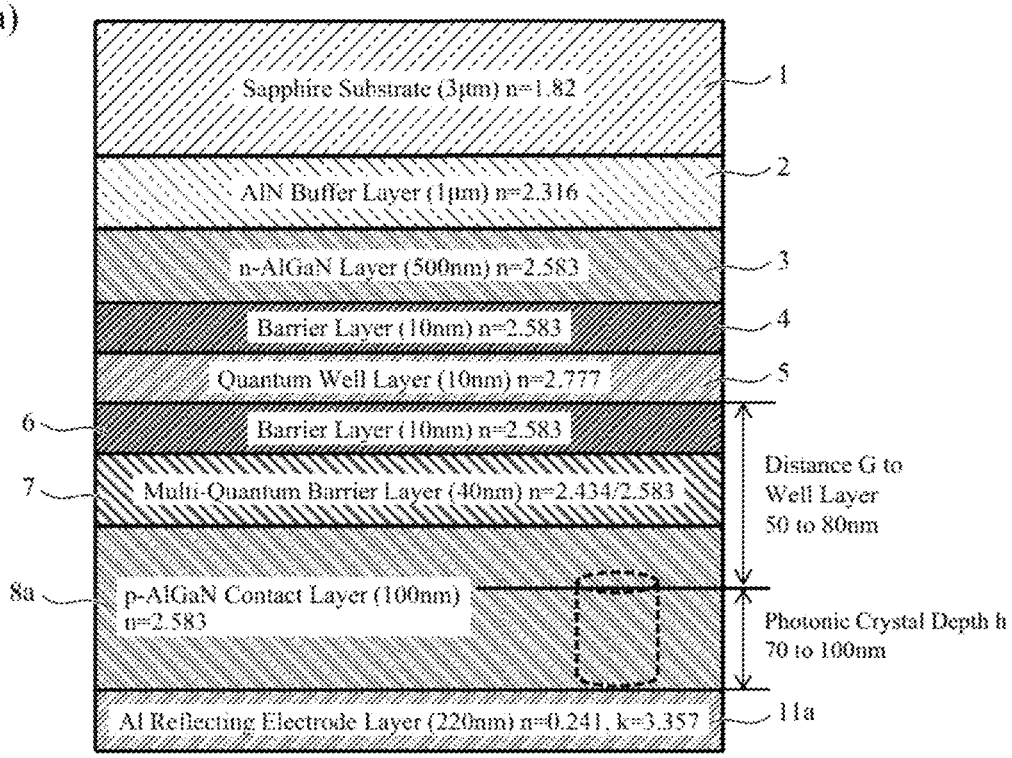
(b)
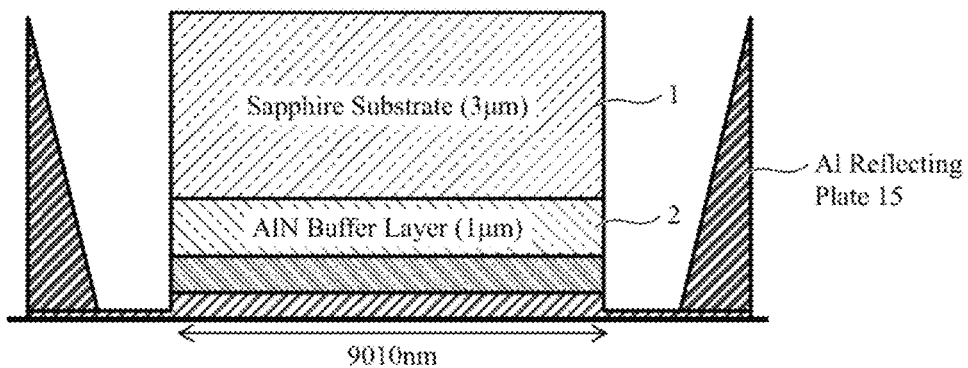

Fig. 22A (a-1)

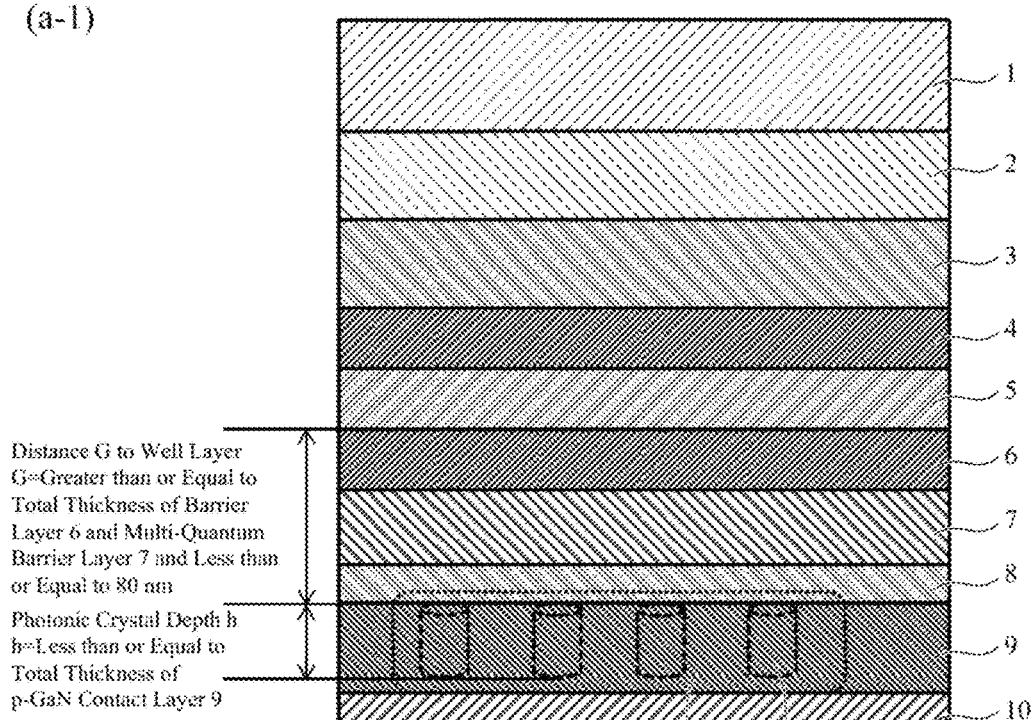

Distance G to Well Layer
G=Greater than or Equal to
Total Thickness of Barrier
Layer 6 and Multi-Quantum
Barrier Layer 7 and Less than
or Equal to 80 nm Photonic Crystal Depth h
h=Less than or Equal to
Total Thickness of
p-GaN Contact Layer 9

(a-2)

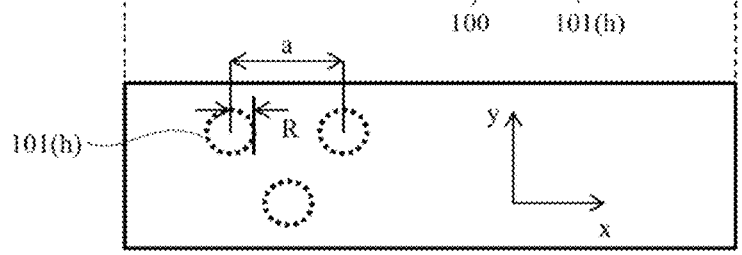

1. Sapphire Substrate (Thickness: 300 μm, n=1.82)
2. AlN Buffer Layer (Thickness: 4 μm, n=2.316)
3. n-AlGaN Layer (Thickness: 1.5 μm, n=2.583)
4. Barrier Layer (Thickness: 10 nm, n=2.583)
5. Quantum Well Layer (Thickness: 2 nm, n=2.777)
6. Barrier Layer (Thickness: 10 nm, n=2.583)
7. Multi-Quantum Barrier Layer (Thickness: 40 nm, n=2.434/2.583)
8. p-AlGaN Layer (Thickness: 30 nm, n=2.583)
9. p-GaN Contact Layer (Thickness: 200 nm, n=2.618, k=0.42)
10. Ni Layer (Thickness: 20 nm, n=1.681, k=2.067)
11. Au Reflecting Electrode Layer (Thickness: 200 nm, n=1.678, k=1.873)
100. Photonic Crystal Periodic Structure
101(h). Voids (Columnar Structures or Holes)
Refractive Index: n
Extinction Coefficient: k (b)

Fig. 23
(a)
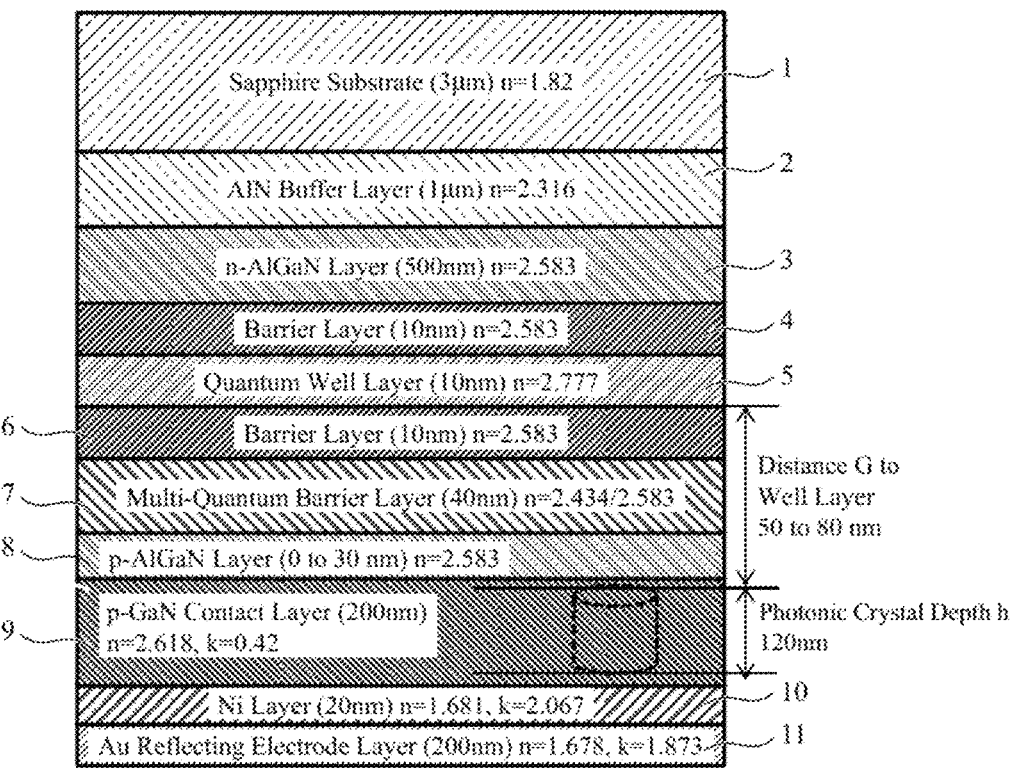
(b)
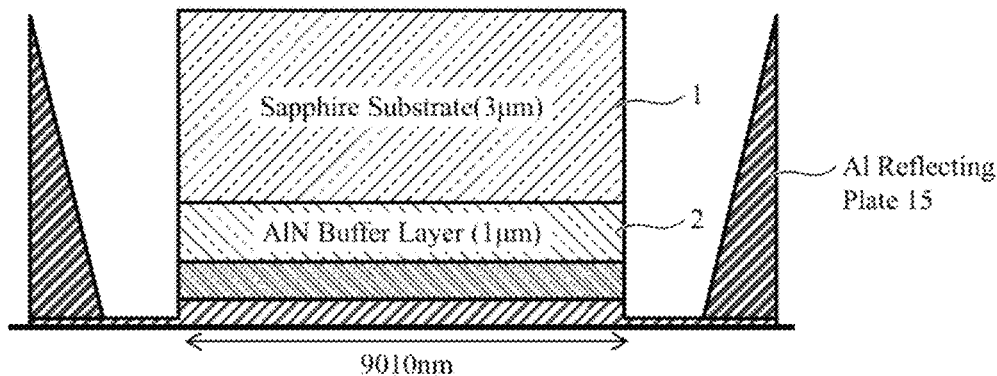

Fig. 24
(a)
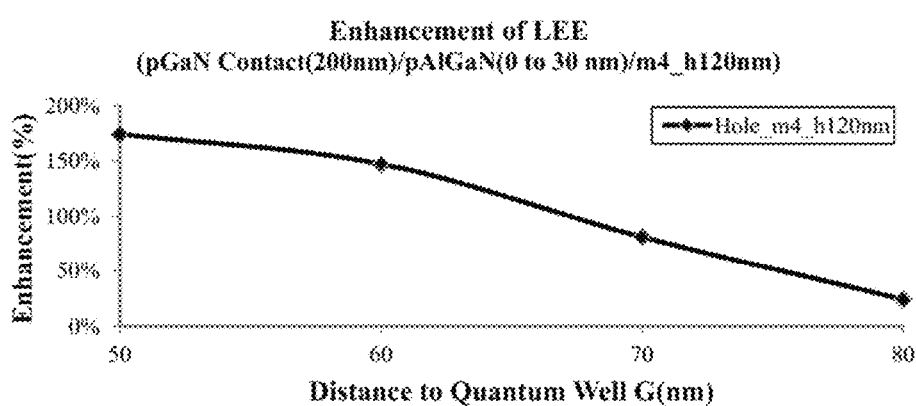
(b)
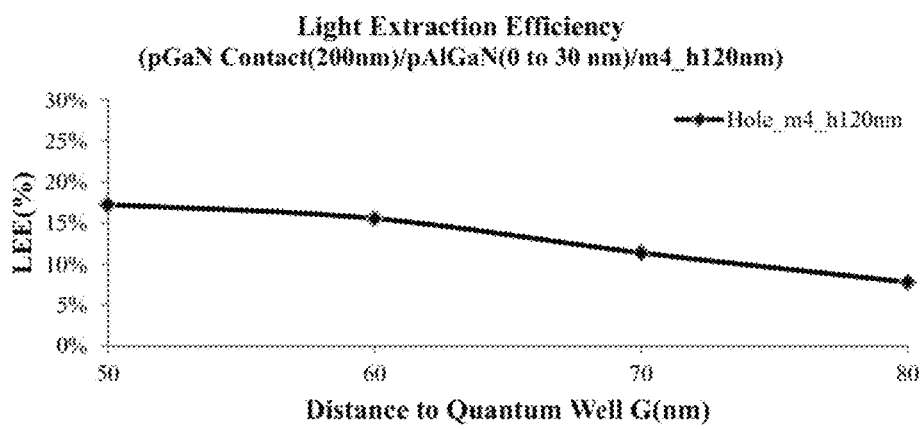
(c)
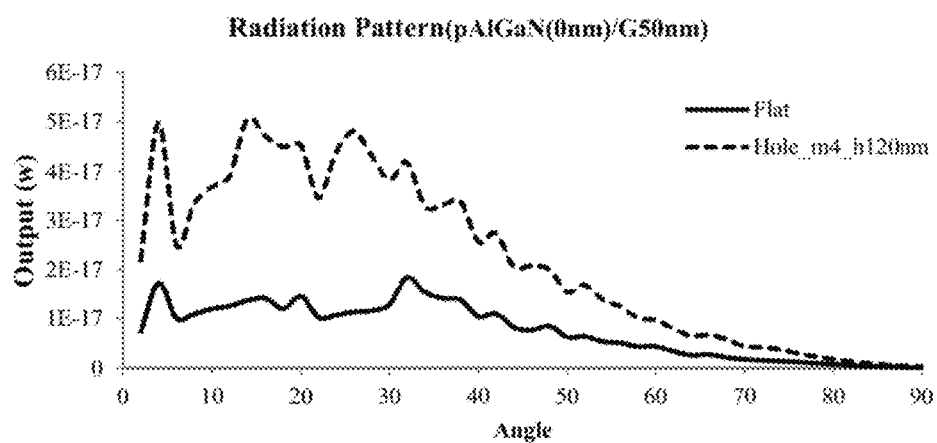

DEEP ULTRAVIOLET LED AND METHOD FOR MANUFACTURING THE SAME

TECHNICAL FIELD

The present invention relates to a technology of an AlGaN-based deep ultraviolet LED.

BACKGROUND ART

A deep ultraviolet LED with a light emission wavelength of less than or equal to 280 nm is attracting attention as an alternative technology for mercury germicidal lamps in a variety of fields of application, such as sterilization, water purification, air purification, and medical care. However, the wall-plug efficiency (WPE) of a LED is as low as several %, which is significantly lower than a wall-plug efficiency of 20% of a mercury lamp. This is mainly because greater than or equal to 50% of the emitted light is absorbed by a p-GaN contact layer, with the result that the light extraction efficiency (LEE) becomes as low as about 6%.

According to Patent Literature 1, photonic crystals are provided in the thickness direction in a region including an interface between a p-GaN contact layer and a p-AlGaN layer, so that incident light is reflected and the aforementioned absorption is suppressed.

CITATION LIST

Patent Literature

Patent Literature 1: JP 5757512 B

SUMMARY OF INVENTION

Technical Problem

However, the photonic crystals described in Patent Literature 1 cannot obtain an effective reflection effect unless the depths of the photonic crystals are about 300 nm that is equal to the period of the photonic crystals. To that end, the total thickness of the p-GaN contact layer and the p-AlGaN layer needs to be greater than or equal to 300 nm or the thickness of the p-AlGaN contact layer needs to be greater than or equal to 300 nm.

Nevertheless, if the p-AlGaN layer is formed to a thickness of 300 nm, problems would arise such that the layer becomes cloudy and sufficient transparency cannot be obtained, with the result that the LEE decreases.

It is an object of the present invention to provide a novel technique of increasing the light extraction efficiency of a deep ultraviolet LED.

Solution to Problem

According to a first aspect of the present invention, there is provided a deep ultraviolet LED with a design wavelength $\lambda$, including, sequentially arranged from a side opposite to a substrate, a reflecting electrode layer, a metal layer, a p-GaN contact layer, a p-AlGaN layer that is transparent to light with the wavelength $\lambda$, one of a multi-quantum barrier layer or an electron blocking layer, a barrier layer, and a quantum well layer. A thickness of the p-AlGaN layer is less than or equal to 100 nm; a reflecting photonic crystal periodic structure having a plurality of voids is provided in a region in a thickness direction including at least an interface between the p-GaN contact layer and the p-AlGaN layer such that the reflecting photonic crystal periodic structure does not extend beyond the p-AlGaN layer in a direction of the substrate; maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a total thickness of the p-AlGaN layer and the p-GaN contact layer; the reflecting photonic crystal periodic structure has a photonic band gap that opens for TE polarized components; a period a of the photonic crystal periodic structure satisfies a Bragg condition with respect to light with the design wavelength $\lambda$; an order m in a formula of the Bragg condition satisfies $1 \leq m \leq 5$; and provided that a radius of each void is R, R/a with which the photonic band gap becomes maximum is satisfied.

According to a second aspect of the present invention, there is provided a deep ultraviolet LED with a design wavelength $\lambda$, including, sequentially arranged from a side opposite to a substrate, a reflecting electrode layer, an ultrathin metal layer, a p-AlGaN contact layer that is transparent to light with the wavelength $\lambda$, a multi-quantum barrier layer (or an electron blocking layer), a barrier layer, and a quantum well layer. A thickness of the p-AlGaN contact layer is less than or equal to 100 nm; a reflecting photonic crystal periodic structure having a plurality of voids is provided within the p-AlGaN contact layer in a region in a thickness direction where the reflecting photonic crystal periodic structure does not extend beyond the p-AlGaN contact layer in a direction of the substrate; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and when a depth h of each void is less than or equal to the thickness of the p-AlGaN contact layer; the reflecting photonic crystal periodic structure has a photonic band gap that opens for TE polarized components; a period a of the photonic crystal periodic structure satisfies a Bragg condition with respect to light with the design wavelength $\lambda$; an order m in a formula of the Bragg condition satisfies $1 \leq m \leq 5$; and provided that a radius of each void is R, R/a with which the photonic band gap becomes maximum is satisfied.

According to a third aspect of the present invention, there is provided a deep ultraviolet LED with a design wavelength $\lambda$, including, sequentially arranged from a side opposite to a substrate, a reflecting electrode layer, a metal layer, a p-GaN contact layer, a p-AlGaN layer that is transparent to light with the wavelength $\lambda$, a multi-quantum barrier layer (or an electron blocking layer), a barrier layer, and a quantum well layer. A thickness of the p-AlGaN layer is less than or equal to 100 nm; a reflecting photonic crystal periodic structure having a plurality of voids is provided in a region including at least an interface between the p-GaN contact layer and the p-AlGaN layer such that the reflecting photonic crystal periodic structure does not extend beyond the p-AlGaN layer in a direction of the substrate, penetrates the p-GaN contact layer and the metal layer from a thickness direction, and reaches an inside of the reflecting electrode layer but does not extend beyond the reflecting electrode layer; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm; the reflecting photonic crystal periodic structure has a photonic band gap that opens for TE polarized components; a period a of the photonic crystal periodic structure satisfies a Bragg condition with respect to light with the design wavelength λ; an order m in a formula of the Bragg condition satisfies 1≤m≤5; and provided that a radius of each void is R, R/a with which the photonic band gap becomes maximum is satisfied.

According to a forth aspect of the present invention, there is provided a deep ultraviolet LED with a design wavelength λ, including, sequentially arranged from a side opposite to a substrate, a reflecting electrode layer, an ultrathin metal layer, a p-AlGaN contact layer that is transparent to light with the wavelength λ, a multi-quantum barrier layer (or an electron blocking layer), a barrier layer, and a quantum well layer. A thickness of the p-AlGaN contact layer is less than or equal to 100 nm; a reflecting photonic crystal periodic structure having a plurality of voids is provided at a position where the reflecting photonic crystal periodic structure does not extend beyond the p-AlGaN contact layer in a direction of the substrate, penetrates the ultrathin metal layer from a thickness direction, and reaches an inside of the reflecting electrode layer but does not extend beyond the reflecting electrode layer; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm; the reflecting photonic crystal periodic structure has a photonic band gap that opens for TE polarized components; a period a of the photonic crystal periodic structure satisfies a Bragg condition with respect to light with the design wavelength λ; an order m in a formula of the Bragg condition satisfies 1≤m≤5; and provided that a radius of each void is R, R/a with which the photonic band gap becomes maximum is satisfied.

According to a fifth aspect of the present invention, there is provided a deep ultraviolet LED with a design wavelength λ, including, sequentially arranged from a side opposite to a substrate, a reflecting electrode layer, a metal layer, a p-GaN contact layer, a p-AlGaN layer that is transparent to light with the wavelength λ, a multi-quantum barrier layer (or an electron blocking layer), a barrier layer, and a quantum well layer. A thickness of the p-AlGaN layer is less than or equal to 100 nm; a reflecting photonic crystal periodic structure having a plurality of voids is provided in a region including at least an interface between the p-GaN contact layer and the p-AlGaN layer such that the reflecting photonic crystal periodic structure does not extend beyond the p-AlGaN layer in a direction of the substrate and reaches an interface between the p-GaN contact layer and the metal layer from a thickness direction; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a total thickness of the p-AlGaN layer and the p-GaN contact layer; the reflecting photonic crystal periodic structure has a photonic band gap that opens for TE polarized components; a period a of the photonic crystal periodic structure satisfies a Bragg condition with respect to light with the design wavelength λ; an order m of a condition of the Bragg condition satisfies 1≤m≤5; and provided that a radius of each void is R, R/a with which the photonic band gap becomes maximum is satisfied.

According to a sixth aspect of the present invention, there is provided a deep ultraviolet LED with a design wavelength λ, including, sequentially arranged from a side opposite to a substrate, a reflecting electrode layer, an ultrathin metal layer, a p-AlGaN contact layer that is transparent to light with the wavelength λ, a multi-quantum barrier layer (or an electron blocking layer), a barrier layer, and a quantum well layer. A thickness of the p-AlGaN contact layer is less than or equal to 100 nm; a reflecting photonic crystal periodic structure having a plurality of voids is provided within the p-AlGaN contact layer such that the reflecting photonic crystal periodic structure does not extend beyond the p-AlGaN contact layer in a direction of the substrate, and reaches an interface between the p-AlGaN contact layer and the ultrathin metal layer from a thickness direction; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm; the reflecting photonic crystal periodic structure has a photonic band gap that opens for TE polarized components; a period a of the photonic crystal periodic structure satisfies a Bragg condition with respect to light with the design wavelength λ; an order m in a formula of the Bragg condition satisfies 1≤m≤5; and provided that a radius of each void is R, R/a with which the photonic band gap becomes maximum is satisfied.

According to a seventh aspect of the present invention, there is provided a deep ultraviolet LED with a design wavelength λ, including, sequentially arranged from a side opposite to a substrate, a reflecting electrode layer, a metal layer, a p-GaN contact layer, a p-AlGaN layer that is transparent to light with the wavelength λ, a multi-quantum barrier layer (or an electron blocking layer), a barrier layer, and a quantum well layer. A thickness of the p-AlGaN layer is less than or equal to 100 nm; a reflecting photonic crystal periodic structure having a plurality of voids is provided in a region within a thickness of the p-GaN contact layer in a direction of the substrate such that the reflecting photonic crystal periodic structure does not extend beyond an interface between the p-GaN contact layer and the p-AlGaN layer; maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to the thickness of the p-GaN contact layer; the reflecting photonic crystal periodic structure has a photonic band gap that opens for TE polarized components; a period a of the photonic crystal periodic structure satisfies a Bragg condition with respect to light with the design wavelength λ; an order m in a formula of the Bragg condition satisfies 1≤m≤5; and provided that a radius of each void is R, R/a with which the photonic band gap becomes maximum is satisfied.

According to an eighth aspect of the present invention, there is provided a method for producing the deep ultraviolet LED according to the aforementioned first aspect, including: preparing a stacked structure including, sequentially arranged from a side opposite to a substrate, a reflecting electrode layer, a metal layer, a p-GaN contact layer, and a p-AlGaN layer that is transparent to light with the wavelength λ; preparing a mold for forming a reflecting photonic crystal periodic structure, wherein: a thickness of the p-AlGaN layer is less than or equal to 100 nm, the reflecting photonic crystal periodic structure has a plurality of voids and is provided in a region in a thickness direction including at least an interface between the p-GaN contact layer and the p-AlGaN layer such that the reflecting photonic crystal periodic structure does not extend beyond the p-AlGaN layer in a direction of the substrate, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a total thickness of the p-AlGaN layer and the p-GaN contact layer; forming a resist layer on the stacked structure and imprinting a structure of the mold thereto; and sequentially etching the stacked structure using the resist layer as a mask, thereby forming the photonic crystal periodic structure.

According to a ninth aspect of the present invention, there is provided a method for producing the deep ultraviolet LED according to the aforementioned second aspect, including: preparing a stacked structure including, sequentially arranged from a side opposite to a substrate, a reflecting electrode layer, an ultrathin metal layer, and a p-AlGaN contact layer that is transparent to light with the wavelength $\lambda$; preparing a mold for forming a reflecting photonic crystal periodic structure, wherein: a thickness of the p-AlGaN contact layer is less than or equal to 100 nm, the reflecting photonic crystal periodic structure has a plurality of voids and is provided in a region in a thickness direction within the p-AlGaN contact layer such that the reflecting photonic crystal periodic structure does not extend beyond the p-AlGaN layer in a direction of the substrate, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a thickness of the p-AlGaN contact layer; forming a resist layer on the stacked structure and imprinting a structure of the mold thereto; and sequentially etching the stacked structure using the resist layer as a mask, thereby forming the photonic crystal periodic structure.

According to a tenth aspect of the present invention, there is provided a method for producing the deep ultraviolet LED according to the aforementioned third aspect, including: preparing a stacked structure including, sequentially arranged from a side opposite to a substrate, a reflecting electrode layer, a metal layer, a p-GaN contact layer, and a p-AlGaN layer that is transparent to light with the wavelength $\lambda$; preparing a mold for forming a reflecting photonic crystal periodic structure, wherein: a thickness of the p-AlGaN layer is less than or equal to 100 nm, the reflecting photonic crystal periodic structure has a plurality of voids and is provided in a region including at least an interface between the p-GaN contact layer and the p-AlGaN layer such that the reflecting photonic crystal periodic structure does not extend beyond the p-AlGaN layer in a direction of the substrate, penetrates the p-GaN contact layer and the metal layer from a thickness direction, and reaches an inside of the reflecting electrode layer, but does not extend beyond the reflecting electrode layer, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm; forming a resist layer on the stacked structure and imprinting a structure of the mold thereto; sequentially etching the stacked structure using the resist layer as a mask, thereby forming the photonic crystal periodic structure; and re-depositing a reflecting electrode layer.

According to an eleventh aspect of the present invention, there is provided a method for producing the deep ultraviolet LED according to the aforementioned forth aspect, including: preparing a stacked structure including, sequentially arranged from a side opposite to a substrate, a reflecting electrode layer, an ultrathin metal layer, and a p-AlGaN contact layer that is transparent to light with the wavelength $\lambda$; preparing a mold for forming a reflecting photonic crystal periodic structure, wherein: a thickness of the p-AlGaN contact layer is less than or equal to 100 nm, the reflecting photonic crystal periodic structure has a plurality of voids and is provided at a position where the reflecting photonic crystal periodic structure does not extend beyond the p-AlGaN contact layer in a direction of the substrate, penetrates the ultrathin metal layer from a thickness direction, and reaches an inside of the reflecting electrode layer but does not extend beyond the reflecting electrode layer, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm; forming a resist layer on the stacked structure and imprinting a structure of the mold thereto; sequentially etching the stacked structure using the resist layer as a mask, thereby forming the photonic crystal periodic structure; and re-depositing a reflecting electrode layer.

According to a twelfth aspect of the present invention, there is provided a method for producing the deep ultraviolet LED according to the aforementioned fifth aspect, including: preparing a stacked structure including, sequentially arranged from a side opposite to a substrate, a reflecting electrode layer, a metal layer, a p-GaN contact layer, and a p-AlGaN layer that is transparent to light with the wavelength $\lambda$; preparing a mold for forming a reflecting photonic crystal periodic structure, wherein: a thickness of the p-AlGaN layer is less than or equal to 100 nm, the reflecting photonic crystal periodic structure has a plurality of voids and is provided in a region including at least an interface between the p-GaN contact layer and the p-AlGaN layer such that the reflecting photonic crystal periodic structure does not extend beyond the p-AlGaN layer in a direction of the substrate and reaches an interface between the p-GaN contact layer and the metal layer from a thickness direction, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a total thickness of the p-AlGaN layer and the p-GaN contact layer; growing crystals in up to the p-GaN contact layer of the stacked structure, forming a resist layer thereon, and imprinting a structure of the mold thereto; sequentially etching the stacked structure using the resist layer as a mask, thereby forming the photonic crystal periodic structure; and sequentially depositing the metal layer and the reflecting electrode layer obliquely after forming the photonic crystal periodic structure.

According to a thirteenth aspect of the present invention, there is provided a method for producing the deep ultraviolet LED according to the aforementioned sixth aspect, including: preparing a stacked structure including, sequentially arranged from a side opposite to a substrate, a reflecting electrode layer, an ultrathin metal layer, and a p-AlGaN contact layer that is transparent to light with the wavelength λ; preparing a mold for forming a reflecting photonic crystal periodic structure, wherein: a thickness of the p-AlGaN contact layer is less than or equal to 100 nm, the reflecting photonic crystal periodic structure has a plurality of voids and is provided within the p-AlGaN contact layer such that the reflecting photonic crystal periodic structure does not extend beyond the p-AlGaN contact layer in a direction of the substrate, and reaches an interface between the p-AlGaN contact layer and the ultrathin metal layer from a thickness direction, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to a thickness of the p-AlGaN contact layer; growing crystals in up to the p-AlGaN contact layer of the stacked structure, forming a resist layer thereon, and imprinting a structure of the mold thereto; sequentially etching the stacked structure using the resist layer as a mask, thereby forming the photonic crystal periodic structure; and sequentially depositing the ultrathin metal layer and the reflecting electrode layer obliquely after forming the photonic crystal periodic structure.

According to a fourteenth aspect of the present invention, there is provided a method for producing the deep ultraviolet LED according to the aforementioned seventh aspect, including: preparing a stacked structure including, sequentially arranged from a side opposite to a substrate, a reflecting electrode layer, a metal layer, a p-GaN contact layer, and a p-AlGaN layer that is transparent to light with the wavelength λ; preparing a mold for forming a reflecting photonic crystal periodic structure, wherein: a thickness of the p-AlGaN layer is less than or equal to 100 nm, the reflecting photonic crystal periodic structure has a plurality of voids and is provided in a region within a thickness of the p-GaN contact layer in a direction of the substrate such that the reflecting photonic crystal periodic structure does not extend beyond an interface between the p-GaN contact layer and the p-AlGaN layer, and maximum light extraction efficiency is obtained when a distance from end faces of the voids in the direction of the substrate to the quantum well layer is greater than or equal to a total thickness of the barrier layer and the multi-quantum barrier layer (or the electron blocking layer) and less than or equal to 80 nm, and a depth h of each void is less than or equal to the thickness of the p-GaN contact layer; growing crystals in up to the p-GaN contact layer of the stacked structure, forming a resist layer thereon, and imprinting a structure of the mold thereto; and sequentially etching the stacked structure using the resist layer as a mask, thereby forming the photonic crystal periodic structure.

Advantageous Effects of Invention

According to the present invention, the LEE of a deep ultraviolet LED can be drastically improved by providing a photonic crystal periodic structure in a thin p-AlGaN layer.

BRIEF DESCRIPTION OF DRAWINGS

FIGS. 1A(a-1) and 1A(a-2) are a cross-sectional view and a plan view, respectively, illustrating an exemplary structure of a deep ultraviolet LED for which p-GaN contact layer photonic crystals in accordance with the first embodiment of the present invention are used.

FIG. 1C are views illustrated as a modified example of FIG. 1A.

FIG. 2 are charts illustrating exemplary photonic band structures for TM light (FIG. 2(a)) and TE light (FIG. 2(b)) determined using the plane wave expansion method when the photonic crystal periodic structure satisfies the Bragg scattering condition ($m\lambda/n_{eff}=2a$, where $n_{eff}$ is the equivalent refractive index, a is the period, and m is the order).

FIGS. 4A(a-1) and 4A(a-2) are a cross-sectional view and a plan view, respectively, illustrating an exemplary structure of a deep ultraviolet LED for which p-AlGaN contact layer photonic crystals in accordance with the second embodiment of the present invention are used.

FIG. 4C are views illustrated as a modified example of FIG. 4A.

FIG. 5 are views illustrating a computation model of the FDTD method when photonic crystals are used for a p-GaN contact layer.

FIG. 8A are views illustrating an electric field distribution: x components around a photonic crystal; specifically, FIG. 8A(a) illustrates a computation result regarding Ex when the layer is Flat, FIG. 8A(b) illustrates a computation result regarding Ex when a photonic crystal periodic structure is provided, and FIG. 8A(c) illustrates a computation result regarding Ex when a photonic crystal periodic structure is provided.

FIG. 8B are views illustrating an electric field distribution: y components around a photonic crystal corresponding to FIG. 8A.

FIG. 8C are views illustrating an electric field distribution: z components around a photonic crystal corresponding to FIG. 8A.

FIG. 8D are views illustrating total components of an electric field distribution in a horizon plane that perpendicularly intersects the intermediate point of a photonic crystal void in the depth direction.

FIG. 9 are views illustrating the results of analyzing the LEE rate of change using the FDTD.

FIG. 10 are views illustrating the results of analyzing the LEE through cross simulation based on the FDTD method and the ray-tracing method.

FIG. 11 are views illustrating an exemplary process of forming a photonic crystal periodic structure.

FIGS. 12A(a-1) and 12A(a-2) are a cross-sectional view and a plan view, respectively, illustrating an exemplary structure of a deep ultraviolet LED for which p-GaN contact layer photonic crystals in accordance with the fourth embodiment of the present invention are used.

FIG. 13 are views illustrating a computation model of the FDTD method when p-GaN photonic crystals are used.

FIGS. 16A(a-1) and 16A(a-2) are a cross-sectional view and a plan view, respectively, illustrating an exemplary structure of a deep ultraviolet LED for which p-GaN contact layer photonic crystals in accordance with the fifth embodiment of the present invention are used.

FIG. 17 are views illustrating a computation model of the FDTD method when p-GaN photonic crystals are used.

FIG. 18 illustrate the analysis results of (a) enhancement of the LEE, (b) light extraction efficiency, and (c) radiation patterns.

FIGS. 19A(a-1) and 19A(a-2) are a cross-sectional view and a plan view, respectively, illustrating an exemplary structure of a deep ultraviolet LED for which p-AlGaN contact layer photonic crystals in accordance with the sixth embodiment of the present invention are used.

FIG. 20 are views illustrating a computation model of the FDTD method when p-AlGaN photonic crystals are used.

FIGS. 22A(a-1) and 22A(a-2) are a cross-sectional view and a plan view, respectively, illustrating an exemplary structure of a deep ultraviolet LED for which p-GaN contact layer photonic crystals in accordance with the seventh embodiment of the present invention are used.

FIG. 23 are views illustrating a computation model of the FDTD method when p-GaN photonic crystals are used.

FIG. 24 illustrate the analysis results of (a) enhancement of the LEE, (b) light extraction efficiency, and (c) radiation patterns.

DESCRIPTION OF EMBODIMENTS

Hereinafter, a deep ultraviolet LED in accordance with an embodiment of the present invention will be described in detail with reference to the drawings.

First Embodiment

Figure 1B:
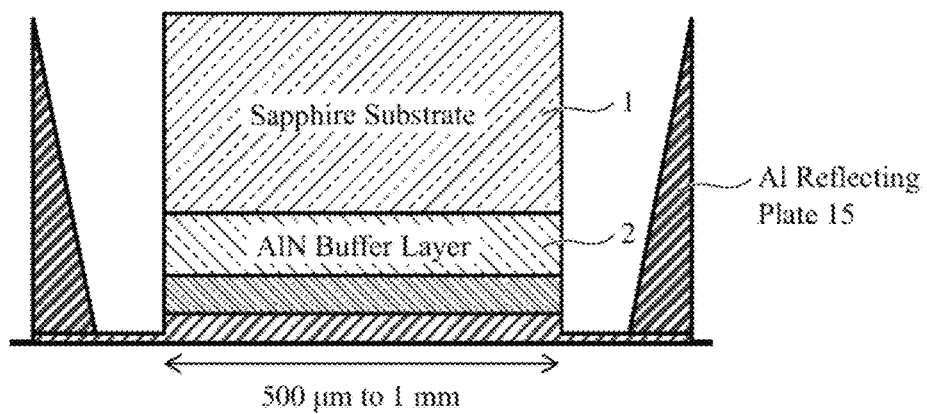
FIG. 1B(b) is a view illustrating an exemplary structure of a surface-mount package for the structure of a deep ultraviolet LED for which the p-GaN contact layer photonic crystals in accordance with the first embodiment of the present invention are used.

FIGS. 1A(a-1) and 1A(a-2) illustrate the structure (cross-sectional view and a plan view, respectively) of an AlGaN-based deep ultraviolet LED having a design wavelength λ of 280 nm, as a deep ultraviolet LED in accordance with the first embodiment of the present invention. FIG. 1B(b) illustrates a deep ultraviolet LED mounted in in a surface-mount package.

Specifically, the deep ultraviolet LED includes, sequentially from the top of the cross-sectional view in FIG. 1A(a-1), a sapphire substrate 1, an AlN buffer layer 2, an n-AlGaN layer 3, a barrier layer 4, a quantum well layer 5, a barrier layer 6, a multi-quantum barrier layer (MQB) 7, a p-AlGaN layer (transparent p-AlGaN layer) 8, a p-GaN contact layer 9, a Ni layer 10, and an Au reflecting electrode layer 11. The thickness of the p-AlGaN layer 8 is less than or equal to 100 nm, and a photonic crystal periodic structure 100 is provided in a region including the interface between the p-GaN contact layer 9 and the p-AlGaN layer 8 such that the photonic crystal periodic structure 100 does not extend beyond the p-AlGaN layer in the direction of the substrate. The photonic crystal periodic structure 100 is a reflecting photonic crystal periodic structure that is designed to reflect light with the wavelength λ by having voids (columnar structures or holes) 101(h) and thus having a photonic band gap. It should be noted that if the photonic crystal periodic structure is formed within only the p-GaN contact layer 9, light will be undesirably absorbed by the p-GaN contact layer. It should be also noted that the multi-quantum barrier layer (MQB) 7 may also be an electron blocking layer. This is also true of the following embodiments.

As illustrated as an xy plan view in FIG. 1A(a-2), the reflecting photonic crystal periodic structure 100 has hole structures in which the voids 101(h) each having a columnar shape or the like, having a lower refractive index than those of the p-AlGaN layer and p-GaN contact layer, such as the air, and having a circular cross-section with a radius R, are formed in a triangular lattice pattern with a period of a along the x-direction and the y-direction. The voids 101(h) are structures that do not extend beyond the interface between the p-AlGaN layer 8 and the multi-quantum barrier layer 7. In addition, the distance G from end faces of the voids 101(h) in the direction of the substrate to the quantum well layer 5 is greater than or equal to the total thickness of the barrier layer 6 and the multi-quantum barrier layer 7 and less than or equal to 80 nm. Further, the depth h of the reflecting photonic crystal periodic structure 100 is less than or equal to the total thickness of the p-AlGaN layer 8 and the p-GaN contact layer 9.

It should be noted that as a modified example of this embodiment seen from a perspective of using another method in the device production process, it is also possible to provide a structure in which the columnar structures 101(h) reach the inside of the Au reflecting electrode layer 11 by penetrating the Ni layer 10 but do not reach the interface between the Au reflecting electrode layer 11 and the air, as illustrated in FIGS. 1C(a-1), 1C(a-2), and 1D(b).

In the aforementioned structure, TE light and TM light of deep ultraviolet light with a wavelength λ emitted from the quantum well layer 5 are radiated in all directions and propagate through the medium while being elliptically polarized. The photonic crystal periodic structure 100 provided around the quantum well layer 5 is formed as two structures, which are the p-AlGaN layer 8 and the air, having different refractive indices on an end face. Provided that the ratio of the radius R of each void to the period a is R/a=0.4, the filling factor f of the photonic crystals is computed by the formula: $f=2\pi/3^{0.5} \times (R/a)^2 = 0.58$.

In addition, from the refractive index of the air: $n_1=1.0$, the refractive index of p-AlGaN: $n_2=2.583$, and f=0.58, the equivalent refractive index $n_{eff}$ is computed by the formula: $n_{eff}=(n_2^2+(n_1^2-n_2^2)\times f)^{0.5}=1.838$.

Then, provided that the light emission wavelength λ=280 nm, FIG. 2 are obtained by determining photonic band structures for TM light and TE light when the photonic crystal periodic structure satisfies the Bragg scattering condition ($m\lambda/n_{eff}=2a$, where $n_{eff}$ is the equivalent refractive index, a is the period, and m is the order), using the plane wave expansion method.

As illustrated in FIG. 2(a), a photonic band gap (PBG) for TM light was not observed, while as illustrated in FIG. 2(b), a large PBG for TE light was observed between a first photonic band (ω1TE) and a second photonic band (ω2TE).

It should be noted that R/a=0.4 is a value adopted from the principle that "the magnitude of R/a, the size of a PBG, and the rate of change of the light extraction efficiency are all proportional with one another" invented by the inventors and described in the international application PCT/JP2015/071453 (Earlier Technology 1).

In this embodiment, as the photonic crystals are located closer to the quantum well layer, it becomes unnecessary to set the depths of the photonic crystals to 300 nm even when the period is 300 nm as described in Earlier Technology 1 or the like, and a reflection effect that is greater than or equal to the reflection effect of the structure of Earlier Technology 1 or the like can be obtained even when the depths of the photonic crystals are as shallow as about 60 nm. Further, the range of the order m that can be taken is increased. It should be noted that the smaller the m, the smaller the period.

Figure 3:
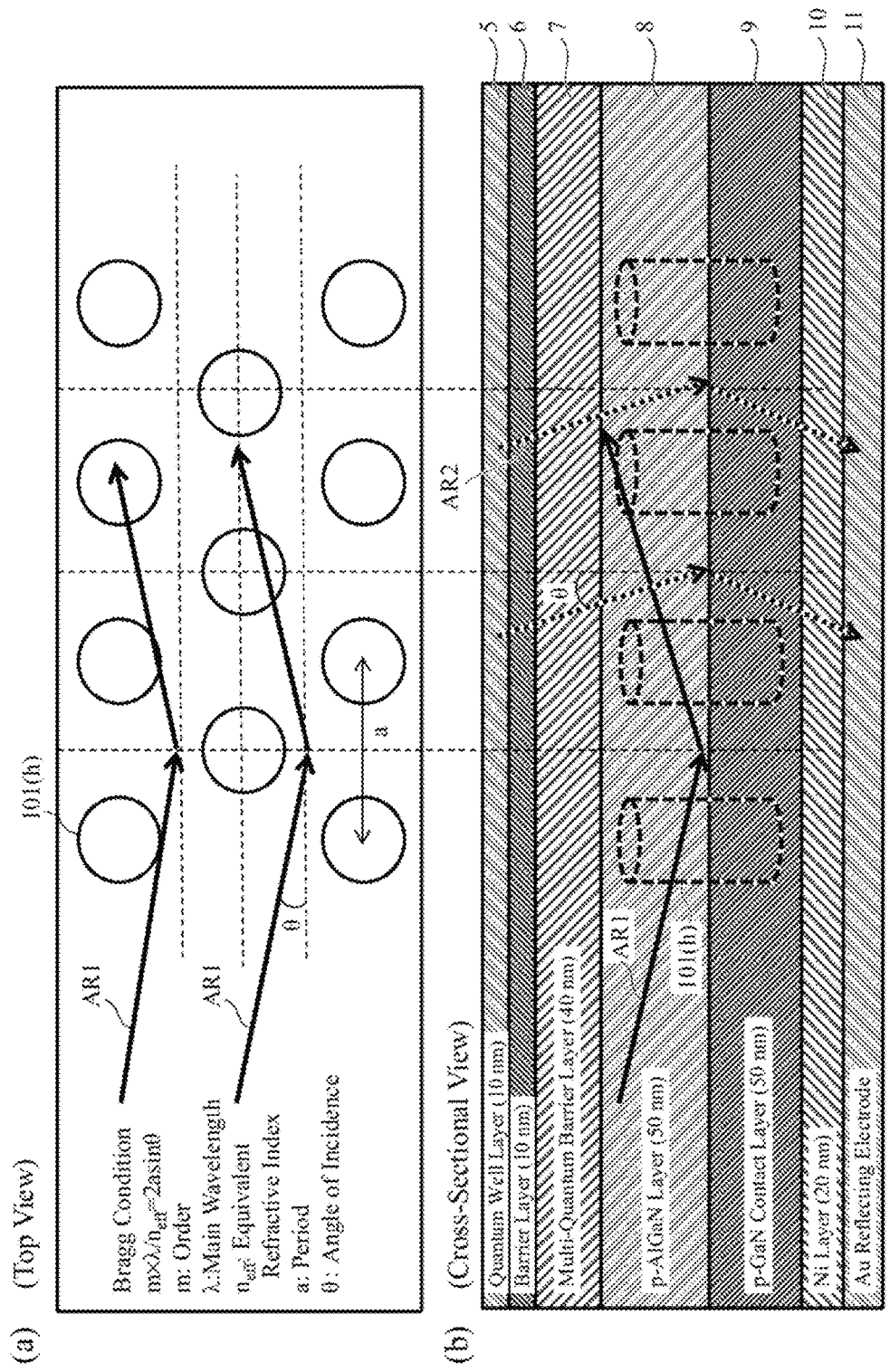
FIG. 3 are a top view (a) and a cross-sectional view (b) illustrating the reflection effect of photonic crystals.

FIG. 3 illustrate views of the reflection effect of the photonic crystals. As illustrated in FIGS. 3(a) and 3(b), TE light that has entered the photonic crystal periodic structure provided around the quantum well layer from all directions is scattered within the plane and is reflected in the direction of the substrate as indicated by AR1 because the light completely satisfies the Bragg scattering condition. Meanwhile, TM light will not be Bragg-scattered in the depth direction as indicated by a dashed line AR2 as there is no PBG for the TM light. Thus, the incident light will not be absorbed by the p-GaN contact layer or will not disappear.

Thus, according to the deep ultraviolet LED in this embodiment, it is possible to, by devising the position of the photonic crystal periodic structure provided in a target layer to be provided with the photonic crystal periodic structure, suppress the cloudiness of the crystal-forming layer without increasing the thickness thereof and increase the reflection effect, and thus obtain high light extraction efficiency.

Second Embodiment

Figure 4B:
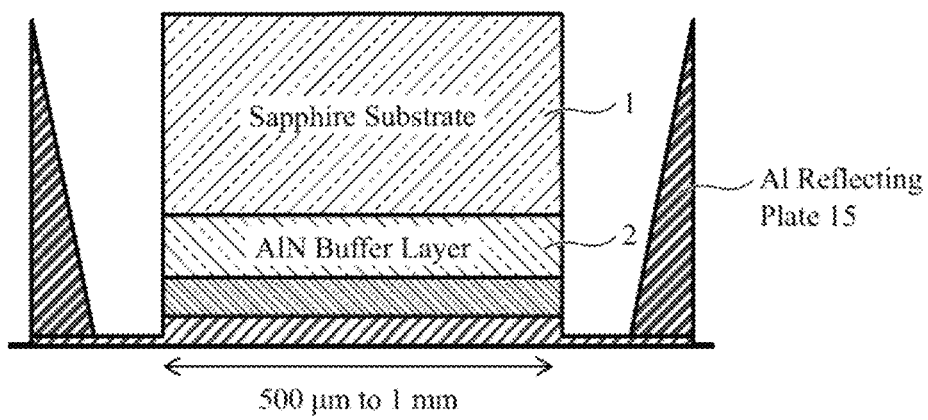
FIG. 4B(b) is a view illustrating an exemplary structure of a surface-mount package for the structure of a deep ultraviolet LED for which the p-AlGaN contact layer photonic crystals in accordance with the second embodiment of the present invention are used.
Figure 4D:
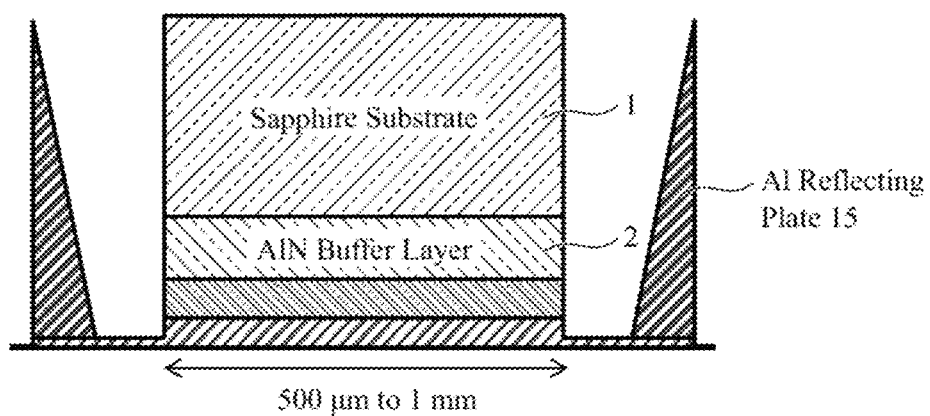
FIG. 4D is a view illustrated as a modified example of FIG. 4B.

Next, the structure of an AlGaN-based deep ultraviolet LED with a design wavelength λ of 280 nm is illustrated in FIGS. 4A(a-1) and 4A(a-2) as a deep ultraviolet LED in accordance with the second embodiment of the present invention. FIG. 4A(a-1) is a cross-sectional view and 4A(a-2) is a plan view. FIG. 4B(b) illustrates a deep ultraviolet LED mounted in a surface-mount package. Specifically, the deep ultraviolet LED includes, sequentially from the top of FIG. 4A(a-1), a sapphire substrate 1, an AlN buffer layer 2, an n-AlGaN layer 3, a barrier layer 4, a quantum well layer 5, a barrier layer 6, a multi-quantum barrier layer (MQB) 7, a p-AlGaN contact layer (transparent p-AlGaN contact layer) 8a, an ultrathin Ni layer 10a, and an Al reflecting electrode layer 11a.

The thickness of the p-AlGaN contact layer 8a is less than or equal to 100 nm, and the photonic crystal periodic structure 100 is provided within the p-AlGaN contact layer 8a in a region in which the photonic crystal periodic structure 100 does not extend beyond the p-AlGaN layer in the direction of the substrate. The photonic crystal periodic structure 100 is a reflecting photonic crystal periodic structure that is designed to reflect light with the wavelength λ by having voids (columnar structures or holes) 101(h) and thus having a photonic band gap.

FIGS. 4C(a-1), 4C(a-2), and 4D(b) illustrate modified examples of FIGS. 4A(a-1), 4A(a-2), and 4B(b). This structure is the one in which the depths of the voids of the photonic crystal periodic structure in the thickness direction are extended in the direction opposite to the substrate such that the voids reach the reflecting electrode layer by penetrating the ultrathin metal layer, but do not penetrate the reflecting electrode layer.

The other details of the photonic crystal periodic structure and observation of the views of TE light and TM light from the photonic band structure using the plane wave expansion method are the same as those in the first embodiment. In this case, light that has entered the photonic crystal periodic structure is scattered within the plane and is reflected in the direction of the substrate. Therefore, the light will not be absorbed by the Al reflecting electrode (with a reflectivity of 90%) or will not disappear.

Herein, an actual computation model was created to analyze the rate of change of the light extraction efficiency and the electric field distribution (Ex, Ey, Ez) components around the photonic crystals using the FDTD method and thus verify the reflection effect of the photonic crystal periodic structure.

Figure 6:
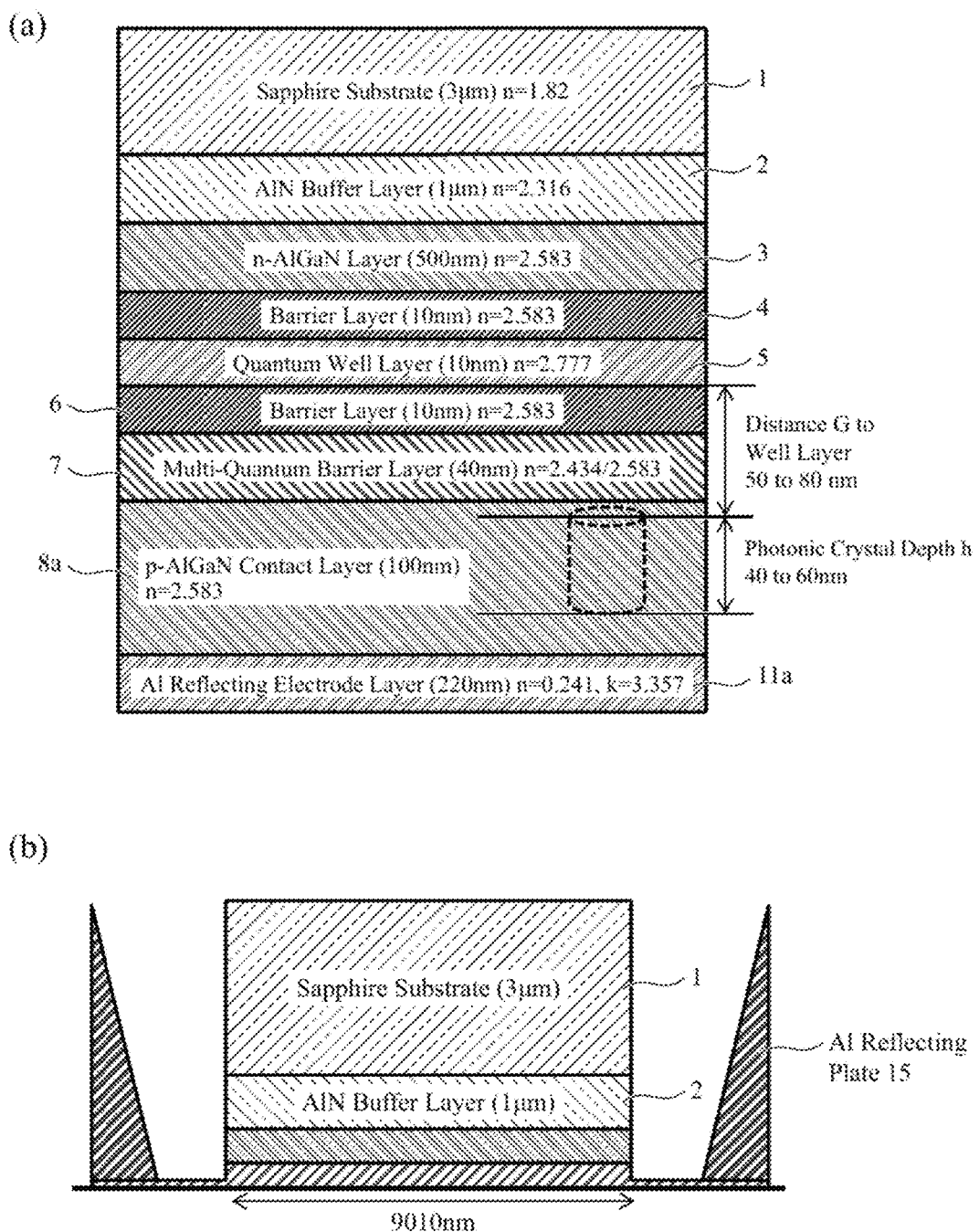
FIG. 6 are views illustrating a computation model of the FDTD method when photonic crystals are used for a p-AlGaN contact layer.

FIG. 5 illustrate a computation model (first embodiment) of the photonic crystals in the p-GaN contact layer, and FIG. 6 illustrate a computation model (second embodiment) of the p-AlGaN contact layer.

Figure 7A:
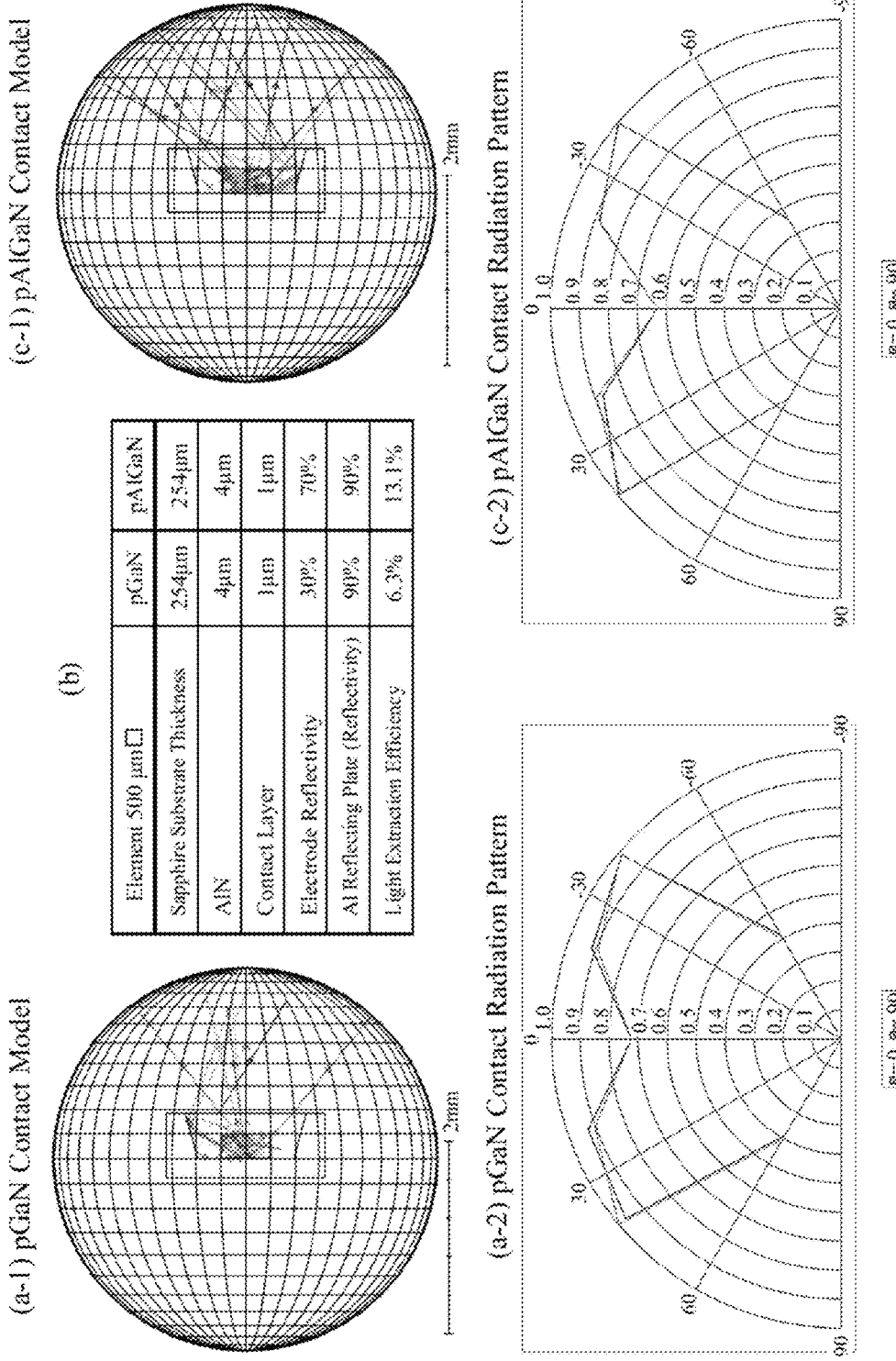
FIG. 7A are views illustrating a computation model of the ray-tracing method and analysis results.

In addition, in order to determine the light extraction efficiency (LEE), a computation model was created to perform analysis using the ray-tracing method (see FIG. 7A). FIG. 7A(a-1) illustrates a computation model of the pGaN contact. FIG. 7A(a-2) illustrates the analysis results and a radiation pattern. FIG. 7A(b) illustrates the details of the model and the light extraction efficiency that is analysis result. FIG. 7A(c-1) illustrates a computation model of the pAlGaN contact. FIG. 7A(c-2) illustrates the analysis results and a radiation pattern.

Figure 7B:
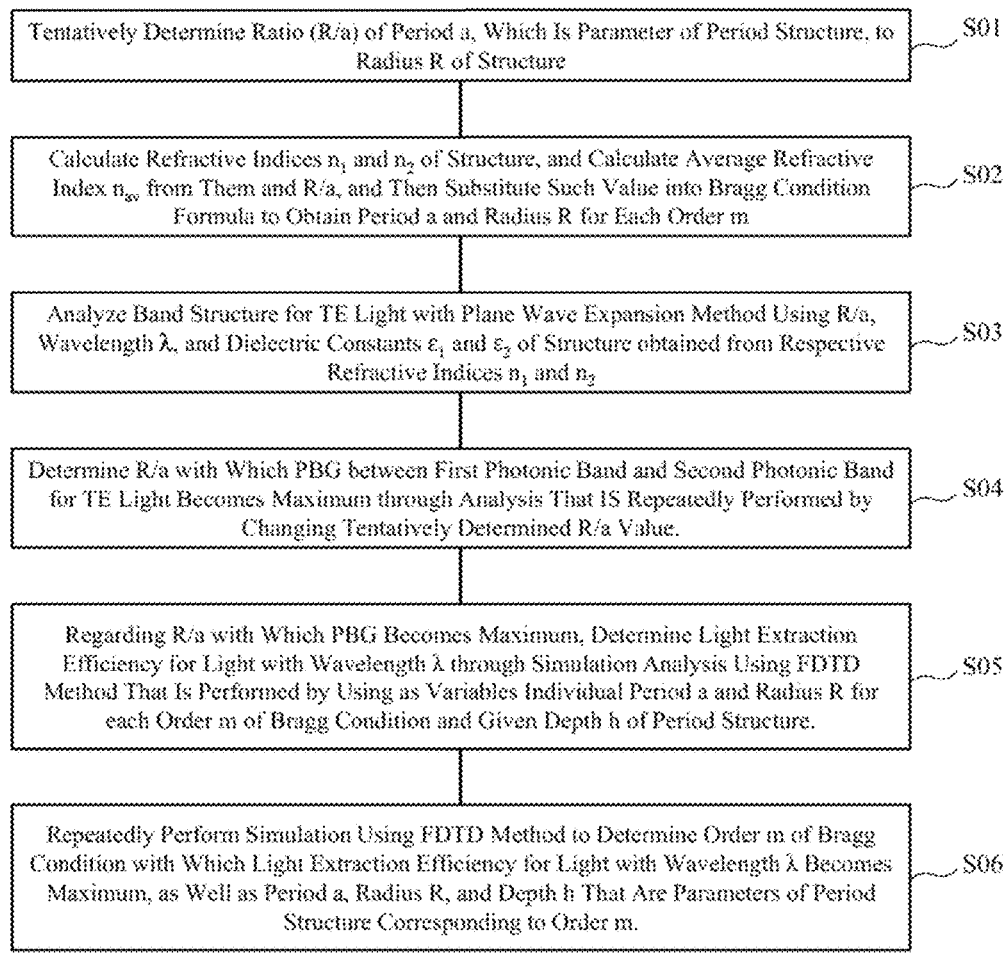
FIG. 7B is a detailed process flow chart for determining the relationship between the size of a photonic band gap and the reflection/transmission effect as well as the rate of change of the light extraction efficiency (LEE) of a deep ultraviolet LED through analysis using the FDTD method, and obtaining the diameter d, the period a, and the depth h of photonic crystals with which the LEE rate of change becomes maximum.

FIG. 7B is a detailed process flow chart for determining the relationship between the size of the photonic band gap and the reflection/transmission effect as well as the rate of change of the light extraction efficiency (LEE) of the deep ultraviolet LED through analysis using the FDTD method, and obtaining the diameter d, the period a, and the depth h of the photonic crystals with which the LEE rate of change becomes maximum.
(Step S01)
The ratio (R/a) of the period a and the radius R of the structure, which are parameters of the period structure, is tentatively determined.
(Step S02)
The refractive indices $n_1$ and $n_2$ of the structure are computed, and the average refractive index $n_{av}$ is computed from them and R/a, and then, the value is substituted into the formula of the Bragg condition to obtain the period a and the radius R for each order m.
(Step S03)
A photonic band structure for TE light is analyzed with the plane wave expansion method using R/a, the wavelength λ, and the dielectric constants $\varepsilon_1$ and $\varepsilon_2$ of the structure obtained from the respective refractive indices $n_1$ and $n_2$.
(Step S04)
R/a with which the PBG between the first photonic band and the second photonic band for TE light becomes maximum is determined through analysis that is repeatedly performed by changing the tentatively determined R/a value.
(Step S05)
Regarding R/a with which the PBG becomes maximum, the light extraction efficiency for light with the wavelength λ is determined through a simulation analysis using the FDTD method that is performed by using as variables the individual period a and radius R corresponding to each order m of the Bragg condition and the depth h of a given period structure.
(Step S06)
Simulation using the FDTD method is repeatedly performed so as to determine the order m of the Bragg condition with which the light extraction efficiency for light with the wavelength λ becomes maximum, as well as the period a, the radius R, and the depth h that are the parameters of the period structure corresponding to the order m.

Based on such finding of the inventors, the diameter and the period of the voids when the order of the Bragg scattering condition is m=4 and R/a=0.4 were determined first, and then, analysis was performed by changing the distance from end faces of the voids in the photonic crystal periodic structure to the quantum well layer between 50 to 80 nm and also changing the depths of the voids between 40 to 60 nm. Tables 1 and 2 show the analysis results.

TABLE 1

|  | Flat | | PhC Depth 40 nm | | | PhC Depth 50 nm | | | PhC Depth 60 nm | | |
| --- | --- | --- | --- | --- | --- | --- | --- | --- | --- | --- | --- |
|  | Power | LEE % | Power | Enhanced | LEE % | Power | Enhanced | LEE % | Power | Enhanced | LEE % |
| pAlGaN | | | | | | | | | | | |
| m4/G50 nm | 3.56E−16 | 13.1% | 5.84E−16 | 64% | 21.5% | 5.99E−16 | 68% | 22.1% | 6.16E−16 | 73% | 22.7% |
| m4/G60 nm | 3.56E−16 | 13.1% | 6.14E−16 | 73% | 22.6% | 6.42E−16 | 80% | 23.6% | 6.46E−16 | 82% | 23.8% |
| m4/G70 nm | 3.56E−16 | 13.1% | 5.53E−16 | 55% | 20.3% | 5.65E−16 | 59% | 20.8% | 4.92E−16 | 38% | 18.1% |
| m4/G80 nm | 3.56E−16 | 13.1% | 4.46E−16 | 25% | 16.4% | 4.17E−16 | 17% | 15.3% | 4.01E−16 | 13% | 14.8% |
| pGaN | | | | | | | | | | | |
| m4/G50 nm | 1.80E−16 | 6.3% | 4.33E−16 | 140% | 15.1% | 4.72E−16 | 162% | 16.5% | 4.93E−16 | 174% | 17.3% |
| m4/G60 nm | 1.80E−16 | 6.3% | 4.77E−16 | 165% | 16.7% | 5.02E−16 | 179% | 17.6% | 5.10E−16 | 183% | 17.8% |
| m4/G70 nm | 1.80E−16 | 6.3% | 4.14E−16 | 130% | 14.5% | 4.21E−16 | 134% | 14.7% | 4.16E−16 | 131% | 14.6% |
| m4/G80 nm | 1.80E−16 | 6.3% | 2.97E−16 | 65% | 10.4% | 2.93E−16 | 63% | 10.2% | 2.92E−16 | 62% | 10.2% |

| pGaN/pAlGaN | Flat | PhC Depth 40 nm | PhC Depth 50 nm | PhC Depth 60 nm |
| --- | --- | --- | --- | --- |
| m4/G50 nm | 51% | 74% | 79% | 80% |
| m4/G60 nm | 51% | 78% | 78% | 79% |
| m4/G70 nm | 51% | 75% | 75% | 84% |
| m4/G80 nm | 51% | 66% | 70% | 73% |

TABLE 2

| Photonic Crystal | | | Flat | | PhC Depth 60 nm | | |
| --- | --- | --- | --- | --- | --- | --- | --- |
|  | Diameter | Period | Power | LEE % | Power | Enhanced | LEE % |
| pAlGaN | | | | | | | |
| m1/G60 nm | 61 nm | 76 nm | 3.56E−16 | 13.1% | 5.64E−16 | 59% | 20.8% |
| m2/G60 nm | 122 nm | 152 nm | 3.56E−16 | 13.1% | 5.30E−16 | 49% | 19.5% |
| m3/G60 nm | 183 nm | 228 nm | 3.56E−16 | 13.1% | 6.20E−16 | 74% | 22.8% |
| m4/G60 nm | 244 nm | 305 nm | 3.56E−16 | 13.1% | 6.46E−16 | 82% | 23.8% |
| m5/G60 nm | 305 nm | 381 nm | 3.56E−16 | 13.1% | 5.86E−16 | 65% | 21.6% |
| pGaN | | | | | | | |
| m1/G60 nm | 61 nm | 76 nm | 1.80E−16 | 6.3% | 4.02E−16 | 123% | 14.1% |
| m2/G60 nm | 122 nm | 152 nm | 1.80E−16 | 6.3% | 3.97E−16 | 120% | 13.9% |
| m3/G60 nm | 183 nm | 228 nm | 1.80E−16 | 6.3% | 5.14E−16 | 185% | 18.0% |
| m4/G60 nm | 244 nm | 305 nm | 1.80E−16 | 6.3% | 5.10E−16 | 183% | 17.8% |
| m5/G60 nm | 305 nm | 381 nm | 1.80E−16 | 6.3% | 4.51E−16 | 150% | 15.8% |

As illustrated in Table 1, the analysis results of LEE when the pAlGaN layer is provided alone, when the pGaN layer is provided alone, and when both the pGaN and pAlGaN layers are provided are shown.

In addition, Table 2 illustrates the analysis results of LEE when the order m is changed.

It should be noted that the description below is based on the following definition: pAlGaN: photonic crystals in the p-AlGaN contact layer; pGaN: photonic crystals in the p-GaN contact layer; Flat: a structure without a photonic crystal periodic structure; PhC Depth 40 nm: the depths of the voids are 40 nm; Power: the output value of the FDTD method; Flat LEE %: the LEE value computed with the ray-tracing method; Enhanced: the LEE rate of change of the PhC output value relative to the output value of Flat; PhC LEE %: LEE % of photonic crystals that is Flat LEE %×(Enhanced+100%); m4: order m=4; G50 nm; the distance from end faces of the voids to the quantum well layer is 50 nm; Diameter: the diameters of the voids; and Period: the period of the photonic crystals.

In order to verify the reflection effect of the photonic crystal periodic structure, an electric field distribution around a photonic crystal when m=3 (diameter: 183 nm, period: 228 nm, and depth: 60 nm), which had the highest rate of change of the photonic crystals in the p-GaN contact layer, in particular, was observed. FIG. 8A are views illustrating electric field distribution Ex components; specifically, FIG. 8A(a) illustrates Flat, FIG. 8A(b) illustrates a photonic crystal periodic structure (the photonic crystal periodic structure is not illustrated), and FIG. 8A(c) illustrates a photonic crystal periodic structure (the photonic crystal periodic structure is illustrated). Each figure illustrates an electric field distribution in the cross-sectional structure. It should be noted that the photonic crystal periodic structure is omitted in FIGS. 8A(c) and 8A(b) for clarification purposes.

It should be noted that the right side in each figure shows a simple legend of an electric field to help understand the experimental results. In addition, the boundary between adjacent layers as well as the names of the layers are also shown.

In Flat, strong electric field components Ex are observed in a portion between the p-GaN contact layer and the Ni layer (FIG. 8A(a)), whereas, in a structure provided with a photonic crystal periodic structure, strong electric field components Ex are not observed in a portion between the p-GaN contact layer and the Ni layer (see a region A1 in FIG. 8A(b) and a region A2 in FIG. 8A(c)).

The results can verify that in the structure provided with a photonic crystal periodic structure, the reflection effect of the photonic crystals is obtained in the portion between the p-GaN contact layer and the Ni layer. Referring also to the Ey components in the electric field distribution of FIG. 8B and the Ez components in the electric field distribution of FIG. 8C, a phenomenon similar to that of the Ex components in FIG. 8A are observed (see regions A3 and A4).

Further, with regard to Etotal that is the total components of the electric field distributions Ex, Ey, and Ez, an electric field distribution in the horizontal plane that perpendicularly intersects the intermediate point of the photonic crystal void in the depth direction was observed (see FIG. 8D).

FIG. 8D(a) illustrates an electric field distribution Etotal of Flat, and FIG. 8D(b) illustrates an electric field distribution Etotal of the center portion of the photonic crystals. In the Flat of FIG. 8D(a), an electric field propagates outward through repetition of high and low levels (shown by the gray scale of the color).

In contrast, in the structure with photonic crystals in FIG. 8D(b), an electric field accumulates in a portion between the voids, and is displayed in strong color (in white in the drawing) in the center portion, in particular. This shows a view in which Bragg scattering is induced in that portion and standing waves are thus formed. Immediately after that, light is reflected in the direction of the substrate.

Thus, the analysis results clearly illustrate a physical phenomenon that "TE light that has entered the photonic crystal periodic structure provided around the quantum well layer from all directions is scattered within the plane and is reflected in the direction of the substrate because the light completely satisfies the Bragg scattering condition" as has been described with reference to FIG. 3.

FIG. 9 illustrate the results of analyzing the LEE rate of change using the FDTD method.

FIG. 9(a) illustrates the LEE rate of change of the photonic crystals in the p-AlGaN contact layer, and FIG. 9(b) illustrates the LEE rate of change of the photonic crystals in the p-GaN contact layer. As a characteristic phenomenon, at a distance of 60 nm from end faces of the voids to the quantum well layer, a maximum value is obtained at all depths. In addition, FIG. 9(c) illustrates radiation patterns of the photonic crystal periodic structure in the p-GaN contact layer when the distance to the quantum well layer is 60 nm and the depths of the voids are 60 nm, and Flat of the layer, and similarly, radiation patterns of the photonic crystal periodic structure in the p-AlGaN contact layer and Flat of the layer. When the photonic crystal periodic structure is provided, an output value in the front direction (at an angle of 0 to 10°) is particularly increased in comparison with that of Flat.

FIG. 10 illustrate the results of analyzing the light extraction efficiency (LEE) obtained through cross simulation based on the FDTD method and the ray-tracing method. FIG. 10(a) illustrates the light extraction efficiency of the photonic crystals provided in the p-GaN contact layer and the p-AlGaN contact layer when the distance to the quantum well layer is 60 nm. From the results, a proportional relationship between the depth h of the photonic crystal periodic structure (holes) and the LEE is observed. FIG. 10(b) illustrates the dependence of the LEE on the order m. It is seen that the LEE is the highest when the order m=3 or 4. The results coincide with the tendency described in an application already filed by the inventors, and thus, the validity of the simulation can be verified.

The aforementioned results can confirm that according to an embodiment of the present invention, as the photonic crystal periodic structure is located closer to the quantum well structure, the reflection effect of the photonic crystal periodic structure can be increased double in the case of the photonic crystal periodic structure provided in the p-AlGaN contact layer, and the light extraction efficiency of the photonic crystal periodic structure can be increased more than three times in the case of the photonic crystal periodic structure provided in the p-GaN contact layer.

Third Embodiment

A production method for forming a reflecting photonic crystal periodic structure of a deep ultraviolet LED in accordance with the third embodiment of the present invention will be described in detail. FIG. 11 are views illustrating an exemplary process of forming a photonic crystal periodic structure.

The nanoimprint lithography technique is used for forming photonic crystals. As the surface of the p-GaN contact layer 209 has a warp of greater than or equal to 100 μm in the projecting direction, a resin mold 200 is used for the mold. In addition, in order to perform dry etching in a direction close to vertical and accurately retain the diameters of holes, bi-layer resist is used.

Specifically, regarding a wafer having a deep ultraviolet LED stacked structure that has a stack of up to the p-GaN contact layer 209, lower-layer resist 211 is formed on the surface of the p-GaN contact layer 209 through spin coating. Next, Si-containing upper-layer resist 210 is formed thereon through spin coating to form bi-layer resist (see FIG. 11(a)).

Figure 1D:
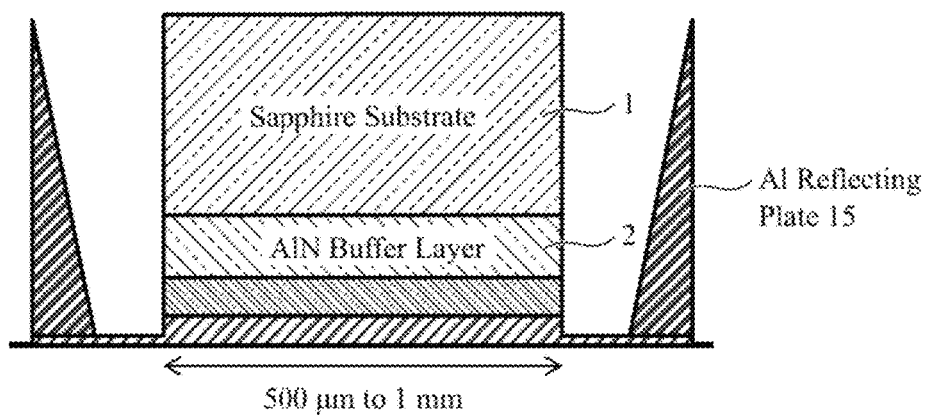
FIG. 1D is a view illustrated as a modified example of FIG. 1B.

The resin mold 200 having an inverted pattern of a predetermined photonic crystal periodic structure is pressed against the upper-layer resist, and is UV curing is performed to imprint a photonic crystal pattern 212 to the upper-layer resist 210 (see FIG. 11(b)). Next, the upper-layer resist 210 is etched with oxygen plasma to form a mask 213. See FIG. 11(c). Then, the mask 213 is etched with ICP plasma up to a position where the distance from an end face of the photonic crystal pattern (holes) 212 to the quantum well layer 205 becomes greater than or equal to the total thickness of the barrier layer 206 and the multi-quantum barrier layer 207 and less than or equal to 80 nm, which is also a position where the holes do not extend beyond the p-AlGaN layer 208, so that the depths of the holes are less than or equal to the total thickness of the p-AlGaN layer 208 and the p-GaN contact layer 209. See FIG. 1(d). Finally, the remaining lower-layer resist 211 is washed to obtain a clean surface.

It should be noted that after the photonic crystal pattern is formed, crystal regrowth of GaN or AlGaN is performed, and then, a metal layer and a reflecting electrode layer are formed thereon, so that a structure illustrated in FIG. 1A, 4A, 12A, or 22A is formed. Alternatively, after the layers of up to the metal layer and the reflecting electrode layer are formed, a photonic crystal pattern is formed, and then, a reflecting electrode layer of Au, Al, or the like is redeposited thereon so that a structure illustrated in FIG. 1C or 4C is formed. As a further alternative, a photonic crystal pattern is formed after a p-GaN contact layer or a p-AlGaN contact layer is formed, and then, a metal layer and a reflecting electrode layer are formed thereon using oblique deposition, so that a structure illustrated in FIG. 16A or 19A is formed.

According to oblique deposition, a metal layer and a reflecting electrode layer can be stacked on the surface of the p-GaN contact layer or the p-AlGaN contact layer without the metal layer and the reflecting electrode layer formed in the holes of the photonic crystal pattern.

Fourth Embodiment

Figure 12B:
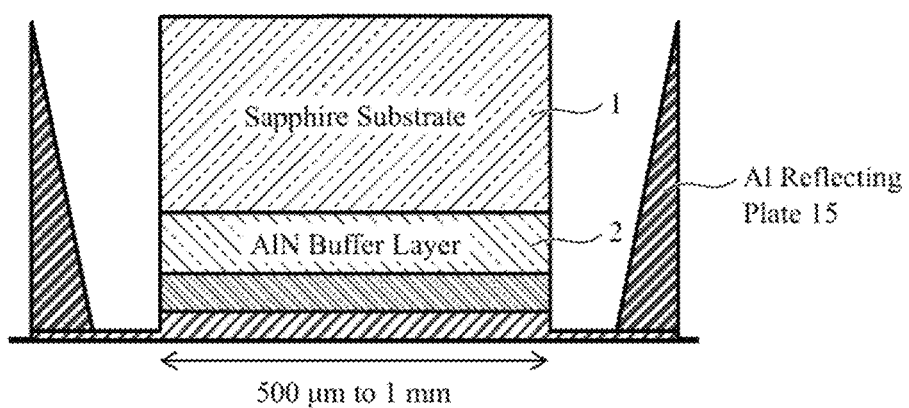
FIG. 12B(b) is a view illustrating an exemplary structure of a surface-mount package for the structure of a deep ultraviolet LED for which p-GaN contact layer photonic crystals in accordance with the fourth embodiment of the present invention are used.

Next, as a deep ultraviolet LED in accordance with the fourth embodiment of the present invention, a structure of an AlGaN-based deep ultraviolet LED with a design wavelength λ of 280 nm is represented in FIGS. 12A(a-1) and 12A(a-2). FIG. 12A(a-1) is a cross-sectional view and FIG. 12A(a-2) is a plan view. FIG. 12B(b) is a deep ultraviolet LED mounted in a surface-mount package.

This LED has the same structure as the stacked thin-film structure of the deep ultraviolet LED in the first embodiment, but is different in that the thickness of the p-GaN contact layer 9 is 200 nm. This is in order to obtain a planar surface by stacking a thick p-GaN contact layer in the device production process.

Then, the photonic crystal periodic structure 100 is provided in a region including the interface between the p-GaN contact layer 9 and the p-AlGaN layer 8 such that the photonic crystal periodic structure 100 does not extend beyond the p-AlGaN layer in the direction of the substrate. The photonic crystal periodic structure 100 is a reflecting photonic crystal periodic structure that is designed to reflect light with the wavelength λ by having voids (columnar structures or holes) 101(h) and thus having a photonic band gap.

In addition, the voids 101(h) are structures that do not extend beyond the interface between the p-AlGaN layer 8 and the multi-quantum barrier layer 7. In addition, the distance G from end faces of the voids 101(h) in the direction of the substrate to the quantum well layer 5 is greater than or equal to the total thickness of the barrier layer 6 and the multi-quantum barrier layer 7 and less than or equal to 80 nm. Further, the depth h of the reflecting photonic crystal periodic structure 100 is less than or equal to the total thickness of the p-AlGaN layer 8 and the p-GaN contact layer 9.

A computation model that reflects the aforementioned structure was created to compute the rate of change of the light extraction efficiency (Enhancement of LEE) and the light extraction efficiency (LEE) using both the FDTD method and the ray-tracing method. FIG. 13 illustrates a photonic crystal computation model of the p-GaN contact layer. In addition, the analysis results are shown in Table 3, FIG. 14(a): Enhancement of LEE, FIG. 14(b): light extraction efficiency, and FIG. 14(c): radiation patterns.

TABLE 3

| pGaN | Flat | | PhC Depth 120 nm | | | PhC Depth 140 nm | | | PhC Depth 160 nm | | |
| --- | --- | --- | --- | --- | --- | --- | --- | --- | --- | --- | --- |
| | Power | LEE % | Power | Enhanced | LEE % | Power | Enhanced | LEE % | Power | Enhanced | LEE % |
| m4/G50 nm | 1.84E−16 | 6.3% | 5.09E−16 | 176% | 17.4% | 4.88E−16 | 164% | 16.7% | 4.73E−16 | 156% | 16.1% |
| m4/G60 nm | 1.84E−16 | 6.3% | 4.01E−16 | 118% | 13.7% | 3.89E−16 | 111% | 13.3% | 3.85E−16 | 109% | 13.2% |
| m4/G70 nm | 1.84E−16 | 6.3% | 2.92E−16 | 58% | 10.0% | 2.89E−16 | 57% | 9.9% | 2.91E−16 | 58% | 9.9% |
| m4/G80 nm | 1.84E−16 | 6.3% | 2.70E−16 | 47% | 9.2% | 2.70E−16 | 46% | 9.2% | 2.65E−16 | 44% | 9.0% |

Figure 14:
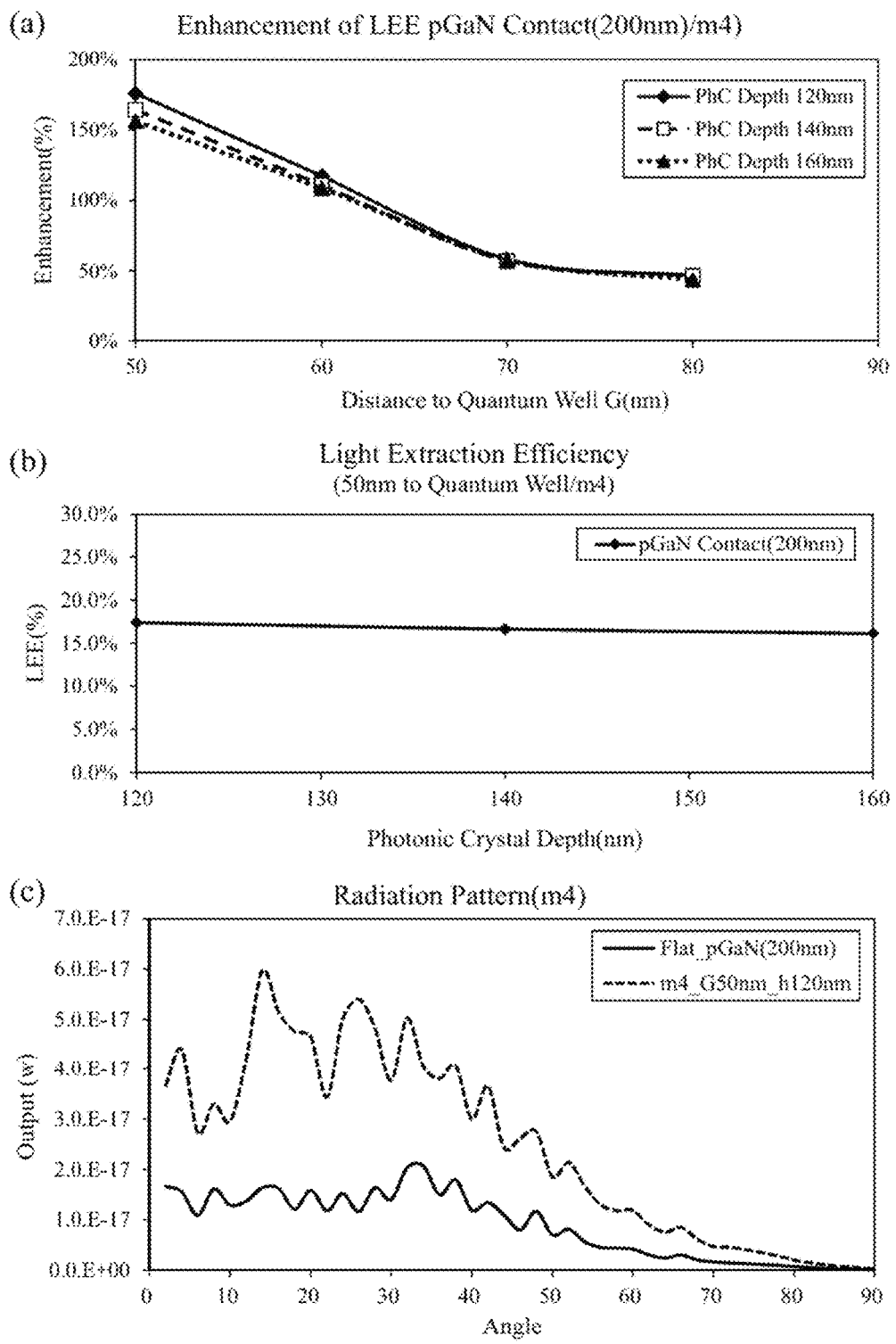
FIG. 14 illustrate the analysis results of (a) enhancement of the LEE, (b) light extraction efficiency, and (c) radiation patterns.

Regarding the rate of change of the light extraction efficiency in FIG. 14(a), a maximum value, which is greater than or equal to 2.5 times that of Flat, is obtained at all depths in the range of a distance of 50 nm from end faces of the voids to the quantum well layer. In addition, regarding the radiation pattern in FIG. 14(c), a structure provided with a photonic crystal periodic structure has an increased output value in the front direction (at an angle of 0 to 10°) relative to that of Flat. Meanwhile, regarding the light extraction efficiency obtained through cross simulation based on the FDTD method and the ray-tracing method in FIG. 14(b), the efficiency is slightly decreased as the depths of the photonic crystals are greater. Herein, electric field intensity distributions in cross-sections of photonic crystals with depths of 120 nm, 140 nm, and 160 nm were compared.

Figure 15A:
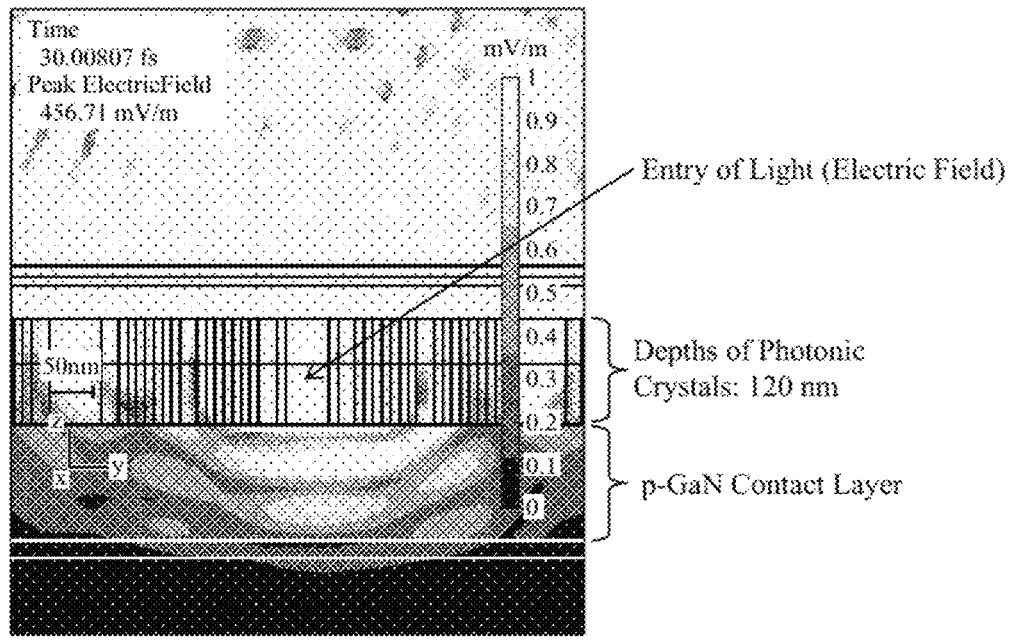
FIG. 15A illustrates an electric field intensity distribution in a cross-section of photonic crystals at a depth of 120 nm.
Figure 15B:
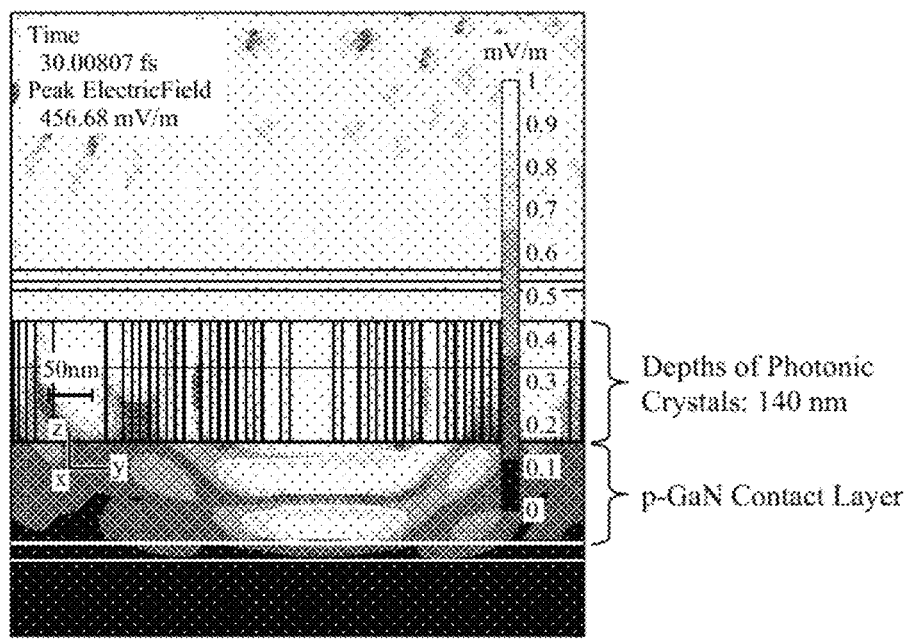
FIG. 15B illustrates an electric field intensity distribution in a cross-section of photonic crystals at a depth of 140 nm.
Figure 15C:
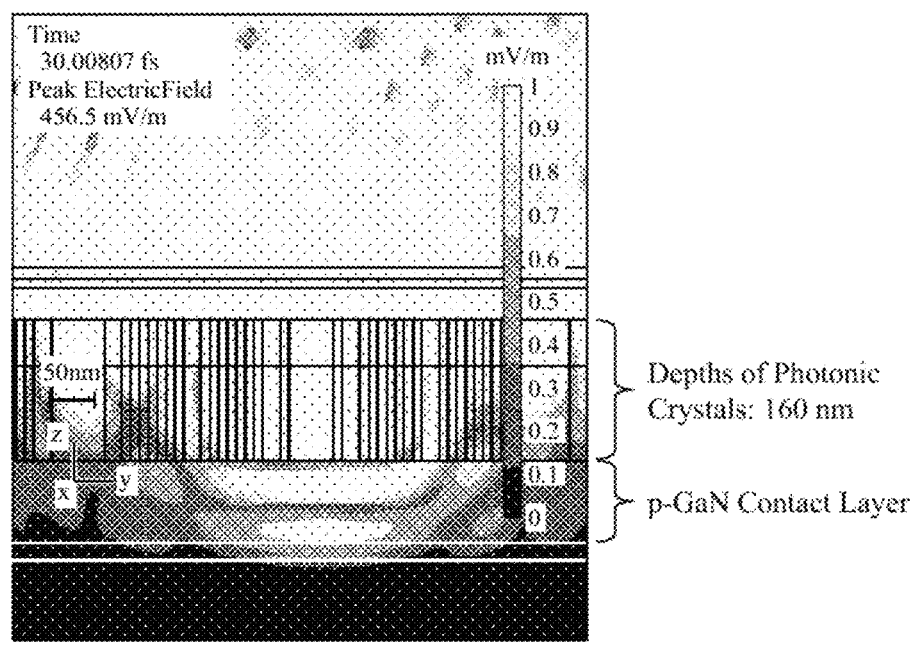
FIG. 15C illustrates an electric field intensity distribution in a cross-section of photonic crystals at a depth of 160 nm.

FIG. 15A illustrates an electric field intensity distribution in a cross-section of the photonic crystals with a depth of 120 nm. FIG. 15B illustrates an electric field intensity distribution in a cross-section of the photonic crystals with a depth of 140 nm. FIG. 15C illustrates an electric field intensity distribution in a cross-section of the photonic crystals with a depth of 160 nm. From FIGS. 15A to 15C (electric field intensity distributions), it is seen that light (electric field) that has entered the photonic crystals with all depths reaches the deepest portions of the photonic crystals. This is considered to be due to the reason that as the photonic crystals have greater depths, light (electric field) enters the p-GaN contact layer, and the light is absorbed therein and thus disappears.

photonic crystal periodic structure 100 is less than or equal to the total thickness of the p-AlGaN layer 8 and the p-GaN contact layer 9.

A computation model that reflects the aforementioned structure was created to compute the rate of change of the light extraction efficiency (Enhancement of LEE) and the light extraction efficiency (LEE) using both the FDTD method and the ray-tracing method. FIG. 17 illustrate a photonic crystal computation model of the p-GaN contact layer. In addition, the analysis results are shown in Table 4, FIG. 18(a): Enhancement of LEE, FIG. 18(b): light extraction efficiency, and FIG. 18(c): radiation patterns.

TABLE 4

| RP | Flat | | m4_G50 nm_h200 nm | | | m4_G60 nm_h190 nm | | |
|---|---|---|---|---|---|---|---|---|
| | Power | LEE % | Power | Enhanced | LEE % | Power | Enhanced | LEE % |
| pGaN Contact | 1.84E−16 | 6.3% | 4.48E−16 | 145% | 15.4% | 4.56E−16 | 150% | 15.7% |

| RP | m4_G70 nm_h180 nm | | | m4_G80 nm_h170 nm | | |
|---|---|---|---|---|---|---|
| | Power | Enhanced | LEE % | Power | Enhanced | LEE % |
| pGaN Contact | 3.76E−16 | 106% | 13.0% | 2.74E−16 | 50% | 9.5% |

Thus, when photonic crystals are formed in the p-GaN contact layer, the thickness of the p-GaN contact layer is preferably thinner so that the photonic crystals can have small depths.

Fifth Embodiment

Figure 16B:
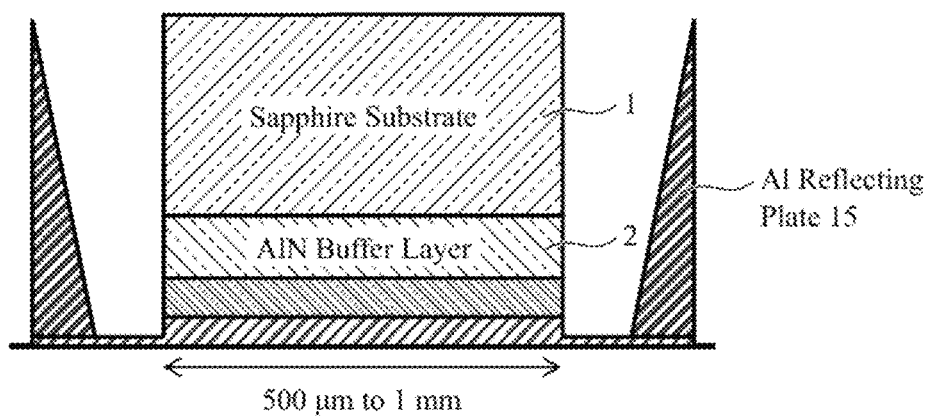
FIG. 16B(b) is a view illustrating an exemplary structure of a surface-mount package for the structure of a deep ultraviolet LED for which p-GaN contact layer photonic crystals in accordance with the fifth embodiment of the present invention are used.

Next, FIGS. 16A(a-1) and 16A(a-2) illustrate the structure of an AlGaN-based deep ultraviolet LED with a design wavelength λ of 280 nm as a deep ultraviolet LED in accordance with the fifth embodiment of the present invention. FIG. 16A(a-1) is a cross-sectional view and FIG. 16A(a-2) is a plan view. FIG. 16B(b) illustrates a deep ultraviolet LED mounted in a surface-mount package.

This LED has the same structure as the stacked thin-film structure of the deep ultraviolet LED in the fourth embodiment, but is different in that the thickness of the p-GaN contact layer 9 is 150 nm. This is a modified example seen from a perspective of using another method in the device production process.

Then, the photonic crystal periodic structure 100 is provided in a region including the interface between the p-GaN contact layer 9 and the p-AlGaN layer 8 such that the photonic crystal periodic structure 100 does not extend beyond the p-AlGaN layer in the direction of the substrate. The photonic crystal periodic structure 100 is a reflecting photonic crystal periodic structure that is designed to reflect light with the wavelength λ by having voids (columnar structures or holes) 101(h) and thus having a photonic band gap.

The voids 101(h) have structures in which the voids do not extend beyond the interface between the p-AlGaN layer 8 and the multi-quantum barrier layer 7 but reach the interface between the p-GaN contact layer 9 and the Ni layer 10. In addition, the distance G from end faces of the voids 101(h) in the direction of the substrate to the quantum well layer 5 is greater than or equal to the total thickness of the barrier layer 6 and the multi-quantum barrier layer 7 and less than or equal to 80 nm. Further, the depth h of the reflecting Regarding the rate of change of the light extraction efficiency in FIG. 18(a), a maximum value, which is greater than or equal to 2.5 times that of Flat, is obtained at a distance of 60 nm from the quantum well layer 5. Meanwhile, regarding the light extraction efficiency in FIG. 18(b), a maximum value of 15.7% is obtained. Further, regarding the radiation patterns, an output on the axis (0 to 10°) is increased relative to that of Flat.

Sixth Embodiment

Figure 19B:
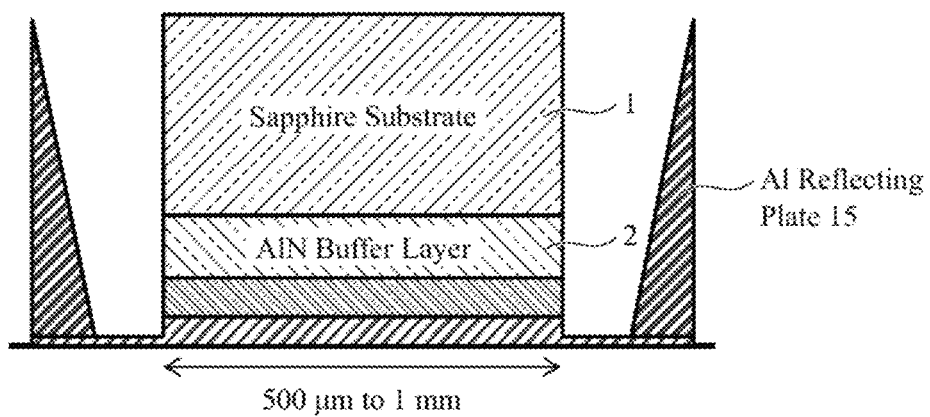
FIG. 19B(b) is a view illustrating an exemplary structure of a surface-mount package for the structure of a deep ultraviolet LED for which p-AlGaN contact layer photonic crystals in accordance with the sixth embodiment of the present invention are used.

Next, FIGS. 19A(a-1) and 19A(a-2) illustrate the structure of an AlGaN-based deep ultraviolet LED with a design wavelength λ of 280 nm as a deep ultraviolet LED in accordance with the sixth embodiment of the present invention. FIG. 19A(a-1) is a cross-sectional view and FIG. 19A(a-2) is a plan view. FIG. 19B(b) is a deep ultraviolet LED mounted in a surface-mount package.

The LED has the same structure as the stacked thin-film structure of the deep ultraviolet LED in the second embodiment, but is a modified example seen from a perspective of using another method in the device production process.

The thickness of the p-AlGaN contact layer 8a is less than or equal to 100 nm, and the photonic crystal periodic structure 100 is provided in a region within the p-AlGaN contact layer 8a such that the photonic crystal periodic structure 100 does not extend beyond the p-AlGaN contact layer in the direction of the substrate. The photonic crystal periodic structure 100 is a reflecting photonic crystal periodic structure that is designed to reflect light with the wavelength λ by having voids (columnar structures or holes) 101(h) and thus having a photonic band gap.

The voids 101(h) have structures in which the voids 101(h) do not extend beyond the interface between the p-AlGaN contact layer 8a and the multi-quantum barrier layer 7 but reach the interface between the p-AlGaN contact layer 8a and the ultrathin Ni layer 10a. In addition, the distance G of from end faces of the voids 101(h) in the direction of the substrate to the quantum well layer 5 is greater than or equal to the total thickness of the barrier layer 6 and the multi-quantum barrier layer 7 and less than or equal to 80 nm. Further, the depth h of the reflecting photonic crystal periodic structure 100 is less than or equal to the thickness of the p-AlGaN contact layer 8a.

A computation model that reflects the aforementioned structure was created to compute the rate of change of the light extraction efficiency (Enhancement of LEE) and the light extraction efficiency (LEE) using both the FDTD method and the ray-tracing method. FIG. 20 illustrate a photonic crystal computation model of the p-AlGaN contact layer. In addition, the analysis results are shown in Table 5, FIG. 21(a): Enhancement of LEE, FIG. 21(b): LEE, and FIG. 21(c): radiation patterns.

TABLE 5

| | Flat | | m4_G50 nm_h100 nm | | | m4_G60 nm_h90 nm | | |
|---|---|---|---|---|---|---|---|---|
| RP | Power | LEE % | Power | Enhanced | LEE % | Power | Enhanced | LEE % |
| pAlGaN Contact | 3.56E−16 | 13.1% | 6.24E−16 | 75% | 23.0% | 6.13E−16 | 72% | 22.6% |

| | m4_G70 nm_h80 nm | | | m4_G80 nm_h70 nm | | |
|---|---|---|---|---|---|---|
| RP | Power | Enhanced | LEE % | Power | Enhanced | LEE % |
| pAlGaN Contact | 5.12E−16 | 44% | 18.9% | 3.92E−16 | 10% | 14.5% |

Figure 21:
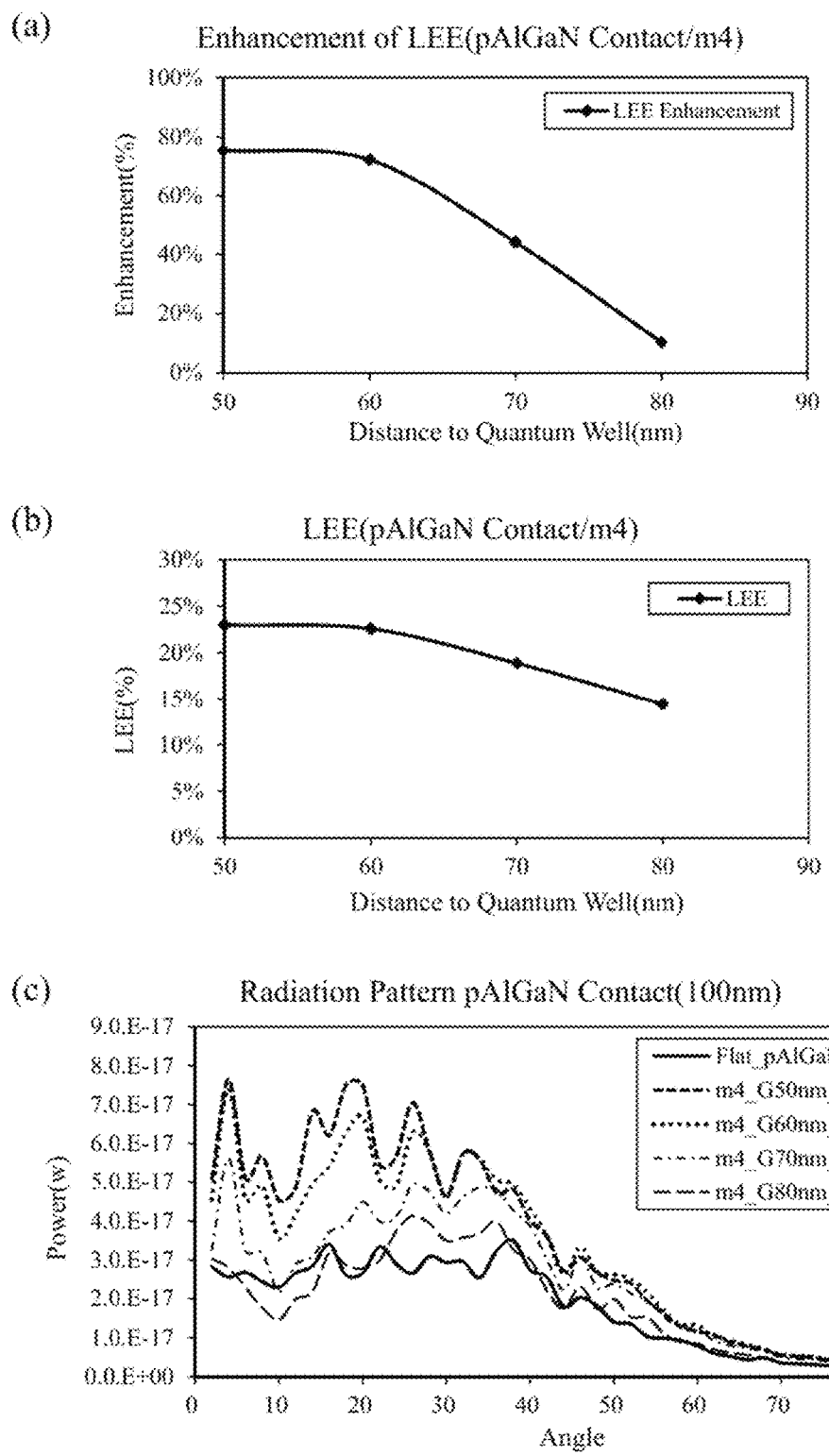
FIG. 21 illustrate the analysis results of (a) enhancement of the LEE, (b) light extraction efficiency, and (c) radiation patterns.

Regarding the rate of change of the light extraction efficiency in FIG. 21(a), a maximum value, which is 1.75 times that of Flat, is obtained at a distance of 50 nm from the quantum well layer 5. Meanwhile, regarding the light extraction efficiency in FIG. 21(b), a maximum value of 23.0% is obtained. Further, regarding the radiation patterns in FIG. 21(c), an output on the axis (0 to 10°) is increased relative to that of Flat.

Seventh Embodiment

Figure 22B:
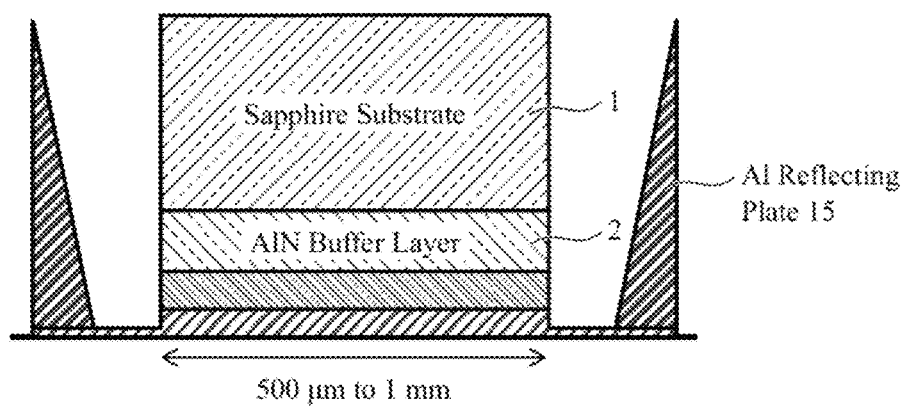
FIG. 22B(b) is a view illustrating an exemplary structure of a surface-mount package for the structure of a deep ultraviolet LED for which p-GaN contact layer photonic crystals in accordance with the seventh embodiment of the present invention are used.

Next, FIGS. 22A(a-1) and 22A(a-2) illustrate the structure of an AlGaN-based deep ultraviolet LED with a design wavelength λ of 280 nm as a deep ultraviolet LED in accordance with the seventh embodiment of the present invention. FIG. 22A(a-1) is a cross-sectional view and FIG. 22A(a-2) is a plan view. FIG. 22B(b) is a deep ultraviolet LED mounted in a surface-mount package.

The LED has the same structure as the stacked thin-film structures of the deep ultraviolet LEDs in the first and forth embodiments, but is different in the position where the photonic crystal periodic structure 100 is provided. This is a modified example seen from a perspective of using another method in the device production process.

The photonic crystal periodic structure 100 is provided in a region within the thickness of the p-GaN contact layer 9 such that the photonic crystal periodic structure 100 does not extend beyond the interface between the p-GaN contact layer 9 and the p-AlGaN layer 8 in the direction of the substrate. The photonic crystal periodic structure 100 is a reflecting photonic crystal periodic structure that is designed to reflect light with the wavelength λ by having voids (columnar structures or holes) 101(h) and thus having a photonic band gap.

The voids 101(h) are provided such that they do not extend beyond the interface between the p-GaN contact layer 9 and the Ni layer 10. In addition, the distance G from end faces of the voids 101(h) in the direction of the substrate to the quantum well layer 5 is greater than or equal to the total thickness of the barrier layer 6 and the multi-quantum barrier layer 7 and less than or equal to 80 nm. Further, the depth h of the reflecting photonic crystal periodic structure 100 is less than or equal to the thickness of the p-GaN contact layer 9.

In the aforementioned structure, TE light and TM light of deep ultraviolet light with a wavelength λ emitted from the quantum well layer 5 are radiated in all directions and propagate through the medium while being elliptically polarized. The photonic crystal periodic structure 100 provided around the quantum well layer 5 is provided within the thickness of the p-GaN contact layer 9. Therefore, the photonic crystal periodic structure 100 is formed as a structure having two different refractive indices, which are the p-GaN contact layer 9 and the air, at an end face thereof. Provided that the ratio of the radius R of each void to the period a is R/a=0.4, the filling factor f of the photonic crystals is computed by the formula: $f=2\pi/3^{0.5} \times (R/a)^2=0.58$.

In addition, from the refractive index of the air: $n_1=1.0$, the refractive index of p-type GaN: $n_2=2.618$, and $f=0.58$, the equivalent refractive index $n_{\it eff}$ is computed by the formula: $n_{\it eff}=(n_2^2+(n_1^2-n_2^2) \times f)^{0.5}=1.859$.

Then, provided that the light emission wavelength λ=280 nm, photonic band structures for TE light and TM light when the photonic crystal periodic structure satisfies the Bragg scattering condition ($m\lambda/n_{\it eff}=2a$, where $n_{\it eff}$ is the equivalent refractive index, a is the period, and m is the order) are determined using the plane wave expansion method to confirm that a PBG is obtained between the first photonic band and the second photonic band for TE light.

A computation model that reflects the aforementioned structure was created to compute the rate of change of the light extraction efficiency (Enhancement of LEE) and the light extraction efficiency (LEE) using both the FDTD method and the ray-tracing method. FIG. 23 illustrate a photonic crystal computation model of the LED structure. The computation model was designed such that the thickness of the p-AlGaN layer 8 was changed in increments of 10 nm in the range of 0 to 30 nm, and the positions of the voids 101(h) were set such that end faces of the voids in the direction of the substrate had depths of 120 nm from the interface between the p-AlGaN layer 8 and the p-GaN contact layer 9. In such a case, the thinner the p-AlGaN layer 8, the shorter the distance G between the quantum well layer 5 and the end faces of the voids 101(h) in the direction of the substrate. That is, the computation model was designed such that the distance G became 50 nm when the thickness of the p-AlGaN layer 8 was 0 nm, and the thickness of the p-AlGaN layer 8 was changed in increments of 10 nm so that the distance G similarly became 80 nm when the thickness of the p-AlGaN layer 8 was 30 nm. The analysis results are shown in Table 6, FIG. 24(a): Enhancement of LEE, FIG. 24(b): light extraction efficiency, and FIG. 24(c): radiation patterns.

TABLE 6

| RP | Flat | | PhC Depth 120 nm | | |
|---|---|---|---|---|---|
| | Power | LEE % | Power | Enhanced | LEE % |
| pAlGaN0 nm/Gap to QW50 nm | 1.61E−16 | 6.3% | 4.424E−16 | 174% | 17.3% |
| pAlGaN10 nm/Gap to QW60 nm | 1.75E−16 | 6.3% | 4.33E−16 | 147% | 15.6% |
| pAlGaN20 nm/Gap to QW70 nm | 1.89E−16 | 6.3% | 3.42E−16 | 81% | 11.4% |
| pAlGaN30 nm/Gap to QW80 nm | 1.92E−16 | 6.3% | 2.38E−16 | 24% | 7.8% |

Regarding the rate of change of the light extraction efficiency in FIG. 24(a), as the p-AlGaN layer is thinner, the rate of change of the light extraction efficiency is increased, and a maximum value, which is about 2.7 times as high, is obtained at a distance G of 50 nm from the quantum well layer 5 (the thickness of the p-AlGaN layer in this case is 0 nm), and an intensity, which is about 2.5 times as high, is also obtained at a distance G of 60 nm (likewise, the thickness of the p-AlGaN layer is 10 nm). Meanwhile, regarding the light extraction efficiency in FIG. 24(b), a maximum value of 17.3% is obtained at a distance G of 50 nm. Further, FIG. 24(c) illustrates radiation patterns at a distance G of 50 nm. It is found that an output in the axial direction (0 to 30°) is increased relative to that of Flat.

After the structure shown in FIG. 1A and the like is formed, an LED device is formed.

According to the technology of the deep ultraviolet LED in each of the aforementioned embodiments, the LEE of the deep ultraviolet LED can be drastically improved by providing a photonic crystal periodic structure in a thin p-AlGaN layer.

In the aforementioned embodiments, structures and the like illustrated in the attached drawings are not limited thereto, and can be changed as appropriate within the range that the advantageous effects of the present invention can be exerted. Besides, the structures and the like can be implemented by being changed as appropriate within the scope of the object of the present invention.

In addition, each element of the present invention can be freely selected, and an invention that includes the selected element is also included in the present invention.

INDUSTRIAL APPLICABILITY

The present application is applicable to deep ultraviolet LEDs.

REFERENCE SIGNS LIST

1: Sapphire substrate, 2: AlN buffer layer, 3: n-AlGaN layer, 4: Barrier layer, 5: Quantum well layer, 6: Barrier layer, 7: Multi-quantum barrier layer (MQB), 8: p-AlGaN layer (transparent p-AlGaN layer), 8a: p-AlGaN contact layer (transparent p-AlGaN contact layer), 9: p-GaN contact layer, 10: Ni layer, and 11: Au reflecting electrode.

The invention claimed is:

1. A deep ultraviolet LED with a design wavelength $\lambda$, comprising, sequentially arranged from a side opposite to a substrate, a reflecting electrode layer, a metal layer, a p-GaN contact layer, a p-AlGaN layer that is transparent to light with the wavelength $\lambda$, one of a multi-quantum barrier layer or an electron blocking layer, a barrier layer, and a quantum well layer, wherein:
a thickness of the p-AlGaN layer is less than or equal to 100 nm,
a reflecting photonic crystal periodic structure having a plurality of voids is provided in a region in a thickness direction including at least an interface between the p-GaN contact layer and the p-AlGaN layer such that the reflecting photonic crystal periodic structure does not extend beyond the p-AlGaN layer in a direction of the substrate,
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a total thickness of the p-AlGaN layer and the p-GaN contact layer,
the reflecting photonic crystal periodic structure has a photonic band gap that opens for TE polarized components,
a period a of the photonic crystal periodic structure satisfies a Bragg condition with respect to light with the design wavelength $\lambda$,
an order m in a formula of the Bragg condition satisfies $1 \leq m \leq 5$, and
provided that a radius of each void is R, R/a with which the photonic band gap becomes maximum is satisfied.

2. A deep ultraviolet LED with a design wavelength $\lambda$, comprising, sequentially arranged from a side opposite to a substrate, a reflecting electrode layer, an ultrathin metal layer, a p-AlGaN contact layer that is transparent to light with the wavelength $\lambda$, one of a multi-quantum barrier layer or an electron blocking layer, a barrier layer, and a quantum well layer, wherein:
a thickness of the p-AlGaN contact layer is less than or equal to 100 nm,
a reflecting photonic crystal periodic structure having a plurality of voids is provided within the p-AlGaN contact layer in a region in a thickness direction where the reflecting photonic crystal periodic structure does not extend beyond the p-AlGaN contact layer in a direction of the substrate,
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and when a depth h of each void is less than or equal to the thickness of the p-AlGaN contact layer,
the reflecting photonic crystal periodic structure has a photonic band gap that opens for TE polarized components, a period a of the photonic crystal periodic structure satisfies a Bragg condition with respect to light with the design wavelength $\lambda$, an order m in a formula of the Bragg condition satisfies $1 \leq m \leq 5$, and provided that a radius of each void is R, R/a with which the photonic band gap becomes maximum is satisfied.

3. A deep ultraviolet LED with a design wavelength $\lambda$, comprising, sequentially arranged from a side opposite to a substrate, a reflecting electrode layer, a metal layer, a p-GaN contact layer, a p-AlGaN layer that is transparent to light with the wavelength $\lambda$, one of a multi-quantum barrier layer or an electron blocking layer, a barrier layer, and a quantum well layer, wherein:

a thickness of the p-AlGaN layer is less than or equal to 100 nm, a reflecting photonic crystal periodic structure having a plurality of voids is provided in a region including at least an interface between the p-GaN contact layer and the p-AlGaN layer such that the reflecting photonic crystal periodic structure does not extend beyond the p-AlGaN layer in a direction of the substrate, penetrates the p-GaN contact layer and the metal layer from a thickness direction, and reaches an inside of the reflecting electrode layer but does not extend beyond the reflecting electrode layer, maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, the reflecting photonic crystal periodic structure has a photonic band gap that opens for TE polarized components, a period a of the photonic crystal periodic structure satisfies a Bragg condition with respect to light with the design wavelength $\lambda$, an order m in a formula of the Bragg condition satisfies $1 \leq m \leq 5$, and provided that a radius of each void is R, R/a with which the photonic band gap becomes maximum is satisfied.

4. A deep ultraviolet LED with a design wavelength $\lambda$, comprising, sequentially arranged from a side opposite to a substrate, a reflecting electrode layer, an ultrathin metal layer, a p-AlGaN contact layer that is transparent to light with the wavelength $\lambda$, one of a multi-quantum barrier layer or an electron blocking layer, a barrier layer, and a quantum well layer, wherein:

a thickness of the p-AlGaN contact layer is less than or equal to 100 nm, a reflecting photonic crystal periodic structure having a plurality of voids is provided at a position where the reflecting photonic crystal periodic structure does not extend beyond the p-AlGaN contact layer in a direction of the substrate, penetrates the ultrathin metal layer from a thickness direction, and reaches an inside of the reflecting electrode layer but does not extend beyond the reflecting electrode layer, maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, the reflecting photonic crystal periodic structure has a photonic band gap that opens for TE polarized components, a period a of the photonic crystal periodic structure satisfies a Bragg condition with respect to light with the design wavelength $\lambda$, an order m in a formula of the Bragg condition satisfies $1 \leq m \leq 5$, and provided that a radius of each void is R, R/a with which the photonic band gap becomes maximum is satisfied.

5. A deep ultraviolet LED with a design wavelength $\lambda$, comprising, sequentially arranged from a side opposite to a substrate, a reflecting electrode layer, a metal layer, a p-GaN contact layer, a p-AlGaN layer that is transparent to light with the wavelength $\lambda$, one of a multi-quantum barrier layer or an electron blocking layer, a barrier layer, and a quantum well layer, wherein:

a thickness of the p-AlGaN layer is less than or equal to 100 nm, a reflecting photonic crystal periodic structure having a plurality of voids is provided in a region including at least an interface between the p-GaN contact layer and the p-AlGaN layer such that the reflecting photonic crystal periodic structure does not extend beyond the p-AlGaN layer in a direction of the substrate and reaches an interface between the p-GaN contact layer and the metal layer from a thickness direction, maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a total thickness of the p-AlGaN layer and the p-GaN contact layer, the reflecting photonic crystal periodic structure has a photonic band gap that opens for TE polarized components, a period a of the photonic crystal periodic structure satisfies a Bragg condition with respect to light with the design wavelength $\lambda$, an order m of a condition of the Bragg condition satisfies $1 \leq m \leq 5$, and provided that a radius of each void is R, R/a with which the photonic band gap becomes maximum is satisfied.

6. A deep ultraviolet LED with a design wavelength $\lambda$, comprising, sequentially arranged from a side opposite to a substrate, a reflecting electrode layer, an ultrathin metal layer, a p-AlGaN contact layer that is transparent to light with the wavelength $\lambda$, one of a multi-quantum barrier layer or an electron blocking layer, a barrier layer, and a quantum well layer, wherein:

a thickness of the p-AlGaN contact layer is less than or equal to 100 nm, a reflecting photonic crystal periodic structure having a plurality of voids is provided within the p-AlGaN contact layer such that the reflecting photonic crystal periodic structure does not extend beyond the p-AlGaN contact layer in a direction of the substrate, and reaches an interface between the p-AlGaN contact layer and the ultrathin metal layer from a thickness direction, maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm,
the reflecting photonic crystal periodic structure has a photonic band gap that opens for TE polarized components,
a period a of the photonic crystal periodic structure satisfies a Bragg condition with respect to light with the design wavelength $\lambda$,
an order m in a formula of the Bragg condition satisfies $1 \le m \le 5$, and
provided that a radius of each void is R, R/a with which the photonic band gap becomes maximum is satisfied.

7. A deep ultraviolet LED with a design wavelength $\lambda$, comprising, sequentially arranged from a side opposite to a substrate, a reflecting electrode layer, a metal layer, a p-GaN contact layer, a p-AlGaN layer that is transparent to light with the wavelength $\lambda$, one of a multi-quantum barrier layer or an electron blocking layer, a barrier layer, and a quantum well layer,
wherein:
a thickness of the p-AlGaN layer is less than or equal to 100 nm,
a reflecting photonic crystal periodic structure having a plurality of voids is provided in a region within a thickness of the p-GaN contact layer in a direction of the substrate such that the reflecting photonic crystal periodic structure does not extend beyond an interface between the p-GaN contact layer and the p-AlGaN layer,
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to the thickness of the p-GaN contact layer,
the reflecting photonic crystal periodic structure has a photonic band gap that opens for TE polarized components,
a period a of the photonic crystal periodic structure satisfies a Bragg condition with respect to light with the design wavelength $\lambda$,
an order m in a formula of the Bragg condition satisfies $1 \le m \le 5$, and
provided that a radius of each void is R, R/a with which the photonic band gap becomes maximum is satisfied.

8. A method for producing the deep ultraviolet LED according to claim 1, comprising:
preparing a stacked structure including, sequentially arranged from a side opposite to a substrate, a reflecting electrode layer, a metal layer, a p-GaN contact layer, and a p-AlGaN layer that is transparent to light with the wavelength $\lambda$;
preparing a mold for forming a reflecting photonic crystal periodic structure, wherein:
a thickness of the p-AlGaN layer is less than or equal to 100 nm,
the reflecting photonic crystal periodic structure has a plurality of voids and is provided in a region in a thickness direction including at least an interface between the p-GaN contact layer and the p-AlGaN layer such that the reflecting photonic crystal periodic structure does not extend beyond the p-AlGaN layer in a direction of the substrate, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a total thickness of the p-AlGaN layer and the p-GaN contact layer;
forming a resist layer on the stacked structure and imprinting a structure of the mold thereto; and
sequentially etching the stacked structure using the resist layer as a mask, thereby forming the photonic crystal periodic structure.

9. A method for producing the deep ultraviolet LED according to claim 2, comprising:
preparing a stacked structure including, sequentially arranged from a side opposite to a substrate, a reflecting electrode layer, an ultrathin metal layer, and a p-AlGaN contact layer that is transparent to light with the wavelength $\lambda$;
preparing a mold for forming a reflecting photonic crystal periodic structure, wherein:
a thickness of the p-AlGaN contact layer is less than or equal to 100 nm,
the reflecting photonic crystal periodic structure has a plurality of voids and is provided in a region in a thickness direction within the p-AlGaN contact layer such that the reflecting photonic crystal periodic structure does not extend beyond the p-AlGaN layer in a direction of the substrate, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a thickness of the p-AlGaN contact layer;
forming a resist layer on the stacked structure and imprinting a structure of the mold thereto; and
sequentially etching the stacked structure using the resist layer as a mask, thereby forming the photonic crystal periodic structure.

10. A method for producing the deep ultraviolet LED according to claim 3, comprising:
preparing a stacked structure including, sequentially arranged from a side opposite to a substrate, a reflecting electrode layer, a metal layer, a p-GaN contact layer, and a p-AlGaN layer that is transparent to light with the wavelength $\lambda$;
preparing a mold for forming a reflecting photonic crystal periodic structure, wherein:
a thickness of the p-AlGaN layer is less than or equal to 100 nm,
the reflecting photonic crystal periodic structure has a plurality of voids and is provided in a region including at least an interface between the p-GaN contact layer and the p-AlGaN layer such that the reflecting photonic crystal periodic structure does not extend beyond the p-AlGaN layer in a direction of the substrate, penetrates the p-GaN contact layer and the metal layer from a thickness direction, and reaches an inside of the reflecting electrode layer, but does not extend beyond the reflecting electrode layer, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm;

forming a resist layer on the stacked structure and imprinting a structure of the mold thereto;

sequentially etching the stacked structure using the resist layer as a mask, thereby forming the photonic crystal periodic structure; and re-depositing a reflecting electrode layer.

11. A method for producing the deep ultraviolet LED according to claim 4, comprising:
preparing a stacked structure including, sequentially arranged from a side opposite to a substrate, a reflecting electrode layer, an ultrathin metal layer, and a p-AlGaN contact layer that is transparent to light with the wavelength λ;
preparing a mold for forming a reflecting photonic crystal periodic structure, wherein:
a thickness of the p-AlGaN contact layer is less than or equal to 100 nm,
the reflecting photonic crystal periodic structure has a plurality of voids and is provided at a position where the reflecting photonic crystal periodic structure does not extend beyond the p-AlGaN contact layer in a direction of the substrate, penetrates the ultrathin metal layer from a thickness direction, and reaches an inside of the reflecting electrode layer but does not extend beyond the reflecting electrode layer, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm;
forming a resist layer on the stacked structure and imprinting a structure of the mold thereto;
sequentially etching the stacked structure using the resist layer as a mask, thereby forming the photonic crystal periodic structure; and
re-depositing a reflecting electrode layer.

12. A method for producing the deep ultraviolet LED according to claim 5, comprising:
preparing a stacked structure including, sequentially arranged from a side opposite to a substrate, a reflecting electrode layer, a metal layer, a p-GaN contact layer, and a p-AlGaN layer that is transparent to light with the wavelength λ;
preparing a mold for forming a reflecting photonic crystal periodic structure, wherein:
a thickness of the p-AlGaN layer is less than or equal to 100 nm,
the reflecting photonic crystal periodic structure has a plurality of voids and is provided in a region including at least an interface between the p-GaN contact layer and the p-AlGaN layer such that the reflecting photonic crystal periodic structure does not extend beyond the p-AlGaN layer in a direction of the substrate and reaches an interface between the p-GaN contact layer and the metal layer from a thickness direction, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a total thickness of the p-AlGaN layer and the p-GaN contact layer;
growing crystals in up to the p-GaN contact layer of the stacked structure, forming a resist layer thereon, and imprinting a structure of the mold thereto;
sequentially etching the stacked structure using the resist layer as a mask, thereby forming the photonic crystal periodic structure; and
sequentially depositing the metal layer and the reflecting electrode layer obliquely after forming the photonic crystal periodic structure.

13. A method for producing the deep ultraviolet LED according to claim 6, comprising:
preparing a stacked structure including, sequentially arranged from a side opposite to a substrate, a reflecting electrode layer, an ultrathin metal layer, and a p-AlGaN contact layer that is transparent to light with the wavelength λ;
preparing a mold for forming a reflecting photonic crystal periodic structure, wherein:
a thickness of the p-AlGaN contact layer is less than or equal to 100 nm,
the reflecting photonic crystal periodic structure has a plurality of voids and is provided within the p-AlGaN contact layer such that the reflecting photonic crystal periodic structure does not extend beyond the p-AlGaN contact layer in a direction of the substrate, and reaches an interface between the p-AlGaN contact layer and the ultrathin metal layer from a thickness direction, and
maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to a thickness of the p-AlGaN contact layer:
growing crystals in up to the p-AlGaN contact layer of the stacked structure, forming a resist layer thereon, and imprinting a structure of the mold thereto;
sequentially etching the stacked structure using the resist layer as a mask, thereby forming the photonic crystal periodic structure; and
sequentially depositing the ultrathin metal layer and the reflecting electrode layer obliquely after forming the photonic crystal periodic structure.

14. A method for producing the deep ultraviolet LED according to claim 7, comprising:
preparing a stacked structure including, sequentially arranged from a side opposite to a substrate, a reflecting electrode layer, a metal layer, a p-GaN contact layer, and a p-AlGaN layer that is transparent to light with the wavelength λ;
preparing a mold for forming a reflecting photonic crystal periodic structure, wherein:
a thickness of the p-AlGaN layer is less than or equal to 100 nm,
the reflecting photonic crystal periodic structure has a plurality of voids and is provided in a region within a thickness of the p-GaN contact layer in a direction of the substrate such that the reflecting photonic crystal periodic structure does not extend beyond an interface between the p-GaN contact layer and the p-AlGaN layer, and maximum light extraction efficiency is obtained when a distance from end faces of the voids in the direction of the substrate to the quantum well layer is greater than or equal to a total thickness of the barrier layer and the one of the multi-quantum barrier layer or the electron blocking layer and less than or equal to 80 nm, and a depth h of each void is less than or equal to the thickness of the p-GaN contact layer:

growing crystals in up to the p-GaN contact layer of the stacked structure, forming a resist layer thereon, and imprinting a structure of the mold thereto; and sequentially etching the stacked structure using the resist layer as a mask, thereby forming the photonic crystal periodic structure.

* * * * *